United States Patent
Tamao et al.

(10) Patent No.: US 7,157,154 B2
(45) Date of Patent: Jan. 2, 2007

(54) POLYMER AND POLYMERIC LUMINESCENT ELEMENT COMPRISING THE SAME

(75) Inventors: Kohei Tamao, Kyoto (JP); Shigehiro Yamaguchi, Nagoya (JP); Makoto Kitano, Auderghem (BE); Satoshi Kobayashi, Tsukuba (JP); Chizu Sekine, Tsukuba (JP)

(73) Assignees: Sumitomo Chemical Company, Limited, Tokyo (JP); Kansai Technology Licensing Organization,Co., Ltd., Kyoto (JP)

( * ) Notice: Subject to any disclaimer, the term of this patent is extended or adjusted under 35 U.S.C. 154(b) by 1 day.

(21) Appl. No.: 10/518,713

(22) PCT Filed: Jun. 25, 2003

(86) PCT No.: PCT/JP03/08050

§ 371 (c)(1),
(2), (4) Date: Mar. 30, 2005

(87) PCT Pub. No.: WO2004/003053

PCT Pub. Date: Jan. 8, 2004

(65) Prior Publication Data

US 2005/0170202 A1    Aug. 4, 2005

(30) Foreign Application Priority Data

Jun. 26, 2002  (JP) ............... 2002-185712
Sep. 26, 2002  (JP) ............... 2002-281218

(51) Int. Cl.
*C08G 79/08*  (2006.01)
*H01L 51/50*  (2006.01)
*C09K 11/06*  (2006.01)
*H01B 1/12*  (2006.01)
*H05B 33/14*  (2006.01)

(52) U.S. Cl. ............ 428/690; 428/1.1; 428/917; 313/504; 252/301.35; 257/40; 257/88; 526/239; 528/4; 528/394

(58) Field of Classification Search ............ 428/690, 428/917, 1.1; 252/301.35; 313/504; 257/40, 257/88; 526/239; 528/4, 394
See application file for complete search history.

(56) References Cited

FOREIGN PATENT DOCUMENTS

| EP | 1 043 382 A2 | 10/2000 |
|---|---|---|
| WO | WO 01/49768 A2 | 7/2001 |
| WO | WO 03/000821 A1 | 1/2003 |

*Primary Examiner*—Dawn Garrett
(74) *Attorney, Agent, or Firm*—Sughrue Mion, PLLC

(57) ABSTRACT

A polymer characterized by comprising repeating units represented by the following formula (1) and having a number-average molecular weight, in terms of polystyrene, of $10^3$ to $10^8$.

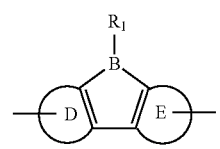

(1)

(In the formula, $R_1$ represents hydrogen, alkyl, alkoxy, alkylthio, aryl, aryloxy, arylthio, arylalkyl, arylalkoxy, arylalkylthio, arylalkenyl, arylalkynyl, amino, substituted amino, silyl, substituted silyl, silyloxy, substituted silyloxy, monovalent heterocyclic group, or halogeno; and rings D and E each represents an optionally substituted aromatic ring.)

26 Claims, No Drawings

POLYMER AND POLYMERIC LUMINESCENT ELEMENT COMPRISING THE SAME

TECHNICAL FIELD

The present invention relates to a polymer and a method for producing the same, an ink composition that contains the polymer, and a polymeric light-emitting device (hereinafter sometimes referred to as polymeric LED) using the polymer.

BACKGROUND ART

Various types of high-molecular-weight light-emitting materials or charge transport materials are being examined, because, unlike low-molecular-weight light-emitting materials or charge transport materials, they are soluble in solvents and can form a light-emitting layer or charge transport layer in a light-emitting device, depending on the coating method employed. Of such materials, polyphenylenevinylene derivatives, polyfluorene derivatives and polyphenylene derivatives are well-known.

DISCLOSURE OF THE INVENTION

The object of this invention is to provide a novel polymer usable as a light-emitting material, charge transport material, or the like, a method for producing the same, and a polymeric light-emitting device using the polymer.

After directing tremendous effort toward the above described subject, the present inventors have found that a polymer that includes a repeating unit represented by the following formula (1):

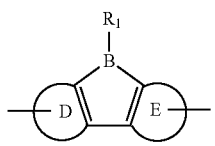

(1)

and having a number-average molecular weight, in terms of polystyrene, of $10^3$ to $10^8$ can applied to a light-emitting material, charge transport material or the like and have finally accomplished this invention.

BEST MODE FOR CARRYING OUT THE INVENTION

In the above formula (1), rings D and E each represent an aromatic ring.

Examples of such aromatic rings include: aromatic hydrocarbon rings such as benzene, naphthalene, anthracene, phenanthrene, pyrene, perylene, tetracene and pentacene rings; and heteroaromatic rings such as pyridine, pyrimidine, pyridazine, pyrazine, quinoline, isoquinoline, quinoxaline, quinazoline, acridine, phenanthroline, thiophene, benzothiophene, dibenzothiophene, thiophenoxide, benzothiophenoxide, dibenzothiophenoxide, thiophenedioxide, benzothiophenedioxide, dibenzothiophenedioxide, furan, benzofuran, dibenzofuran, pyrrole, indole, dibenzopyrrole, silole, benzosilole, dibenzosilole, borole, benzoborole and dibenzoborole rings. Of these aromatic rings, aromatic hydrocarbon rings are preferable, and benzene, naphthalene and anthracene rings are particularly preferable.

The rings D and E optionally have a substituent selected from the group consisting of alkyl, alkoxy, alkylthio, aryl, aryloxy, arylthio, arylalkyl, arylalkoxy, arylalkylthio, arylalkenyl, arylalkynyl, amino, substituted amino, silyl, substituted silyl, silyloxy and substituted silyloxy groups, halogen atoms, acyl, acyloxy, imino, amide, imide, monovalent heterocyclic, carboxyl, substituted carboxyl and cyano groups.

The above described alkyl groups may be straight-chain, branched-chain or cyclic alkyl groups. The number of carbons that each of the alkyl groups has is usually about 1 to 20 and preferably 3 to 20. Specific examples of the alkyl groups include methyl, ethyl, propyl, i-propyl, butyl, i-butyl, t-butyl, pentyl, hexyl, cyclohexyl, heptyl, octyl, 2-ethylhexyl, nonyl, decyl, 3,7-dimethyloctyl, lauryl, trifluoromethyl, pentafluoroethyl, perfluorobutyl, perfluorohexyl and perfluorooctyl groups. Preferable are pentyl, hexyl, octyl, 2-ethylhexyl, decyl and 3,7-dimethyloctyl.

The above described alkoxy groups may be straight-chain, branched-chain or cyclic alkoxy groups. The number of carbons that each of the alkoxy groups has is usually about 1 to 20 and preferably 3 to 20. Specific examples of the alkoxy groups include methoxy, ethoxy, propyloxy, i-propyloxy, butoxy, i-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy, lauryloxy, trifluoromethoxy, pentafluoroethoxy, perfluorobutoxy, perfluorohexyl, perfluoroctyl, methoxymethyloxy and 2-methoxyethyloxy. Of these groups, preferable are pentyloxy, hexyloxy, octyloxy, 2-ethylhexyloxy, decyloxy and 3,7-dimethyloctyloxy groups.

The above described alkylthio groups may be straight-chain, branched-chain or cyclic alkylthio groups. The number of carbons that each of the alkylthio groups has is usually about 1 to 20 and preferably 3 to 20. Specific examples of the alkylthio groups include methylthio, ethylthio, propylthio, i-propylthio, butylthio, i-butylthio, t-butylthio, pentylthio, hexylthio, cyclohexylthio, heptylthio, octylthio, 2-ethylhexylthio, nonylthio, decylthio, 3,7-dimethyloctylthio, laurylthio and trifluoromethylthio groups. Of these groups, preferable are pentylthio, hexylthio, octylthio, 2-ethylhexylthio, decylthio and 3,7-dimethyloctylthio groups.

The number of carbons that each of the above aryl groups has is usually about 6 to 60 and preferably 7 to 48. Examples of the aryl groups include phenyl, $C_1$–$C_{12}$ alkoxyphenyl ("$C_1$–$C_{12}$" indicates the number of carbons the aryl group has is 1 to 12 and the same is true hereafter), $C_1$–$C_{12}$ alkylphenyl, 1-naphthyl, 2-naphthyl, 1-anthracenyl, 2-anthracenyl, 9-anthracenyl and pentafluorophenyl groups. Of these aryl groups, $C_1$–$C_{12}$ alkoxyphenyl and $C_1$–$C_{12}$ alkylphenyl groups are preferable. The term "aryl group" means an atomic group derived from an aromatic hydrocarbon by removal one of hydrogens on the aromatic nucleus. The aromatic hydrocarbons includes those having a condensed ring and those formed by combining two or more independent benzene rings or condensed rings directly or via a group such as vinylene.

Specific examples of $C_1$–$C_{12}$ alkoxy groups include methoxy, ethoxy, propyloxy, i-propyloxy, butoxy, i-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy and lauryloxy groups.

Specific examples of $C_1$–$C_{12}$ alkyl groups include methyl, ethyl, propyl, i-propyl, butyl, i-butyl, t-butyl, pentyl, hexyl, cyclohexyl, heptyl, octyl, 2-ethylhexyl, nonyl, decyl, 3,7-dimethyloctyl and lauryl groups.

The number of carbons that each of the above described aryloxy groups has is usually about 6 to 60 and preferably 7 to 48. Examples of the aryloxy groups include phenoxy, $C_1$–$C_{12}$ alkoxyphenoxy, $C_1$–$C_{12}$ alkylphenoxy, 1-naphthyloxy, 2-naphthyloxy and pentafluorophenyloxy groups. Of these groups, $C_1$–$C_{12}$ alkoxyphenoxy and $C_1$–$C_{12}$ alkylphenoxy groups are preferable.

The number of carbons that each of the above described arylthio groups has is usually about 6 to 60 and preferably 7 to 48. Examples of the arylthio groups include phenylthio, $C_1$–$C_{12}$ alkoxyphenylthio, $C_1$–$C_{12}$ alkylphenylthio, 1-naphthylthio, 2-naphthylthio and pentafluorophenylthio groups. Of these arylthio groups, $C_1$–$C_{12}$ alkoxyphenylthio and $C_1$–$C_{12}$ alkylphenylthio groups are preferable.

The number of carbons that each of the above described arylalkyl groups has is usually about 7 to 60 and preferably 7 to 48. Examples of the arylalkyl groups include: phenyl-($C_1$–$C_{12}$)-alkyl groups such as phenylmethyl, phenylethyl, phenylbutyl, phenylpentyl, phenylhexyl, phenylheptyl and phenyloctyl; $C_1$–$C_{12}$ alkoxyphenyl-($C_1$–$C_{12}$)-alkyl groups; $C_1$–$C_{12}$ alkylphenyl-($C_1$–$C_{12}$)-alkyl groups; 1-naphtyl-($C_1$–$C_{12}$)-alkyl groups; and 2-naphtyl-($C_1$–$C_{12}$)-alkyl groups. Of these arylalkyl groups, $C_1$–$C_{12}$ alkoxyphenyl-($C_1$–$C_{12}$)-alkyl groups and $C_1$–$C_{12}$ alkylphenyl-($C_1$–$C_{12}$)-alkyl groups. are preferable.

The number of carbons that each of the above described arylalkoxy groups has is usually about 7 to 60 and preferably 7 to 48. Examples of the arylalkoxy groups include: phenyl-($C_1$–$C_{12}$)-alkoxy groups such as phenylmethoxy, phenylethoxy, phenylbutoxy, phenylpentyloxy, phenylhexyloxy, phenylheptyloxy and phenyloctyloxy; $C_1$–$C_{12}$ alkoxyphenyl-($C_1$–$C_{12}$)-alkoxy groups; $C_1$–$C_{12}$ alkylphenyl-($C_1$–$C_{12}$)-alkoxy groups; 1-naphtyl-($C_1$–$C_{12}$)-alkoxy groups; and 2-naphtyl-($C_1$–$C_{12}$)-alkoxy groups. Of these arylalkoxy groups, $C_1$–$C_{12}$ alkoxyphenyl-($C_1$–$C_{12}$)-alkoxy groups and $C_1$–$C_{12}$ alkylphenyl-($C_1$–$C_{12}$)-alkoxy groups are preferable.

The number of carbons that each of the above described arylalkylthio groups has is usually about 7 to 60 and preferably 7 to 48. Examples of the arylalkylthio groups include: phenyl-($C_1$–$C_{12}$)-alkylthio groups; $C_1$–$C_{12}$ alkoxyphenyl-($C_1$–$C_{12}$)-alkylthio groups; $C_1$–$C_{12}$ alkylphenyl-($C_1$–$C_{12}$)-alkylthio groups; 1-naphtyl-($C_1$–$C_{12}$)-alkylthio groups; and 2-naphtyl-($C_1$–$C_{12}$)-alkylthio groups. Of these arylalkoxy groups, $C_1$–$C_{12}$ alkoxyphenyl-($C_1$–$C_{12}$)-alkylthio groups and $C_1$–$C_{12}$ alkylphenyl-($C_1$–$C_{12}$)-alkylthio groups are preferable.

The number of carbons that each of the above described arylalkenyl groups has is usually about 8 to 60 and preferably 8 to 48. Examples of the arylalkenyl groups include: phenyl-($C_2$–$C_{12}$)-alkenyl groups; $C_1$–$C_{12}$ alkoxyphenyl-($C_2$–$C_{12}$)-alkenyl groups; $C_1$–$C_{12}$ alkylphenyl-($C_2$–$C_{12}$)-alkenyl groups; 1-naphtyl-($C_2$–$C_{12}$)-alkenyl groups; and 2-naphtyl-($C_2$–$C_{12}$)-alkenyl groups. Of these arylalkenyl groups, $C_1$–$C_{12}$ alkoxyphenyl-($C_2$–$C_{12}$)-alkenyl groups and $C_1$–$C_{12}$ alkylphenyl-($C_2$–$C_{12}$)-alkenyl groups are preferable.

The number of carbons that each of the above described arylalkynyl groups has is usually about 8 to 60 and preferably 8 to 48. Examples of the arylalkynyl groups include: phenyl-($C_2$–$C_{12}$)-alkynyl groups; $C_1$–$C_{12}$ alkoxyphenyl-($C_2$–$C_{12}$)-alkynyl groups; $C_1$–$C_{12}$ alkylphenyl-($C_2$–$C_{12}$)-alkynyl groups; 1-naphtyl-($C_2$–$C_{12}$)-alkynyl groups; and 2-naphtyl-($C_2$–$C_{12}$)-alkynyl groups. Of these arylalkynyl groups, $C_1$–$C_{12}$ alkoxyphenyl-($C_2$–$C_{12}$)-alkynyl groups and $C_1$–$C_{12}$ alkylphenyl-($C_2$–$C_{12}$)-alkynyl groups are preferable.

The above described substituted amino groups mean amino groups substituted by one or two groups selected from the group consisting of alkyl, aryl, arylalkyl and monovalent heterocyclic groups. The number of carbons that each of the substituted amino groups has is usually about 1 to 60 and preferably 2 to 48.

Examples of the substituted amino groups include methylamino, dimethylamino, ethylamino, diethylamino, propylamino, dipropylamino, i-propylamino, diisopropylamino, butylamino, i-butylamino, t-butylamino, pentylamino, hexylamino, cyclohexylamino, heptylamino, octylamino, 2-ethylhexylamino, nonylamino, decylamino, 3,7-dimethyloctylamino, laurylamino, cyclopentylamino, dicyclopentylamino, cyclohexylamino, dicyclohexylamino, pyrrolidyl, piperidyl, ditrifluoromethylamino, phenylamino, diphenylamino, $C_1$–$C_{12}$ alkoxyphenylamino, di(($C_1$–$C_{12}$)-alkoxyphenyl)amino, di(($C_1$–$C_{12}$)-alkylphenyl)amino, 1-naphthylamino, 2-naphthylamino, pentafluorophenylamino, pyridylamino, pyridazinylamio, pyrimidylamino, pyrazylamino, triazylamino, phenyl-($C_1$–$C_{12}$)-alkylamino, $C_1$–$C_{12}$ alkoxyphenyl-($C_1$–$C_{12}$)-alkylamino, $C_1$–$C_{12}$ alkylphenyl-($C_1$–$C_{12}$)-alkylamino, di(($C_1$–$C_{12}$)-alkoxyphenyl-($C_1$–$C_{12}$)-alkyl)amino, di(($C_1$–$C_{12}$)-alkylphenyl-($C_1$–$C_{12}$)-alkyl)amino, 1-naphthyl-($C_1$–$C_{12}$)-alkylamino, 2-naphthyl-($C_1$–$C_{12}$)-alkylamino and carbazoyl groups.

The above described substituted silyl groups mean silyl groups substituted by one, two or three groups selected from the group consisting of alkyl, aryl, arylalkyl and monovalent heterocyclic groups. The number of carbons that each of the substituted silyl groups has is usually about 1 to 60 and preferably 3 to 48.

Examples of the substituted silyl groups include trimethylsilyl, triethylsilyl, tripropylsilyl, tri-i-propylsilyl, dimethyl-i-propylsilyl, diethyl-i-propylsilyl, t-butylsilyldimethylsilyl, pentyldimethylsilyl, hexyldimethylsilyl, heptyldimethylsilyl, octyldimethylsilyl, 2-ethylhexyl-dimethylsilyl, nonyldimethylsilyl, decyldimethylsilyl, 3,7-dimethyloctyl-dimethylsilyl, lauryldimethylsilyl, phenyl-($C_1$–$C_{12}$)-alkylsilyl, $C_1$–$C_{12}$ alkoxyphenyl-($C_1$–$C_{12}$)-alkylsilyl, $C_1$–$C_{12}$ alkylphenyl-($C_1$–$C_{12}$)-alkylsilyl, 1-naphthyl-($C_1$–$C_{12}$)-alkylsilyl, 2-naphthyl-($C_1$–$C_{12}$)-alkylsilyl, phenyl-($C_1$–$C_{12}$)-alkyldimethylsilyl, triphenylsilyl, tri-p-xylylsilyl, tribenzylsilyl, diphenylmethylsilyl, t-butyldiphenylsilyl, dimethylphenylsilyl, trimethoxysilyl, triethoxysilyl, tripropyloxysilyl, tri-i-propylsilyl, dimethyl-i-propylsilyl, methyldimethoxysilyl and ethyldimethoxysilyl groups.

The above described substituted silyloxy groups mean silyloxy groups substituted by one, two or three groups selected from the group consisting of alkyl, aryl, arylalkyl and monovalent heterocyclic groups. The number of carbons that each of the substituted silyloxy groups has is usually about 1 to 60 and preferably 3 to 48.

Examples of the substituted silyloxy groups include trimethylsilyloxy, triethylsilyloxy, tripropylsilyloxy, tri-i-propylsilyloxy, dimethyl-i-propylsilyloxy, diethyl-i-propylsilyloxy, t-butylsilyldimethylsilyloxy, pentyldimethylsilyloxy, hexyldimethylsilyloxy, heptyldimethylsilyloxy, octyldimethylsilyloxy, 2-ethylhexyl-dimethylsilyloxy, nonyldimethylsilyloxy, decyldimethylsilyloxy, 3,7-dimethyloctyl-dimethylsilyloxy, lauryldimethylsilyloxy, phenyl-($C_1$–$C_{12}$)-alkylsilyloxy, $C_1$–$C_{12}$ alkoxyphenyl-($C_1$–$C_{12}$)-alkylsilyloxy, $C_1$–$C_{12}$ alkylphenyl-($C_1$–$C_{12}$)-alkylsilyloxy, 1-naphthyl-($C_1$–$C_{12}$)-alkylsilyloxy, 2-naphythyl-($C_1$–$C_{12}$)-alkylsilyloxy, phenyl-($C_1$–$C_{12}$)-alkyldimethylsilyloxy, triphenylsilyloxy, tri-p-xylylsilyloxy, tribenzylsilyloxy, diphenylmethylsilyloxy, t-butyldiphenylsilyloxy, dimethylphenylsilyloxy, trimethoxysilyloxy, triethoxysilyloxy, tripropyloxysilyloxy, tri-i-propylsilyloxy, dimethyl-i-propylsilyloxy, methyldimethoxysilyloxy and ethyldimethoxysilyloxy groups.

Examples of the above described halogen atoms include fluorine, chlorine, bromine and iodine.

The number of carbons that each of the above described acyl groups has is usually about 2 to 20 and preferably 2 to 18. Specific examples of the acyl groups include acetyl, propionyl, butyryl, isobutyryl, pivaloyl, benzoyl, trifluoroacetyl and pentafluorobenzoyl groups.

The number of carbons that each of the above described acyloxy groups has is usually about 2 to 20 and preferably 2 to 18. Specific examples of the acyloxy groups include acetoxy, propionyloxy, butyryloxy, isobutyryloxy, pivaloyloxy, benzoyloxy, trifluoroacetyloxy and pentafluorobenzoyloxy groups.

The number of carbons that each of the above described imino groups has is usually about 2 to 20 and preferably 2 to 18. Specific examples of the imino groups include compounds represented by the following structural formulae.

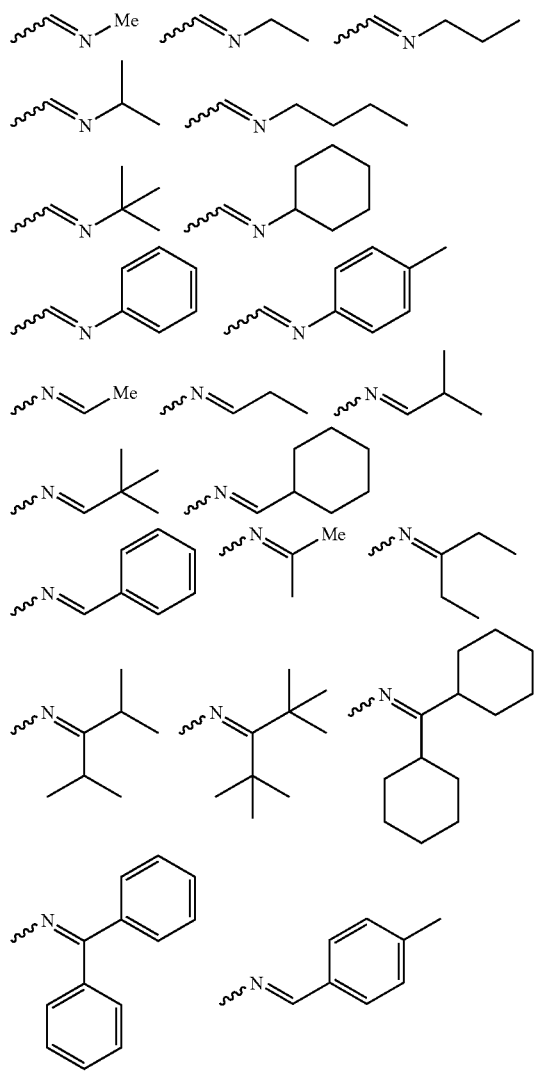

-continued

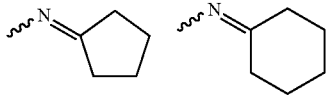

The number of carbons that each of the above described amide groups has is usually about 1 to 20 and preferably 2 to 18. Specific examples of the amide groups include formamide, acetamide, propionamide, butyramide, benzamide, trifluoroacetamide, pentafluorobenzamide, diformamide, diacetamide, dipropionamide, dibutyramide, dibenzamide, ditrifluoroacetamide and dipentafluorobenzamide.

The number of carbons that each of the above described imide groups has is usually about 4 to 20 and preferably 6 to 18. Specific examples of the imide groups include groups represented by the following structural formulae.

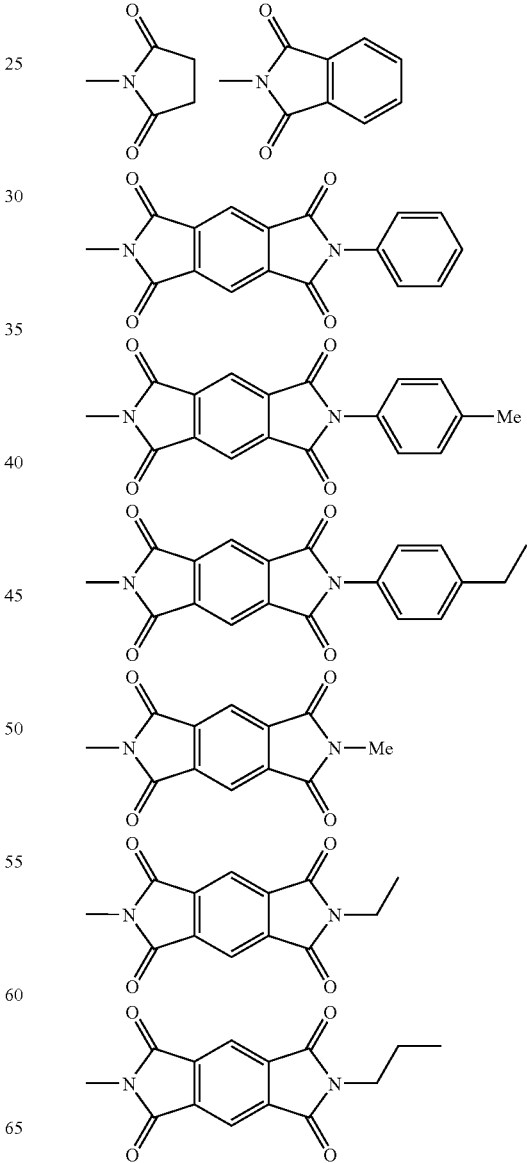

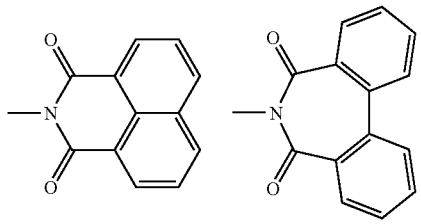

In the above formulae, Me represents a methyl group.

The term "monovalent heterocyclic group" means an atomic group derived from a heterocyclic compound by removal one of hydrogens on the heterocyclic ring. The number of carbons that each of the monovalent heterocyclic groups has is usually 3 to 60 and preferably 4 to 20. This number does not include the number of carbons the substituents of the heterocyclic compound have. The term "heterocyclic compound" means an organic compound having a ring structure in which the ring structure is composed of not only carbon atoms, but also a heteroatom(s) such as oxygen, sulfur, nitrogen, phosphorus and boron. Examples of monovalent heterocyclic groups include thienyl, $C_1$–$C_{12}$ alkylthienyl, pyrrolyl, furyl, pyridyl and $C_1$–$C_{12}$ alkylpyridyl. Of these groups, preferable are thienyl, $C_1$–$C_{12}$ alkylthienyl, pyrrolyl and $C_1$–$C_{12}$ alkylpyridyl groups.

The number of carbons that each of the above described substituted carboxyl groups has is usually about 2 to 60 and preferably 2 to 48. The term "substituted carboxyl group" means a carboxyl group substituted by an alkyl, aryl, arylalkyl or monovalent heterocyclic group. Specific examples of the carboxyl groups include methoxycarbonyl, ethoxycarbonyl, propoxycarbonyl, i-propoxycarbonyl, butoxycarbonyl, i-butoxycarbonyl, t-butoxycarbonyl, pentyloxycarbonyl, hexyloxycarbonyl, cyclohexyloxycarbonyl, heptyloxycarbonyl, octyloxycarbonyl, 2-ethylhexyloxycarbonyl, nonyloxycarbonyl, decyloxycarbonyl, 3,7-dimethyloctyloxycarbonyl, dodecyloxycarbonyl, trifluoromethoxycarbonyl, pentafluoroethoxycarbonyl, perfluorobutoxycarbonyl, perfluorohexyloxycarbonyl, perfluorooctyloxycarbonyl, phenoxycarbonyl, naphthoxycarbonyl and pyridyloxycarbonyl groups.

Of the substituents as exemplified above, the substituents containing an alkyl chain(s) may be straight, branched or cyclic chains, or combinations thereof. Examples of the substituents which are not straight chains include isoamyl, 2-ethylhexyl, 3,7-dimethyloctyl, cyclohexyl and 4-($C_1$–$C_{12}$)-alkylcyclohexyl. The substituents containing alkyl chains may form a ring with the tips of the two alkyl chains linked together. Further, the methyl group or methylene group as a part of the alkyl chain may be substituted by a group containing a heteroatom, or a methyl group or methylene group substituted by one or more fluorine atoms. Examples of such heteroatoms include oxygen, sulfur and nitrogen atoms.

$R_1$ in the above described formula (1) represents a hydrogen atom, or an alkyl, alkoxy, alkylthio, aryl, aryloxy, arylthio, arylalkyl, arylalkoxy, arylalkylthio, arylalkenyl, arylalkynyl, amino, substituted amino, silyl, substituted silyl, silyloxy, substituted silyloxy or monovalent heterocyclic group, or a halogen atom.

Specific examples of alkyl or alkoxy groups as R1 include the same alkyl or alkoxy groups illustrated as the substituents of the rings D and E.

Preferably, $R_1$ is an alkyl, aryl, substituted amino or monovalent heterocyclic group and more preferably an aryl, substituted amino or monovalent heterocyclic group.

The basic structures of repeating units represented by the formula (1) are as follows.

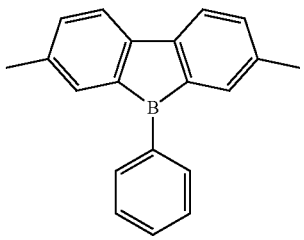

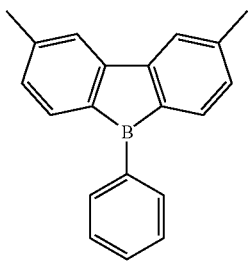

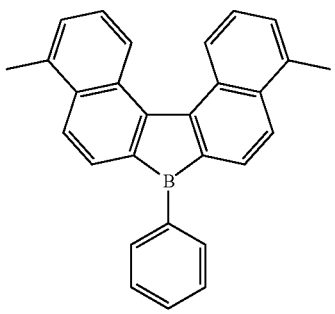

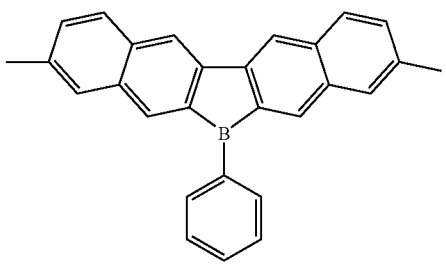

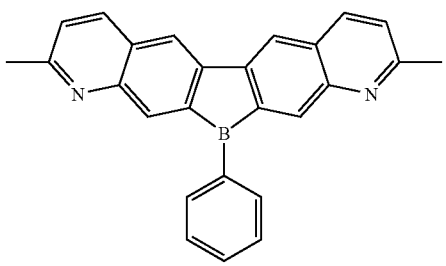

-continued
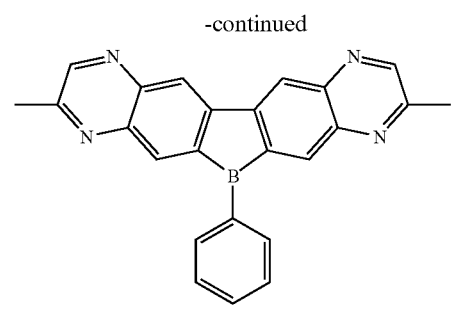
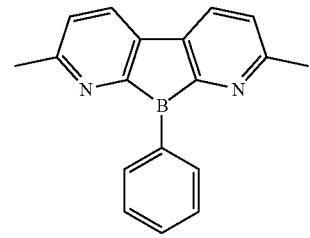
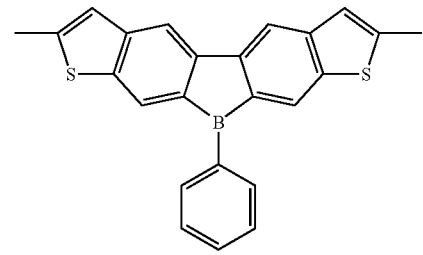
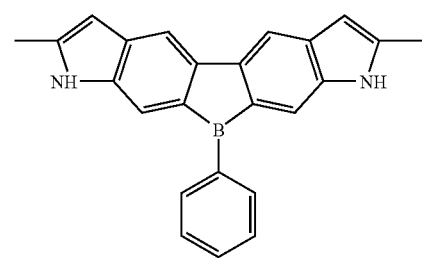
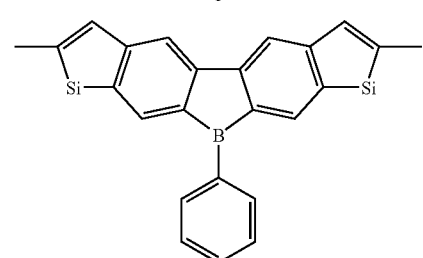
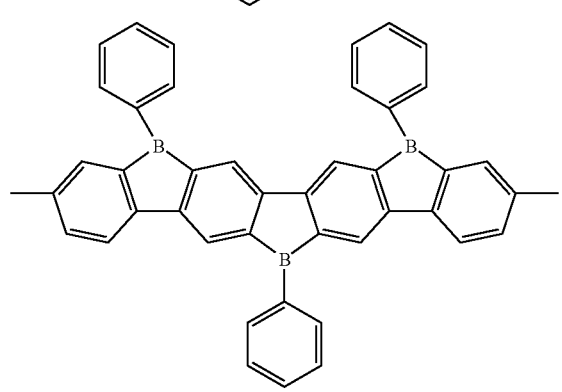
-continued
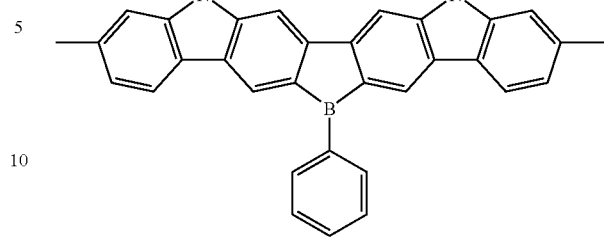
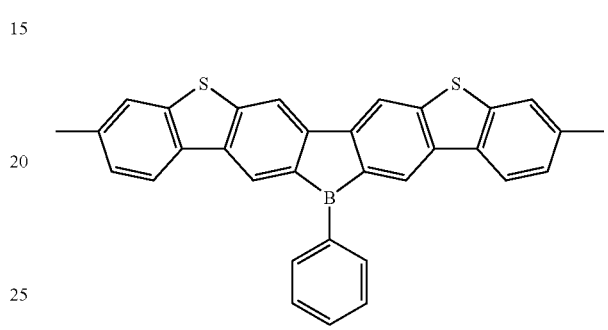
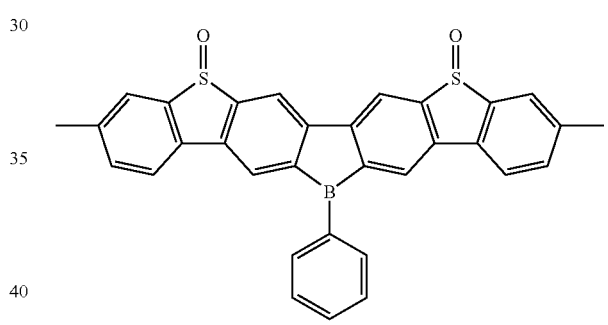
Specific examples of repeating units represented by the formula (1) include the following units.
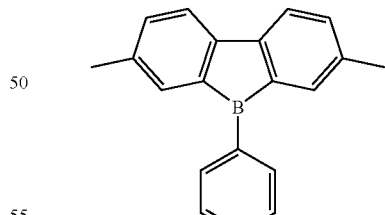
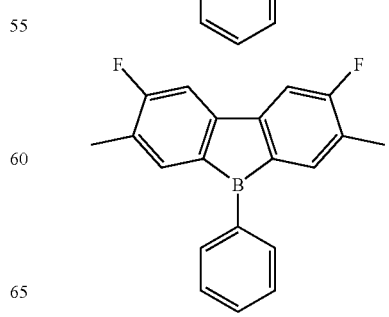

-continued
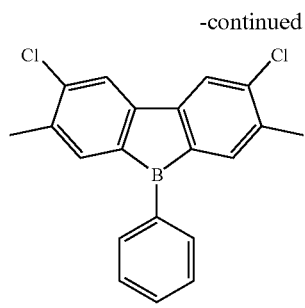
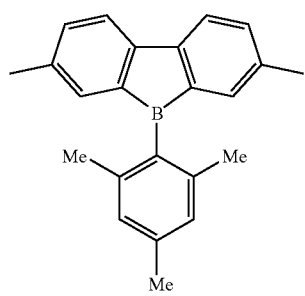
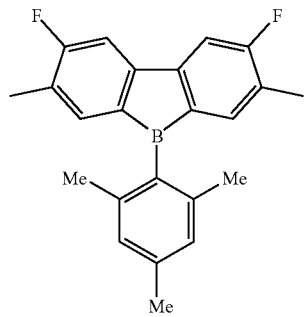
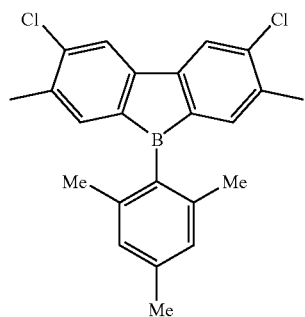
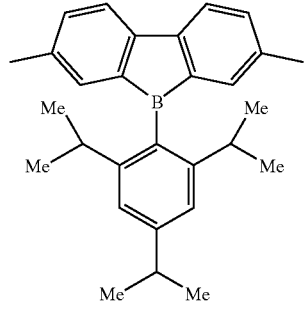
-continued
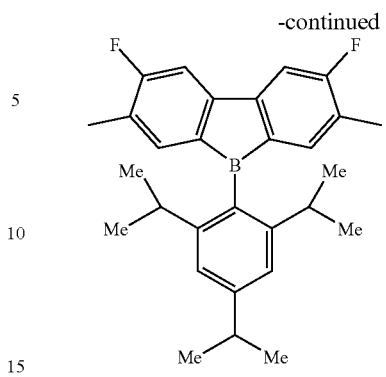
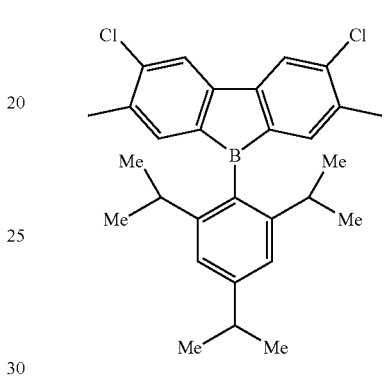
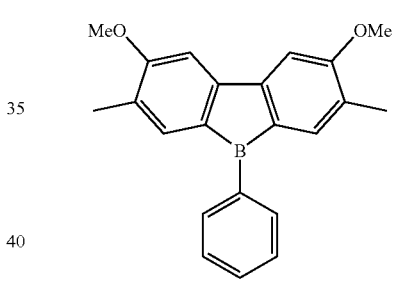
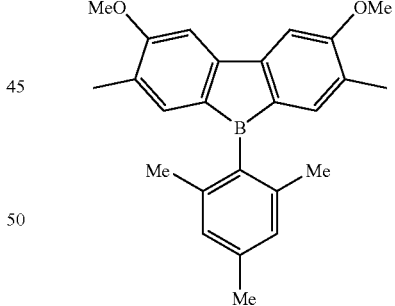
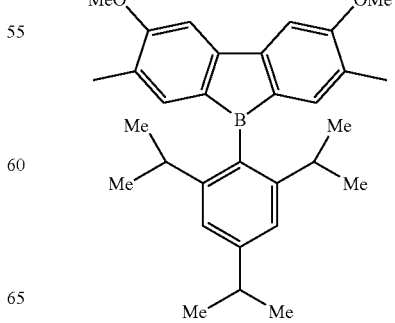

-continued
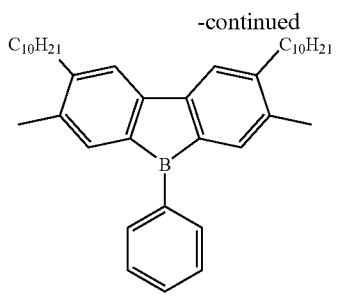
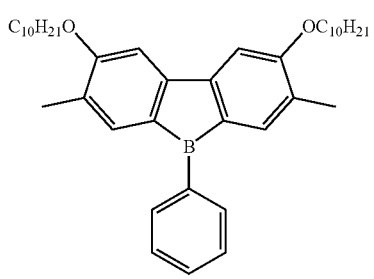
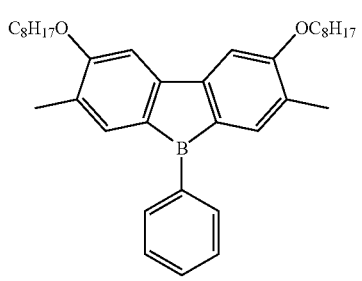
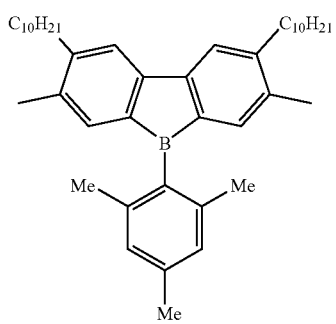
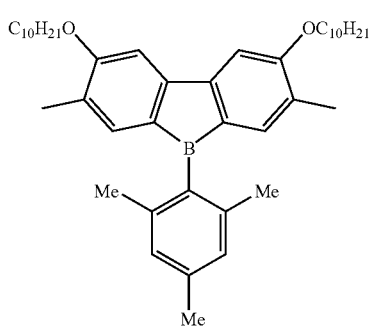
-continued
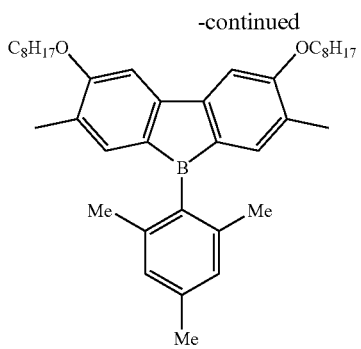
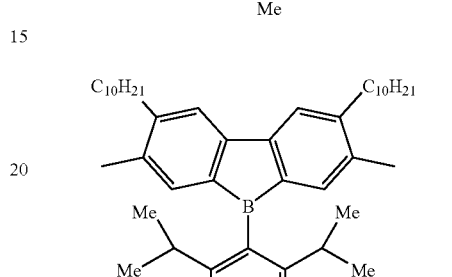
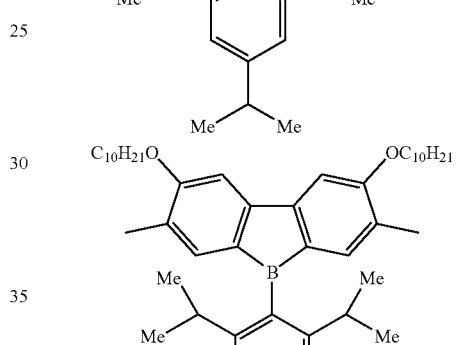
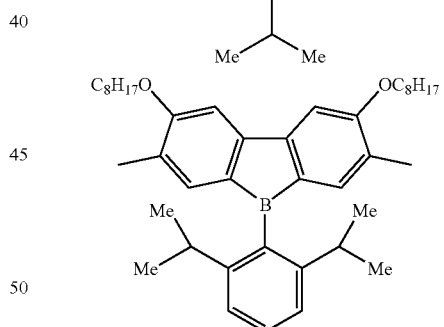
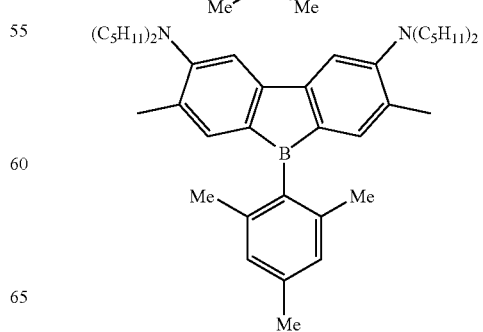

-continued
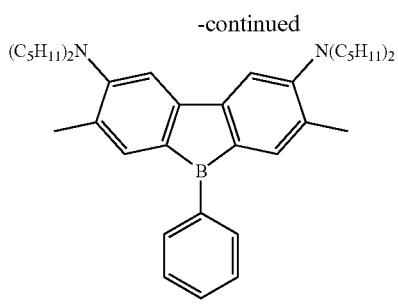
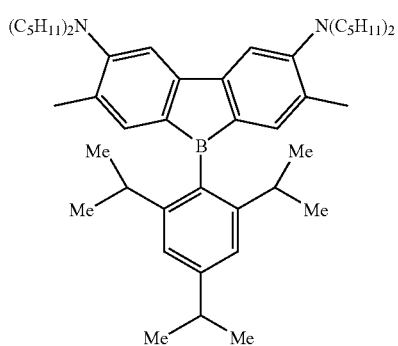
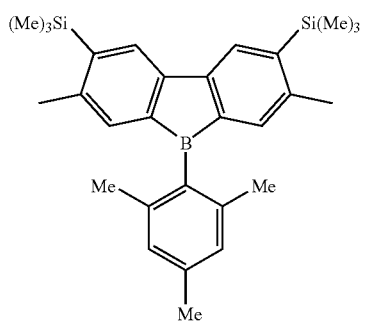
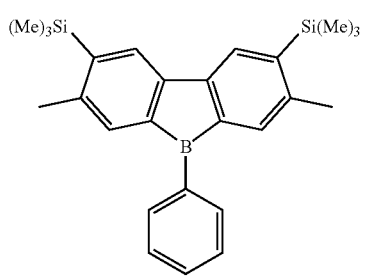
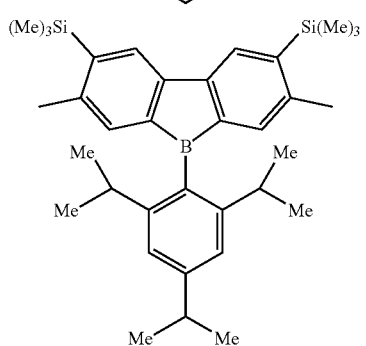
-continued
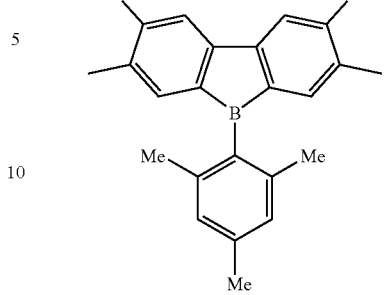
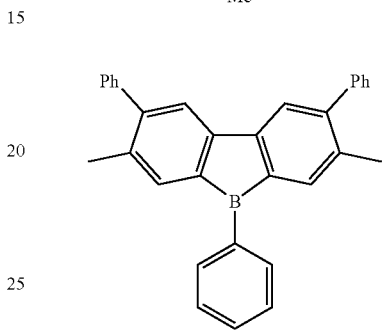
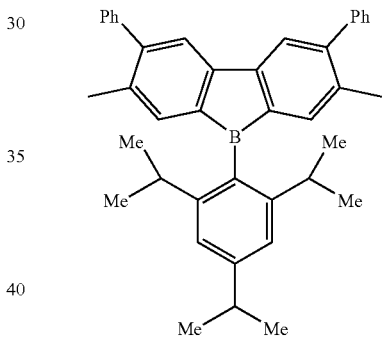
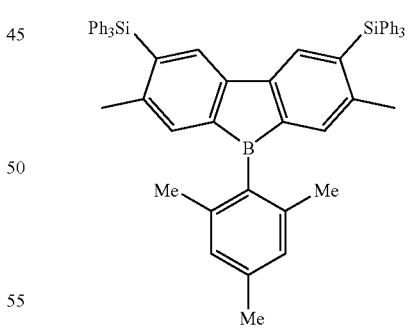
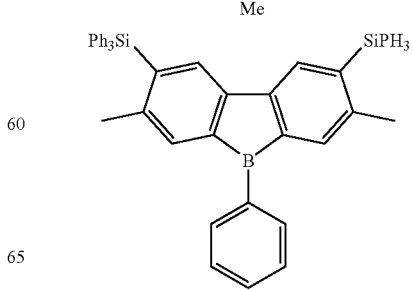

-continued
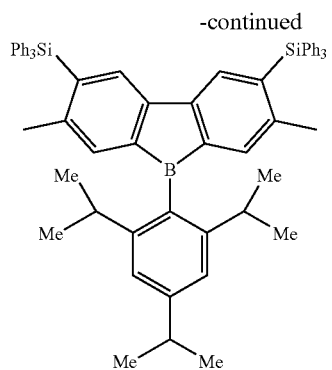
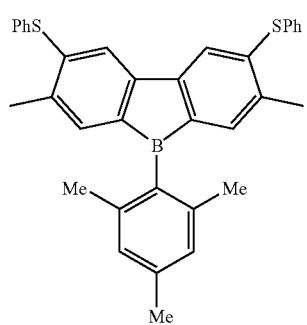
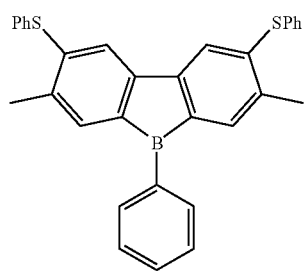
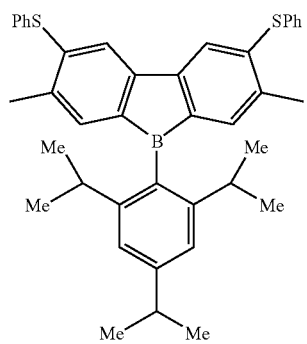
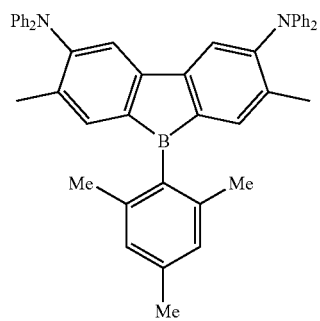
-continued
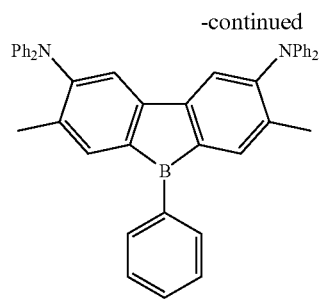
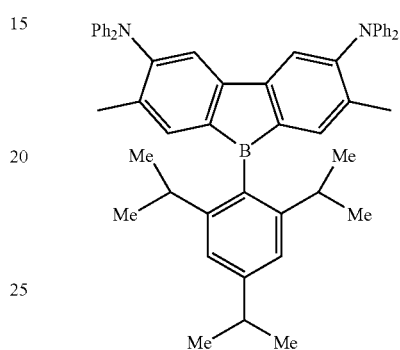
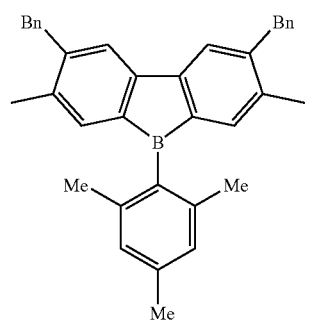
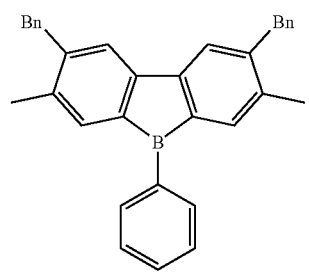
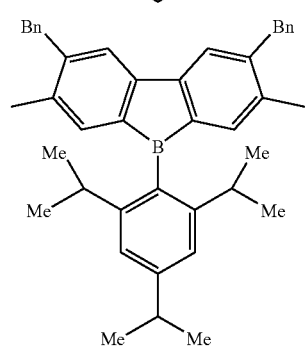

-continued
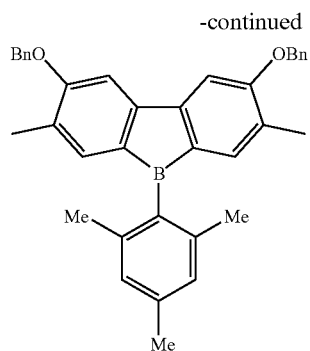
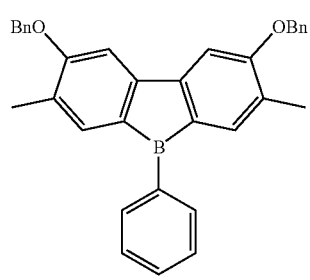
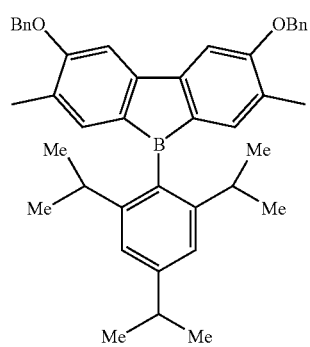
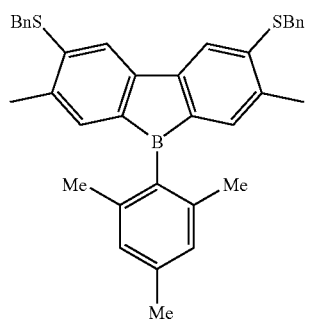
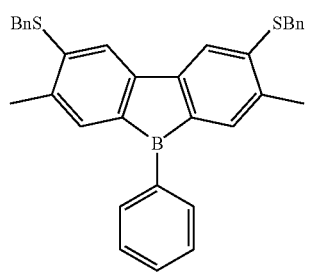
-continued
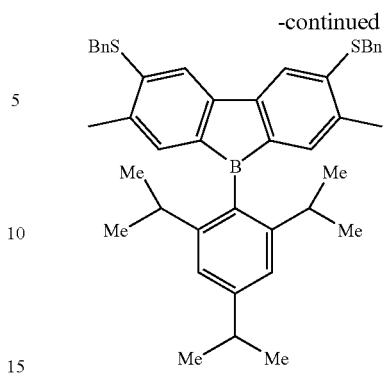
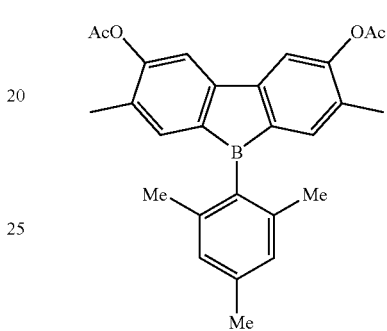
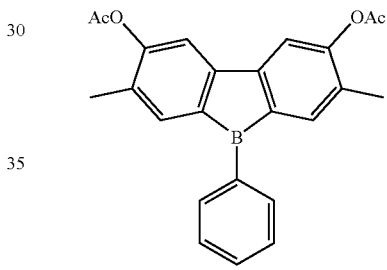
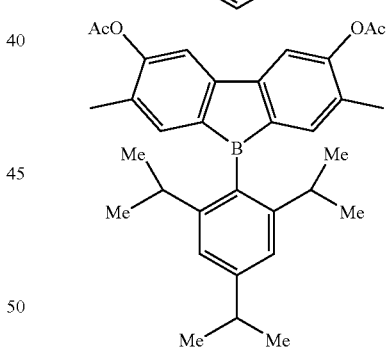
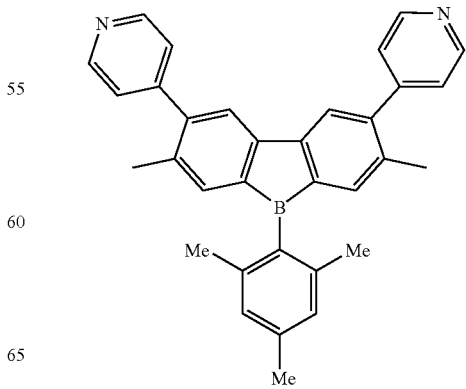

-continued
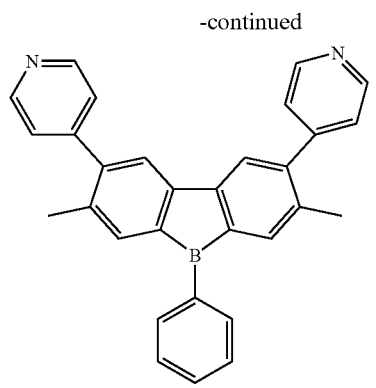
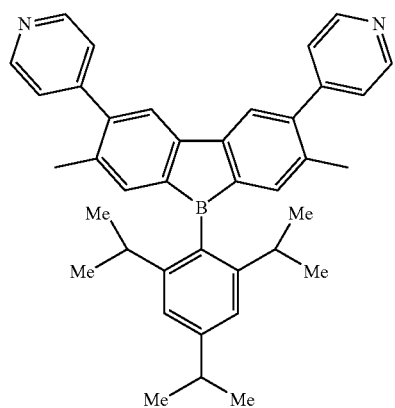
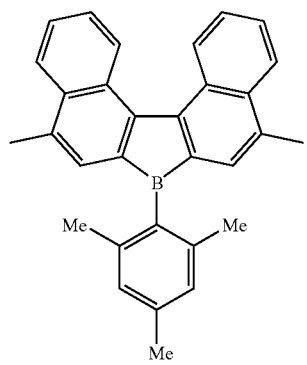
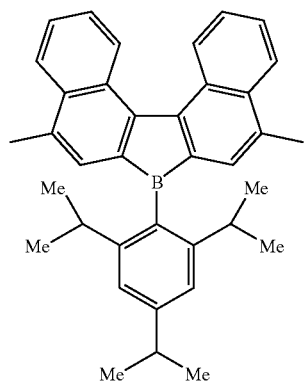
-continued
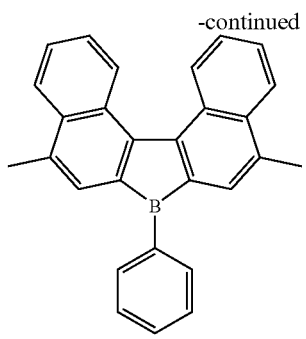
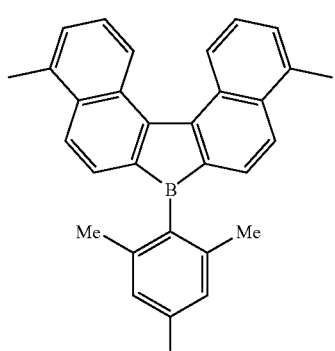
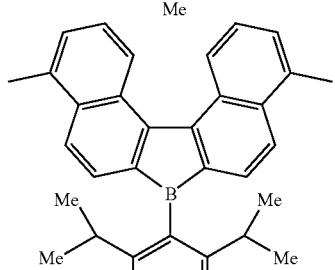
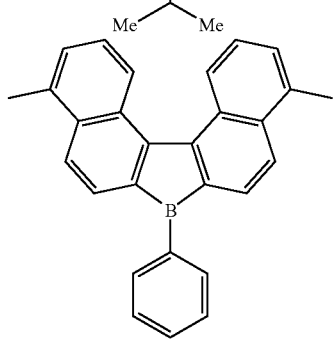
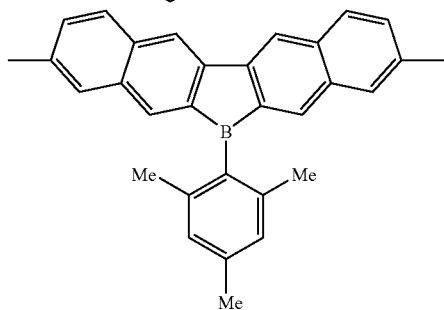

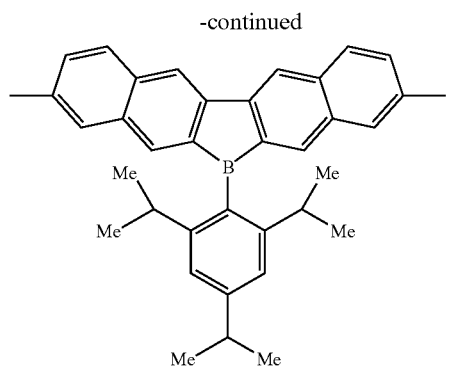
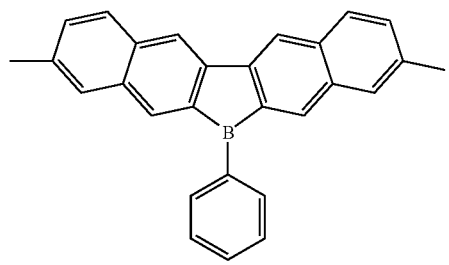
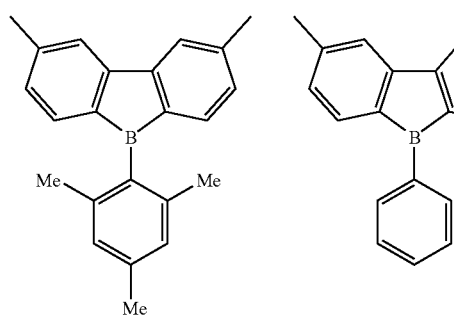
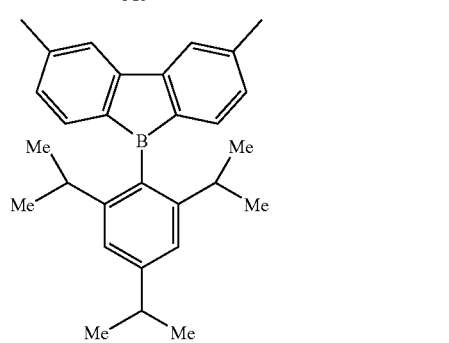
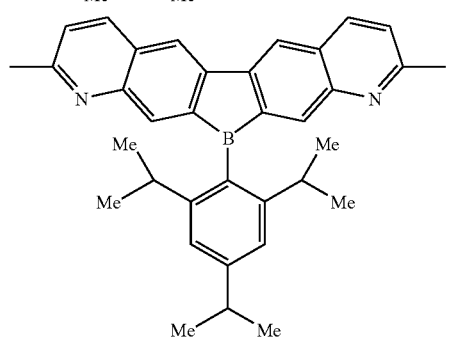
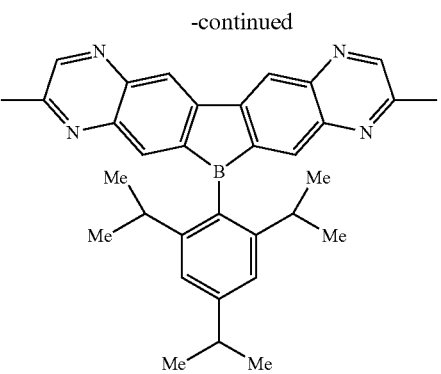

-continued
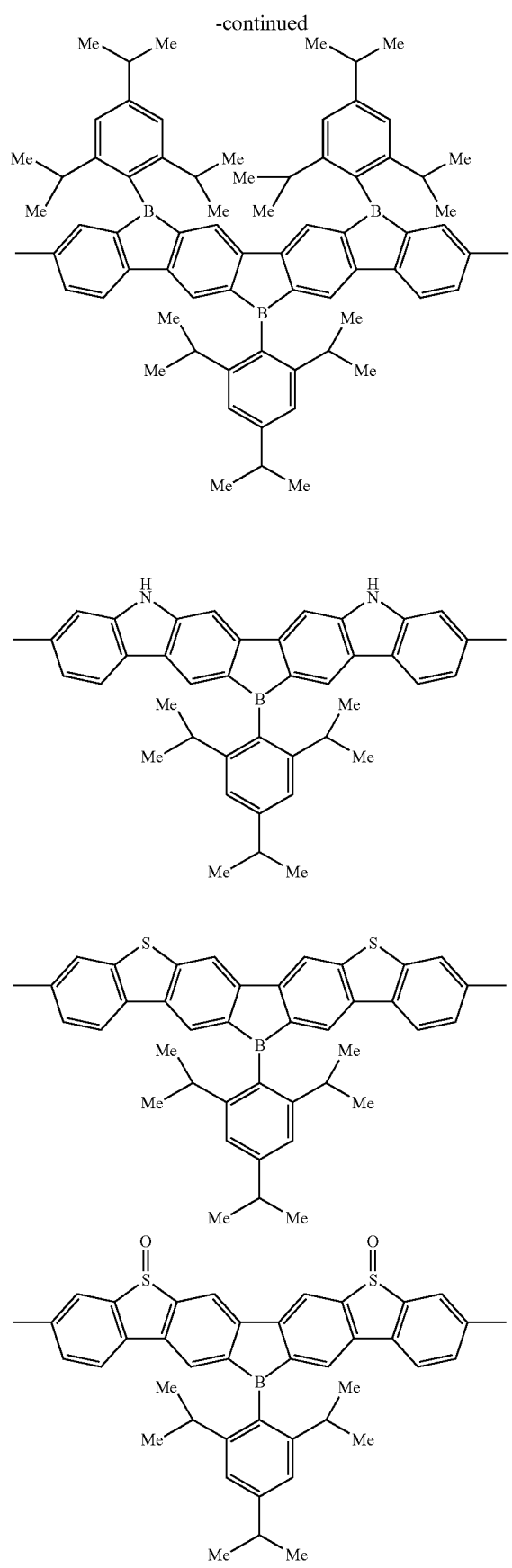
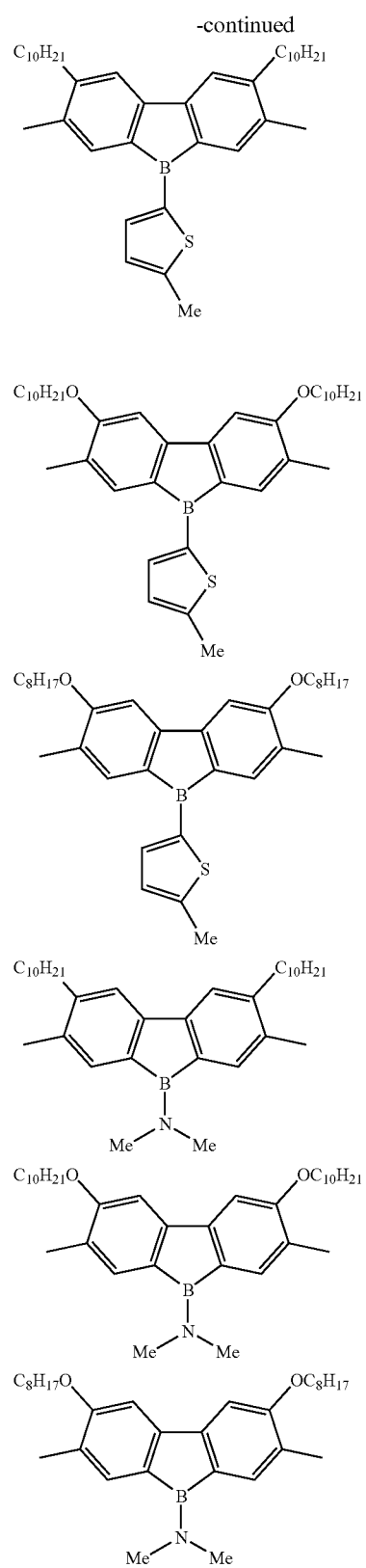
In the above formulae, Me represents a methyl group; Ph a phenyl group; Bn a benzyl group; and Ac an acetyl group.

In order to increase the polymer solubility, shift the luminescence wavelength or increase the luminous efficiency, preferably the ring(s) D and/or E in the above formula (1) has a substituent selected from the group consisting of alkyl, alkoxy, alkylthio, aryl, aryloxy, arylthio, arylalkyl, arylalkoxy, arylalkylthio, arylalkenyl, arylalkynyl, amino, substituted amino, silyl, substituted silyl, silyloxy and substituted silyloxy groups, halogen atoms, and acyl, acyloxy, imino, amide, imide, monovalent heterocyclic, carboxyl, substituted carboxyl and cyano groups. More preferably, the substituent is selected from the group consisting of alkyl, alkoxy, alkylthio, aryl, aryloxy, arylthio, arylalkyl, arylalkoxy, arylalkylthio, amino, substituted amino, substituted silyl and substituted silyloxy groups, a fluorine atom, and acyl, acyloxy, amide, imide, monovalent heterocyclic, carboxyl, substituted carboxyl and cyano groups. Much more preferably, the substituent is an alkyl, alkoxy, alkylthio, aryloxy, arylthio, arylalkyl, arylalkoxy, arylalkylthio, amino or substituted amino group. Particularly preferably, the substituent is an alkyl, alkoxy, alkylthio or substituted amino group.

To increase the solubility of the polymer in a solvent, preferably $R_1$ in the formula (1) contains a cyclic or branched alkyl chain. Also preferably, one or more of the substituents of the rings D and E contain a straight alkyl chain or a cyclic or branched alkyl chain having 3 or more carbon atoms.

The rings D and E are preferably aromatic hydrocarbon rings, and more preferably benzene, naphthalene or anthracene rings.

Of the above described repeating units, those represented by the following formula (2-1), (2-2), (2-3), (2-4) or (2-5) are particularly preferable.

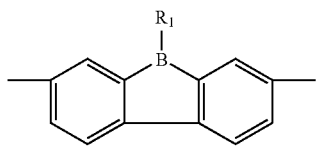
(2-1)

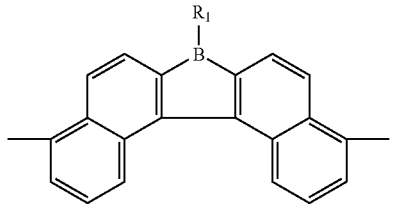
(2-2)

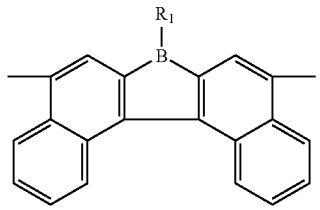
(2-3)

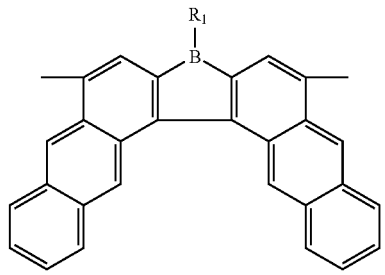
(2-4)

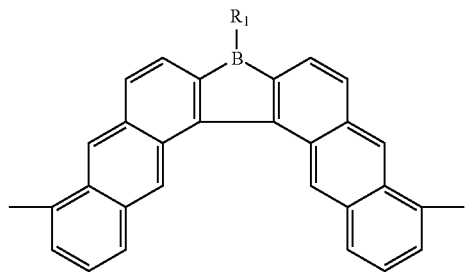
(2-5)

In order to increase the polymer solubility, shift the luminescence wavelength or increase the luminous efficiency, preferably the benzene, naphthalene or anthracene ring has one or more substituents. Preferred substituents are the same as those contained in the ring(s) D and/or E in the above described formula (1). Preferably, one or more of the above substituents contain a straight alkyl chain or a cyclic or branched alkyl chain having 3 or more carbon atoms.

In the formula (2-1), (2-2), (2-3), (2-4) or (2-5), $R_1$ represents the same group as in the formula (1).

Of the above described repeating units, those represented by the formula (2-1) are more preferable and those represented by the following formula (3) are particularly preferable.

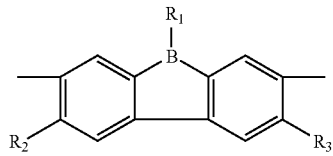
(3)

In the above formula, $R_1$ represents the same group as in the formula (1); and $R_2$ and $R_3$ each independently represent an alkyl, alkoxy, alkylthio, aryloxy, arylthio, arylalkyl, arylalkoxy, arylalkylthio, amino or substituted amino group.

Preferably, each of $R_2$ and $R_3$ is an alkyl, alkoxy, alkylthio or substituted amino group.

In the repeating units represented by the above formulae (1), (2-1) to (2-5) and (3), preferably $R_1$ is an alkyl, aryl, substituted amino or monovalent heterocyclic group and more preferably an aryl, substituted amino or monovalent heterocyclic group. Particularly preferably $R_1$ is a phenyl group having an alkyl group at each of 2, 4, 6 positions, a dialkylamino group, or a thienyl group.

In the polymer in accordance with this invention, the amount of the repeating units represented by the formula (1) is usually 1 to 100% by mole and preferably 20 to 90% by mole of the total amount of the repeating units the polymer has.

In order to increase the intensity of fluorescence, preferably the polymer in accordance with this invention is a copolymer of the repeating units represented by the formula (1) and each having different substituents or a copolymer of the repeating units represented by the formula (1) and at least one or more kinds of repeating units other than those represented by the formula (1). Preferably the repeating units, other than those represented by the formula (1), which the polymer of this invention may contain is represented by the following formula (4), (5), (6) or (7).

$$-Ar_1- \quad (4)$$

$$-Ar_1-X_1-(Ar_2-X_2)_w-Ar_3- \quad (5)$$

$$-Ar_1-X_2- \quad (6)$$

$$-X_2- \quad (7)$$

In the above formulae, $Ar_1$, $Ar_2$ and $Ar_3$ each independently represent an arylene group, a divalent heterocyclic group or a divalent group having a metal complex structure. $X_1$ represents $-C\equiv C-$, $-N(R_{22})-$ or $-(SiR_{23}R_{24})_y-$. $X_2$ represents $-CR_{20}=CR_{21}-$, $-C\equiv C-$, $-N(R_{22})-$ or $-(SiR_{23}R_{24})_y-$. $R_{20}$ and $R_{21}$ each independently represent a hydrogen atom, or alkyl, aryl, monovalent heterocyclic, carboxyl, substituted carboxyl or cyano group. $R_{22}$, $R_{23}$ and $R_{24}$ each independently represent a hydrogen atom, or alkyl, aryl, monovalent heterocyclic or arylalkyl group. w represents an integer of 0 to 1. y represents an integer of 1 to 12.

The term "arylene group" means an atomic group formed by removal of two hydrogen atoms on the ring of an aromatic hydrocarbon. The above described arylene groups include those having a condensed ring and those formed by combining two or more independent benzene rings or condensed rings directly or via a group such as vinylene. The number of carbons that each of the arylene groups has is usually about 6 to 60 and preferably about 6 to 20. The arylene groups optionally have a substituent. Examples of such substituents include alkyl, alkoxy, alkylthio, aryl, aryloxy, arylthio, arylalkyl, arylalkoxy, arylalkylthio, arylalkenyl, arylalkynyl, amino, substituted amino, silyl, substituted silyl, silyloxy and substituted silyloxy groups, halogen atoms, and acyl, acyloxy, imino, amide, imide, monovalent heterocyclic, carboxyl, substituted carboxyl and cyano groups. Preferably, the substituent is alkyl, alkoxy, alkylthio, aryl, aryloxy, arylthio, substituted amino, substituted silyl, substituted silyloxy or monovalent heterocyclic group.

Examples of arylene groups include a phenylene group (e.g. formulae 1 to 3 below), a naphthalenediyl group (e.g. formulae 4 to 13 below), anthracenediyl (e.g. formulae 14 to 19 below), a biphenyldiyl group (e.g. formulae 20 to 25 below), a terphenyldiyl group (e.g. formulae 26 to 28 below), condensed ring compounds (e.g. formulae 29 to 35 below), a fluorenediyl group (e.g. formulae 36 to 38 below), an indenofluorenediyl group (e.g. formulae 38A to 38B below), a stilbenediyl group (e.g. formulae A to D below), and a distilbenediyl group (e.g. formulae E and F below). Of these arylene groups, preferable are phenylene, biphenyldiyl, fluorenediyl and stilbenediyl groups.

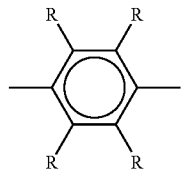

1

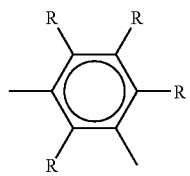

2

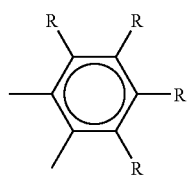

3

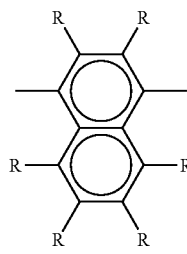

4

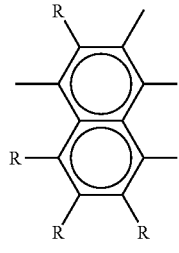

5

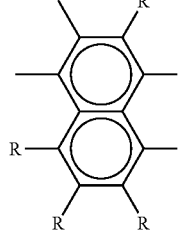

6

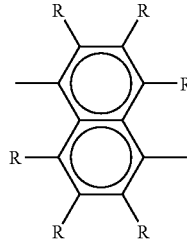

7

-continued
8
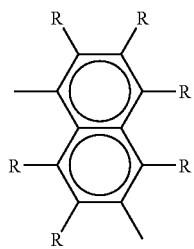
9
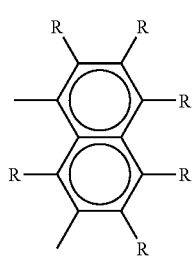
10
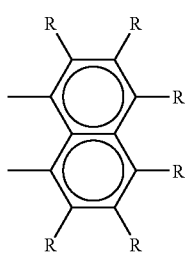
11
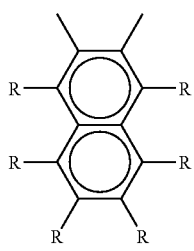
12
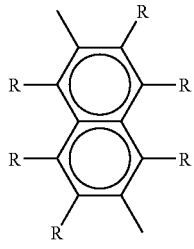
13
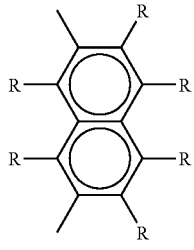
-continued
14
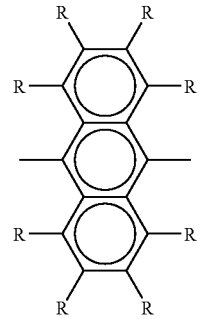
15
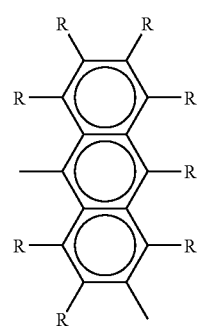
16
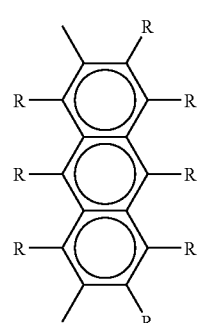
17
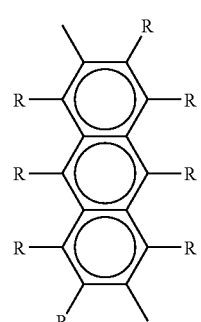
18
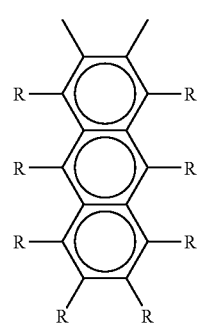

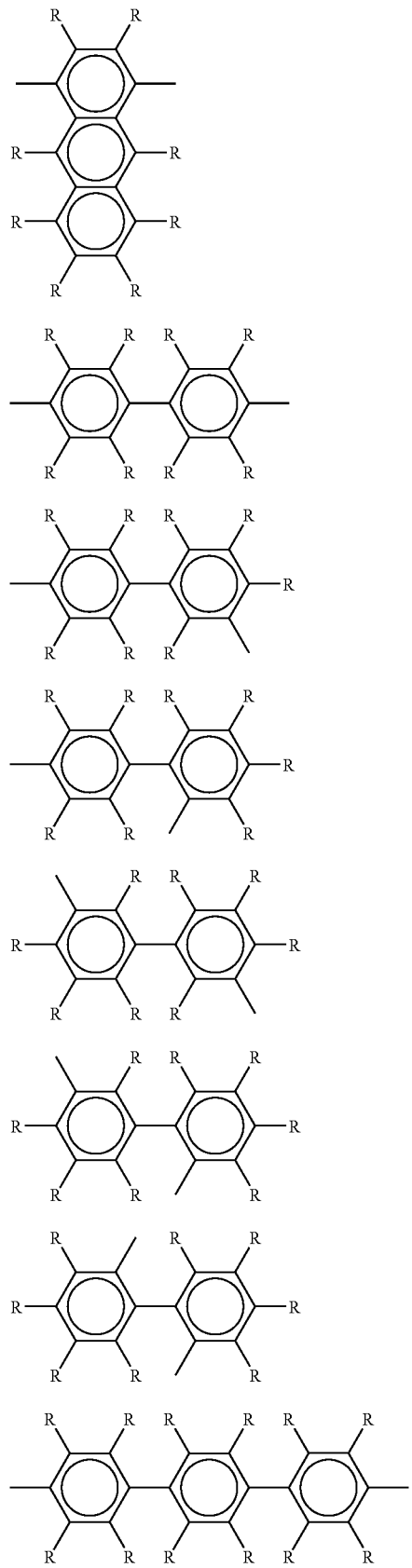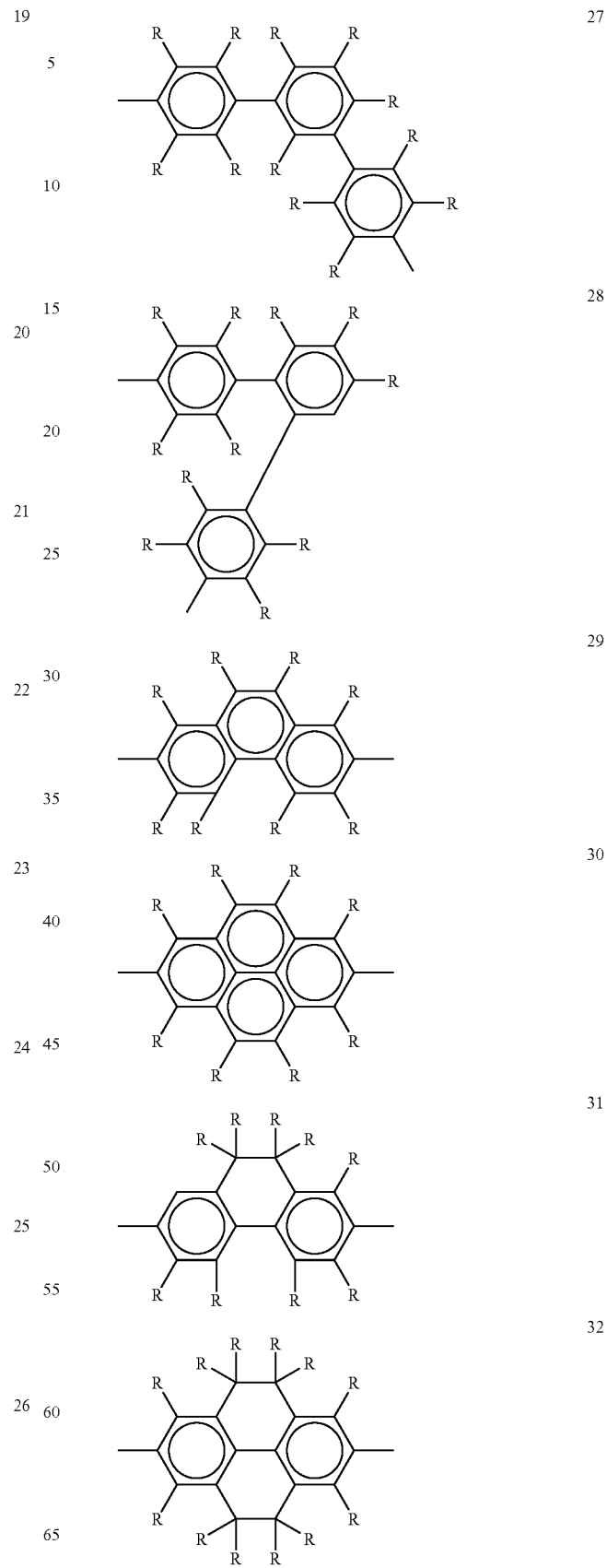

-continued
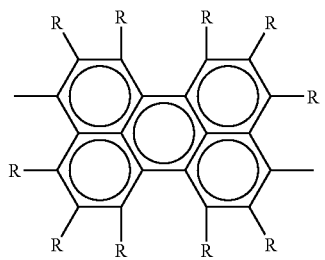
33
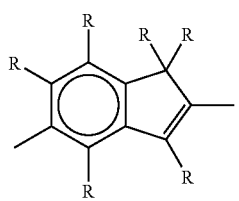
34
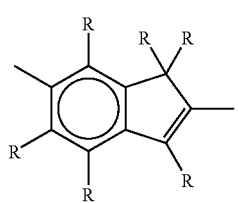
35
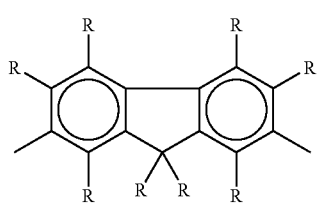
36
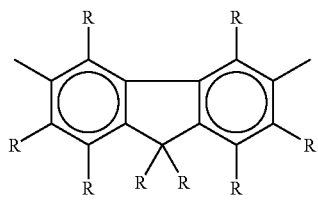
37
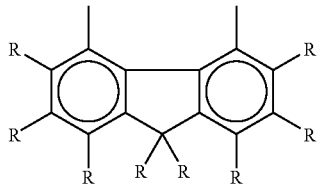
38
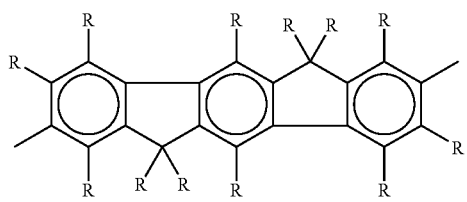
38A
-continued
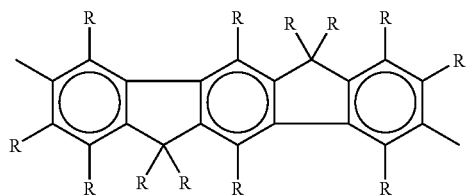
38B
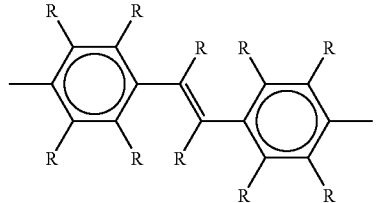
A
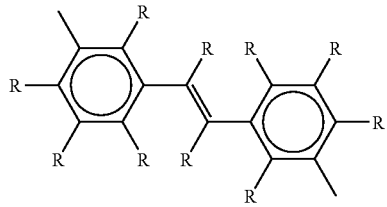
B
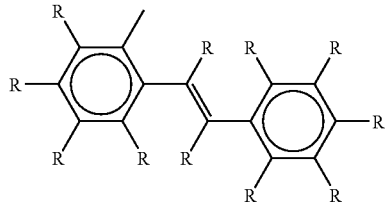
C
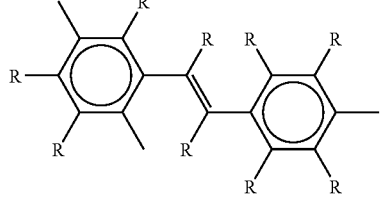
D
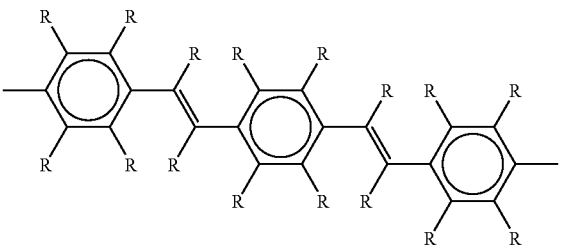
E
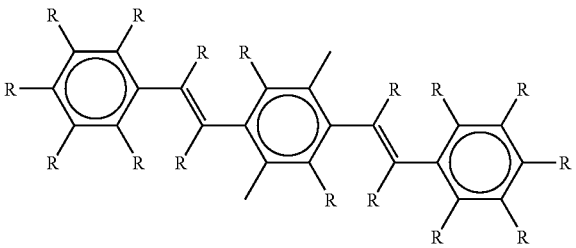
F In this invention, the term "divalent heterocyclic group" means an atomic group formed by removal of two hydrogen atoms on the ring of a heterocyclic compound. The number of carbons that each of the divalent heterocyclic groups has is usually about 3 to 60 and preferably 4 to 20. The divalent heterocyclic groups optionally have a substituent.

The term "heterocyclic compound" means an organic compound having a ring structure in which the ring structure is composed of not only carbon atoms, but also a heteroatom(s) such as oxygen, sulfur, nitrogen, phosphorus, boron and arsenic.

Examples of the substituents the divalent heterocyclic groups have include alkyl, alkoxy, alkylthio, aryl, aryloxy, arylthio, arylalkyl, arylalkoxy, arylalkylthio, arylalkenyl, arylalkynyl, amino, substituted amino, silyl, substituted silyl, silyloxy and substituted silyloxy groups, halogen atoms, and acyl, acyloxy, imino, amide, imide, monovalent heterocyclic, carboxyl, substituted carboxyl and cyano groups. Preferably, the substituent is alkyl, alkoxy, alkylthio, aryl, aryloxy, arylthio, substituted amino, substituted silyl, substituted silyloxy or monovalent heterocyclic group.

Examples of the divalent heterocyclic groups are as follows:

divalent heterocyclic groups containing nitrogen as a heteroatom(s) such as pyridinediyl (formulae 39 to 44 below), diazaphenylene (formulae 45 to 48 below), quinolinediyl (formulae 49 to 63 below), quinoxalinediyl (formulae 64 to 68 below), acridinediyl (formulae 69 to 72 below), bipyridylyl (formulae 73 to 75 below) and phenanthrolinediyl (formulae 76 to 78 below) groups;

divalent heterocyclic groups containing silicon, nitrogen, sulfur or selenium as a heteroatom(s) and having a fluorene structure (formulae 79 to 93 below);

divalent heterocyclic groups containing silicon, nitrogen, sulfur or selenium as a heteroatom(s) and having an indenofluorene structure (formulae J to O below);

five-membered heterocyclic groups containing silicon, nitrogen, sulfur or selenium as a heteroatom(s) (formulae 94 to 98 below);

five-membered ring condensed heterocyclic groups containing silicon, nitrogen, sulfur or selenium as a heteroatom(s) (formulae 99 to 110 below);

five-membered heterocyclic groups containing silicon, nitrogen, sulfur or selenium as a heteroatom(s) two or more of which are combined at their α positions to form a dimer or oligomer (formulae 111 to 112 below);

five-membered heterocyclic groups containing silicon, nitrogen, sulfur or selenium as a heteroatom(s) which are combined with phenyl groups at their α positions (formulae 113 to 119 below); and five-membered ring condensed heterocyclic groups containing oxygen, nitrogen or sulfur as a heteroatom(s) and substituted by phenyl, furil or thienyl groups (formulae 120 to 125 below).

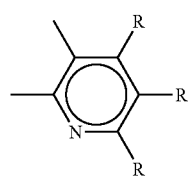

39

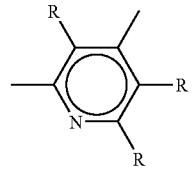

40

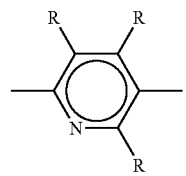

41

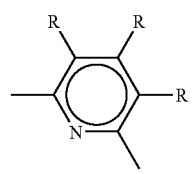

42

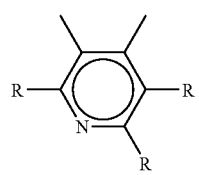

43

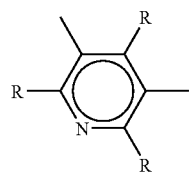

44

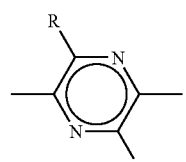

45

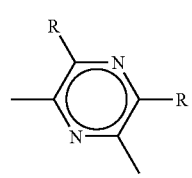

46

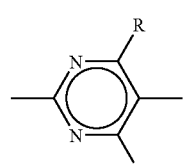

47

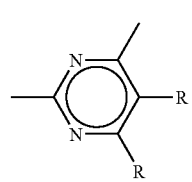

48

-continued
49
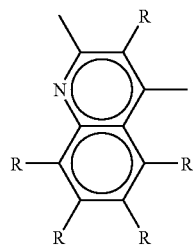
50
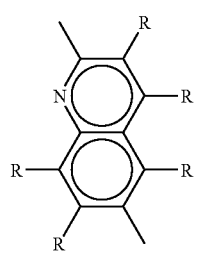
51
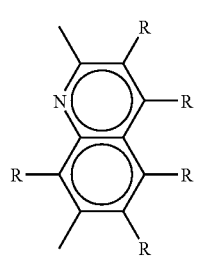
52
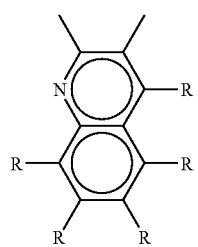
53
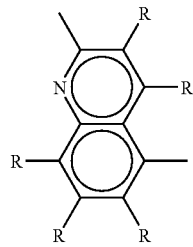
54
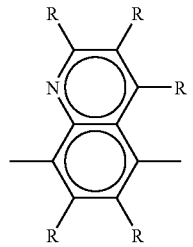
-continued
55
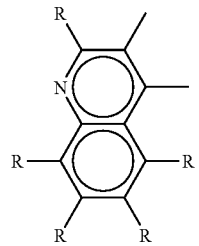
56
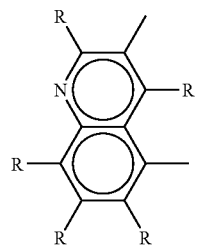
57
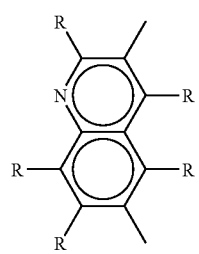
58
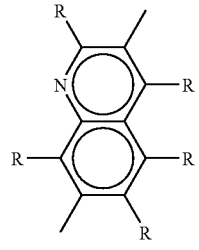
59
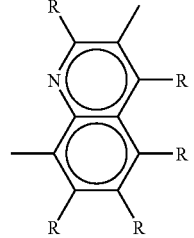
60
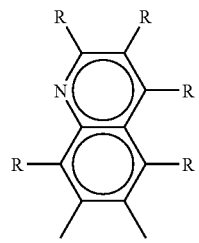

-continued
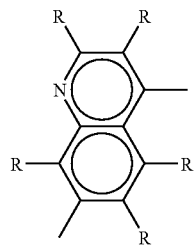
61
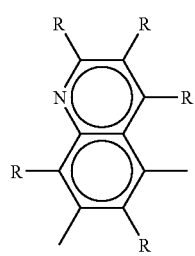
62
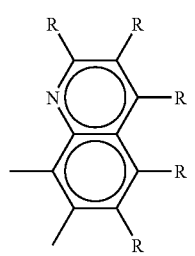
63
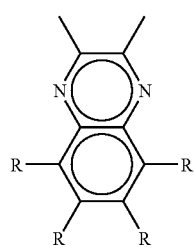
64
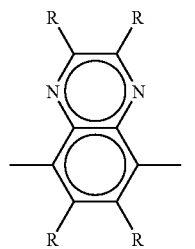
65
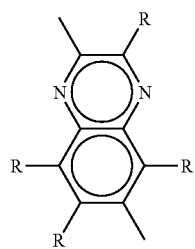
66
-continued
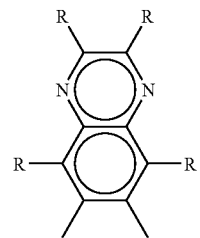
67
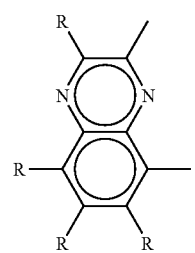
68
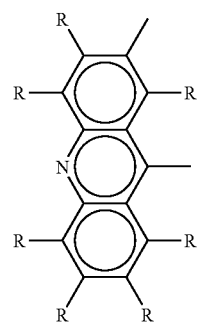
69
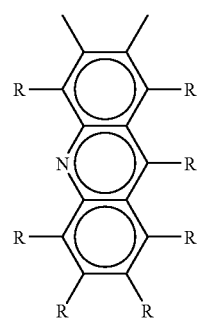
70
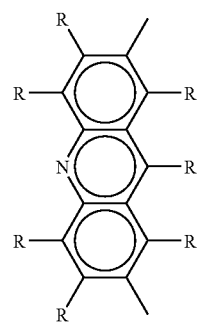
71

-continued
72 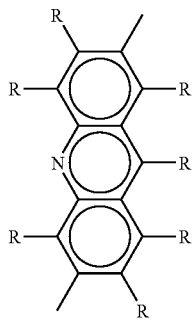
73 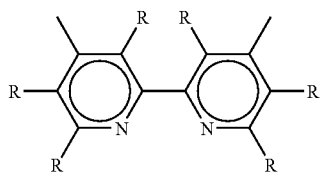
74 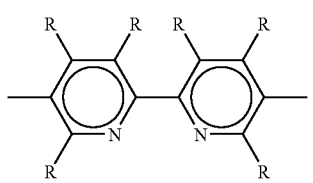
75 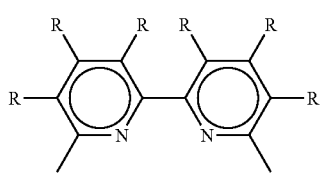
76 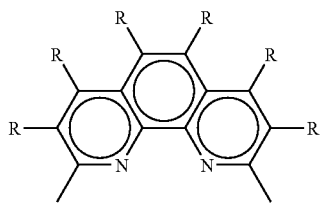
77 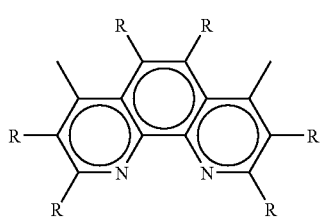
78 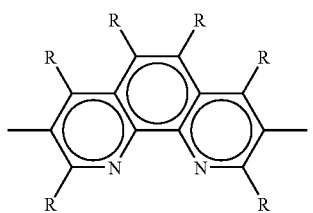
-continued
79 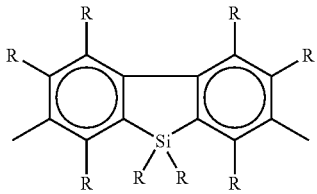
80 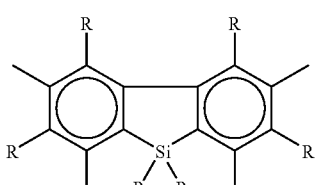
81 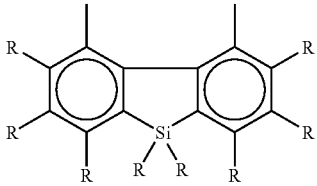
82 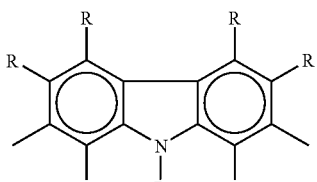
83 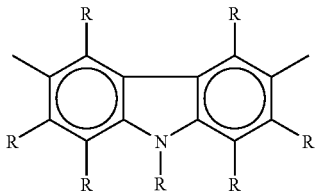
84 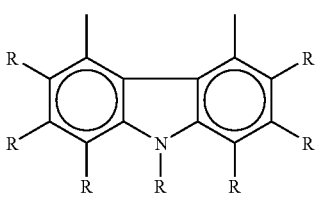
85 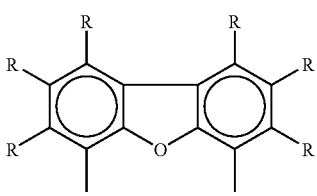
86 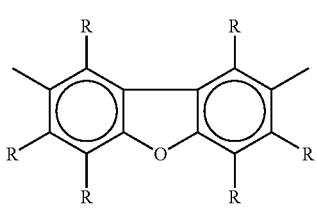

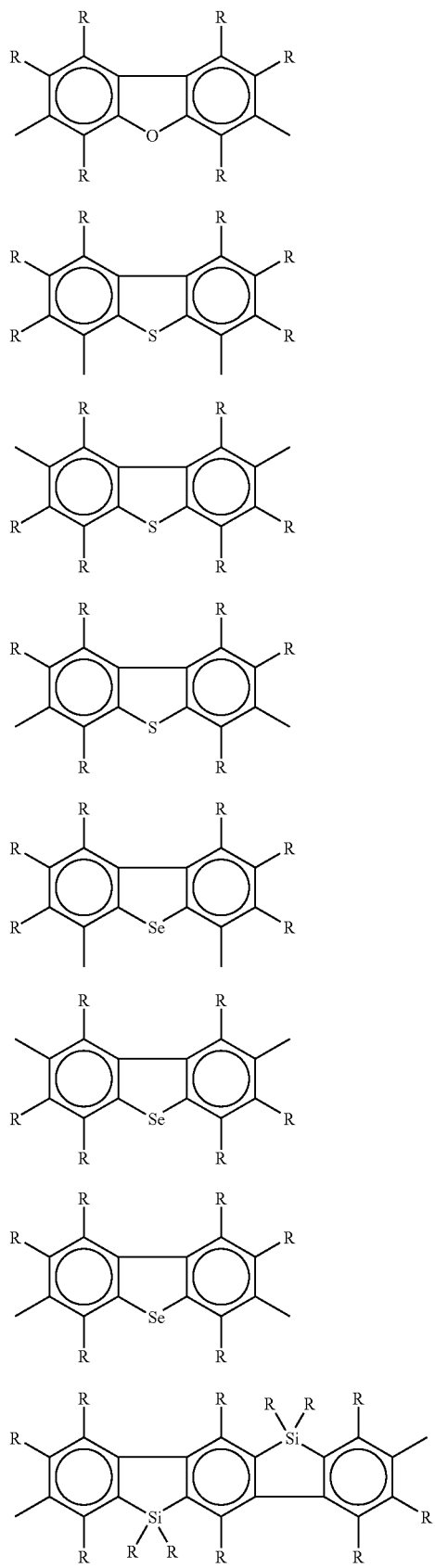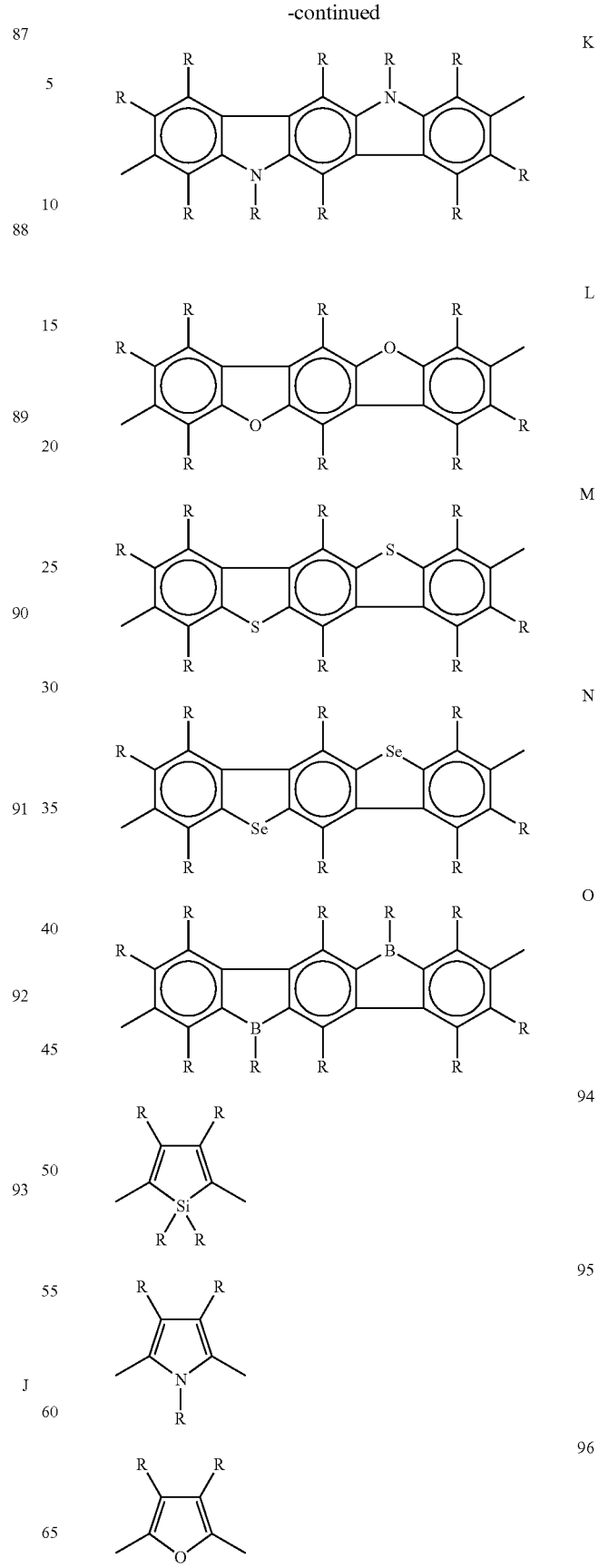

-continued
97
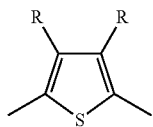
98
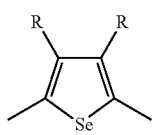
99
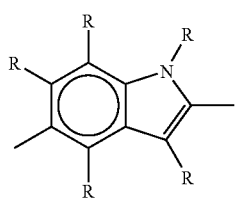
100
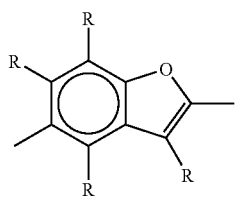
101
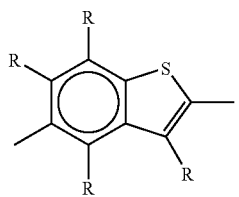
102
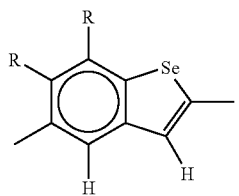
103
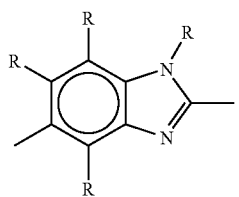
104
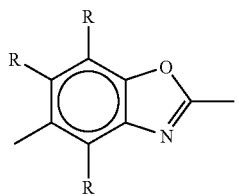
-continued
105
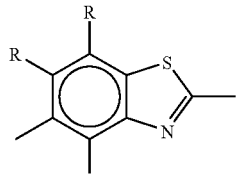
106
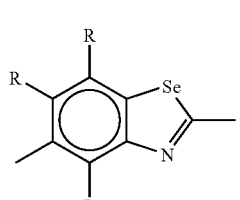
107
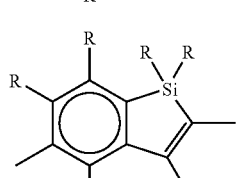
108
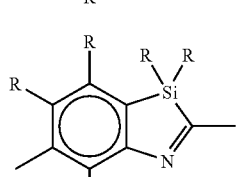
109
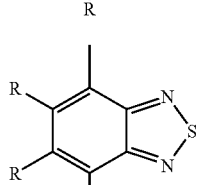
110
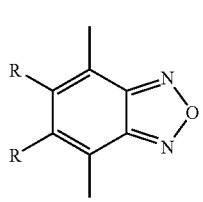
111
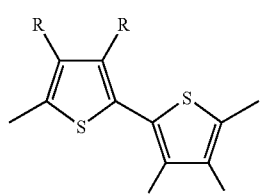
112
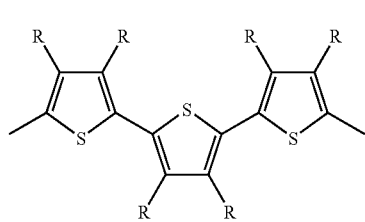

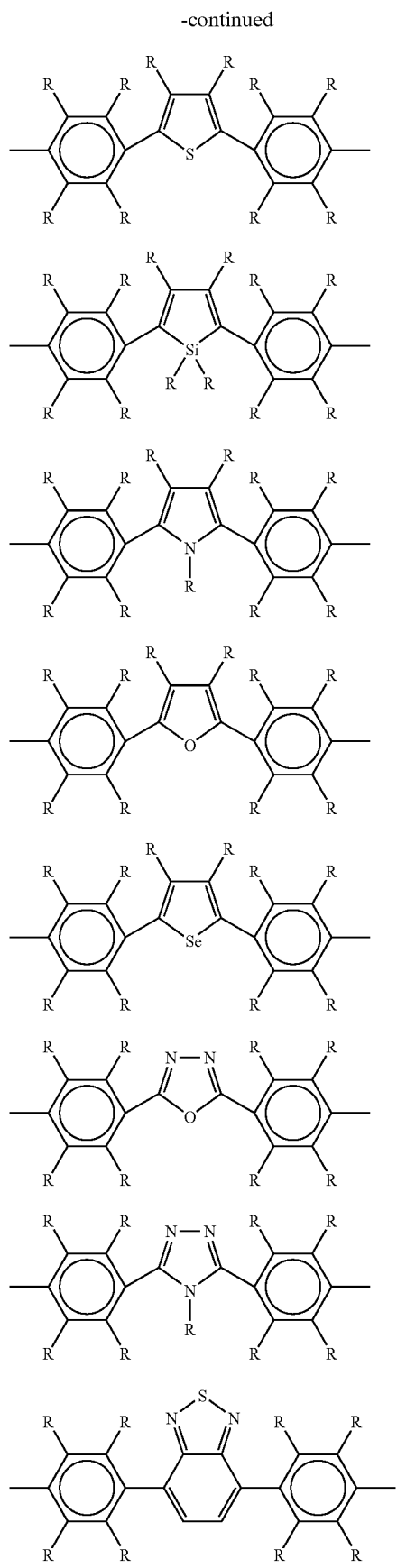
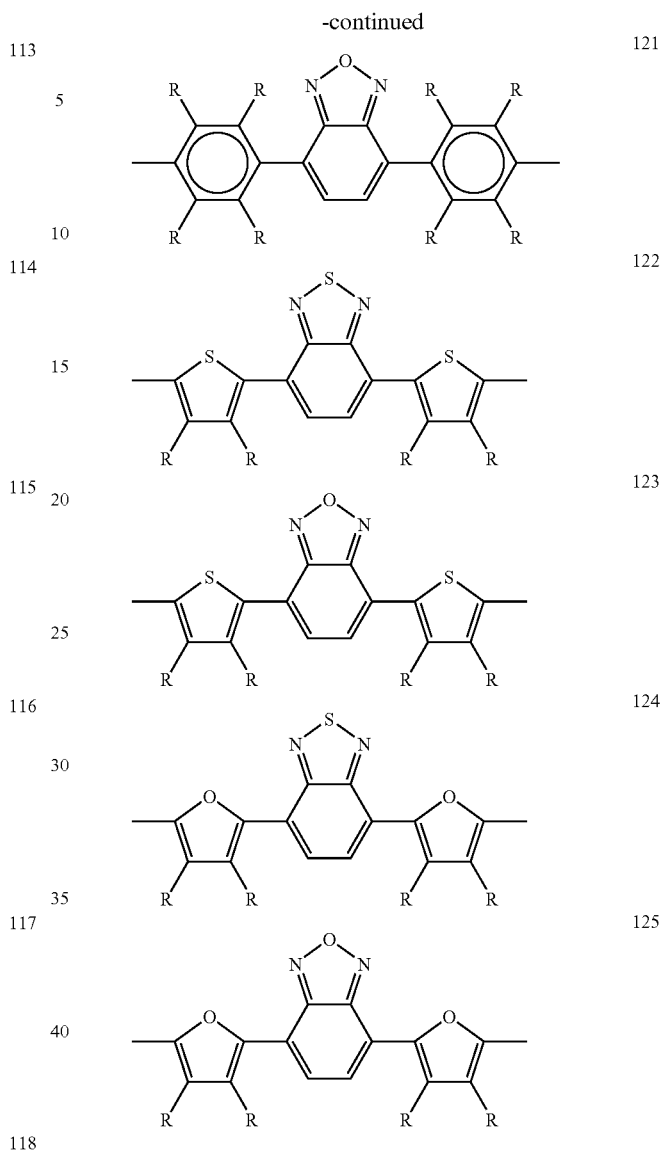

The term "divalent group having a metal complex structure" means a divalent group derived from a metal complex having an organic ligand by removal of two hydrogen atoms on the ligand.

In metal complexes having an organic ligand, the number of carbons that each of the organic ligands has is usually about 4 to 60. Examples of such organic ligands include 8-quinolinol and the derivatives thereof, benzoquinolinol and the derivatives thereof, 2-phenyl-pyridine and the derivatives thereof, 2-phenyl-benzothiazole and the derivatives thereof, 2-phenyl-benzoxazole and the derivatives thereof, and porphine and the derivatives thereof.

Examples of central metal atoms of metal complexes having an organic ligand include aluminum, zinc, beryllium, iridium, platinum, gold, europium and terbium.

Examples of metal complexes having an organic ligand include those known as low-molecule fluorescent materials or phosphorescent materials and so-called triplet luminescent complexes.

Examples of divalent groups having a metal complex structure include the following groups (formulae 126 to 132).

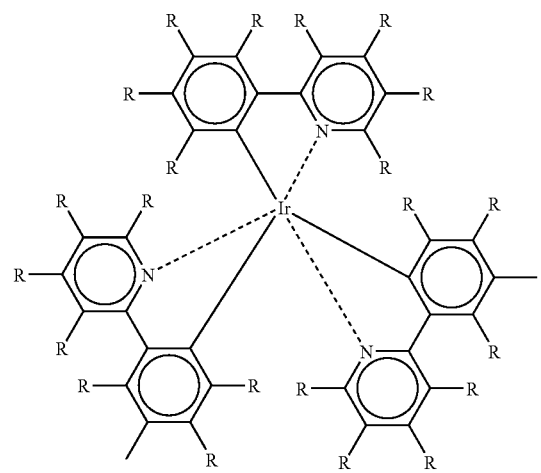
126
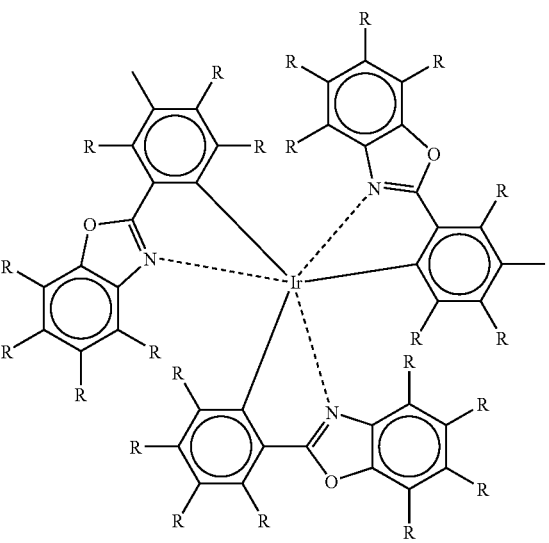
129
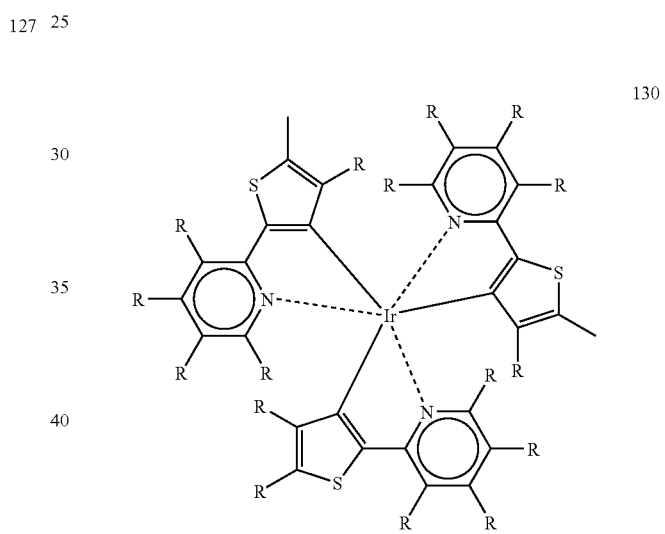
130
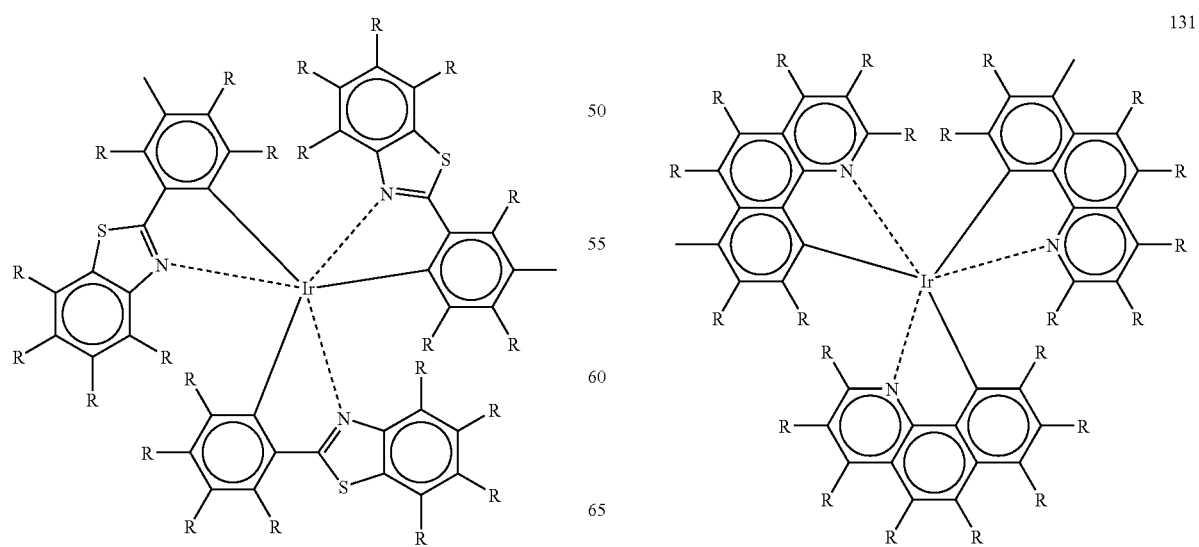
127
128
131

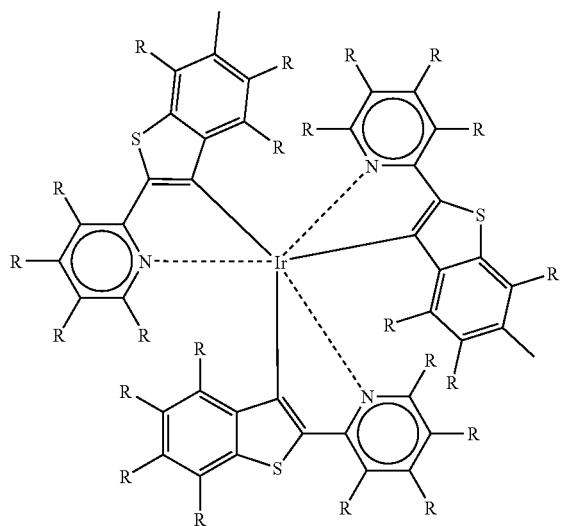

132

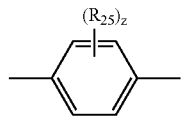

(8)

In the above formula, $R_{25}$ represents an alkyl, alkoxy, alkylthio, aryl, aryloxy, arylthio, arylalkyl, arylalkoxy, arylalkylthio, arylalkenyl, arylalkynyl, amino, substituted amino, silyl, substituted silyl, silyloxy or substituted silyloxy group, or a halogen atom, or an acyl, acyloxy, imino, amide, imide, monovalent heterocyclic, carboxyl, substituted carboxyl or cyano group; and z represents an integer of 0 to 4. When more than one group or atom $R_{25}$ exist, they may be the same or different.

Specific examples of the repeating units represented by the formula (8) are as follows.

In the above described formulae 1 to 132 and G to O, R each independently represents a hydrogen atom, or an alkyl, alkoxy, alkylthio, aryl, aryloxy, arylthio, arylalkyl, arylalkoxy, arylalkylthio, arylalkenyl, arylalkynyl, amino, substituted amino, silyl, substituted silyl, silyloxy or substituted silyloxy group, or a halogen atom, or an acyl, acyloxy, imino, amide, imide, monovalent heterocyclic, carboxyl, substituted carboxyl or cyano group.

Although a single structural formula has a plurality of Rs in the above described examples, they may represent the same group or atom or different groups or atoms. To increase the solubility of the polymer in a solvent, it is preferable that at least one of the Rs in a single structural formula is other than hydrogen, and besides the shape of repeating units, including their substituents, does not have a large degree of symmetry. It is also preferable that one or more of the Rs in a single structural formula are groups that contain a straight-chain alkyl group or a cyclic or branched-chain alkyl group having 3 or more carbon atoms. A plurality of Rs may be linked together to form a ring.

In the substituents of the above described formulae in which at least one R contains an alkyl group, the alkyl group may be a straight-chain, branched-chain or cyclic alkyl group, or a combination thereof. When the alkyl group is not a straight-chain one, it may be an isoamyl, 2-ethylhexyl, 3,7-dimethyloctyl, cyclohexyl or 4-(C1–C12)-alkylcyclohexyl group.

Further, the methyl or methylene group of the alkyl group contained in at least one R of the substituents may be replaced by a methyl or methylene group substituted by a heteroatom or one or more fluorine atoms. Examples of such heteroatoms include oxygen, sulfur and nitrogen atoms.

When the R includes an aryl or heterocyclic group as its part, the aryl or heterocyclic group may further include one or more substituents.

Of the repeating units, other than those represented by the formula (1), which the polymer of this invention may contain, those represented by the above formulae (4) and (5) are more preferable.

Of the repeating units represented by the above formula (4), those represented by the following formula (8), (9), (10), (11), (12) or (13) are preferable.

(9)

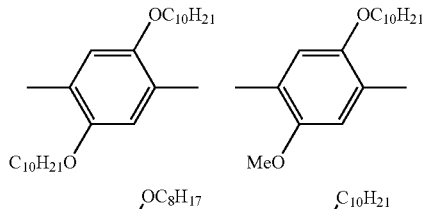

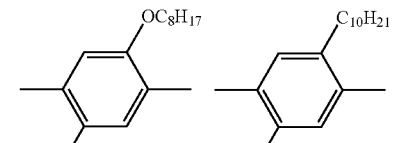

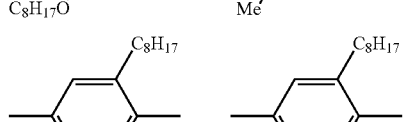

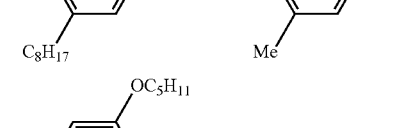

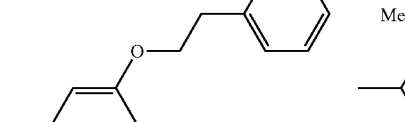

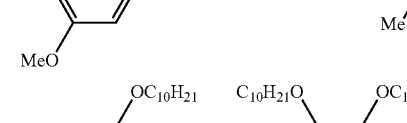

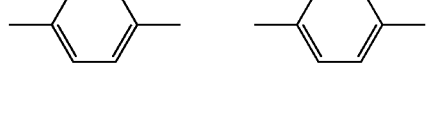

-continued

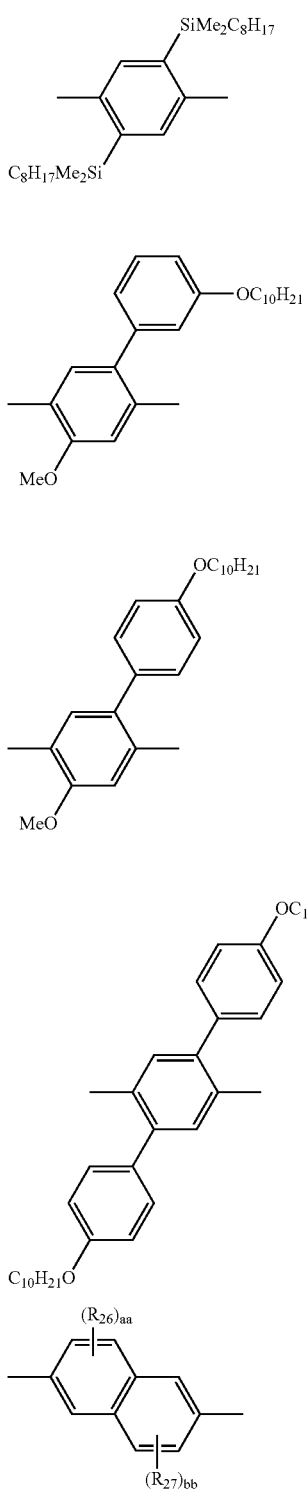

In the above formula, $R_{26}$ and $R_{27}$ each independently represent the same group as the $R_{25}$ in the formula (8); and aa and bb each independently represent an integer of 0 to 3. When more than one group or atom $R_{26}$ and more than one group or atom $R_{27}$ exist, they may be the same or different.

Specific examples of the repeating units represented by the formula (9) are as follows.

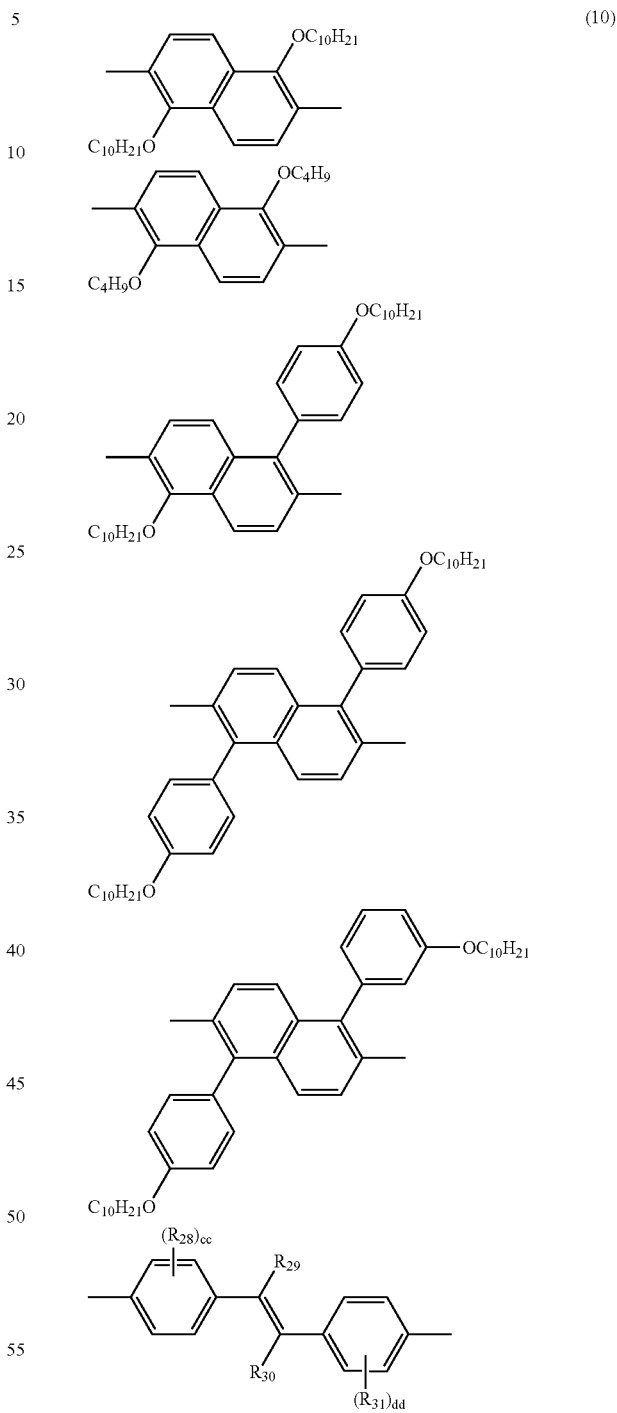

In the above formula, $R_{28}$ and $R_{31}$ each independently represent the same group as the $R_{25}$ in the formula (8); cc and dd each independently represent an integer of 0 to 4; and $R_{29}$ and $R_{30}$ each independently represent a hydrogen atom, or an alkyl, aryl, monovalent heterocyclic, carboxyl, substituted carboxyl or cyano group. When more than one atom or group $R_{28}$ and more than one atom or group $R_{31}$ exist, they may be the same or different.

Specific examples of the repeating units represented by the formula (10) are as follows.
(11)
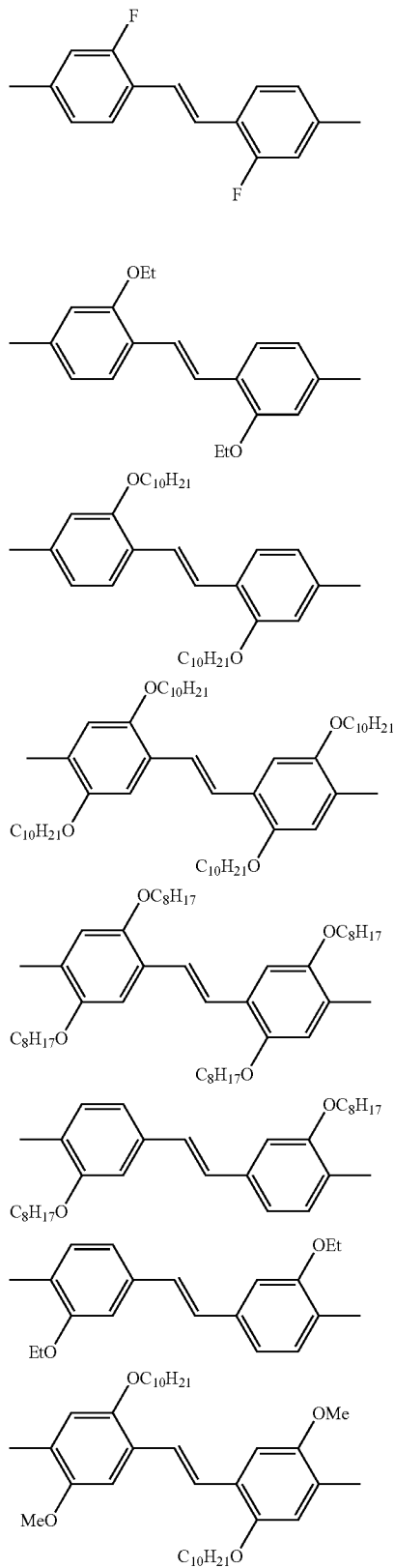
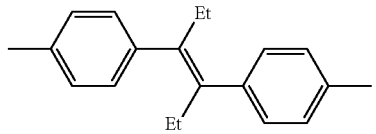
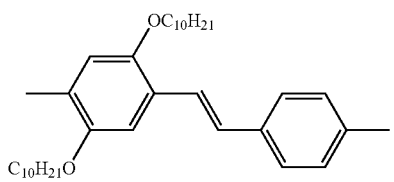
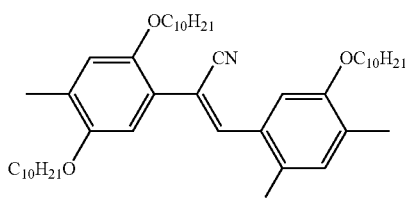
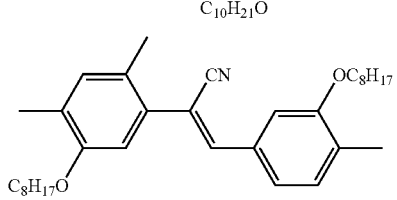
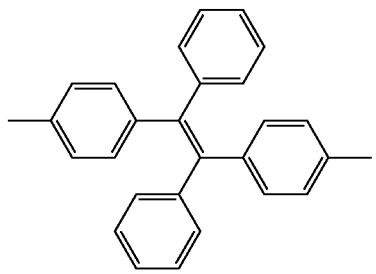
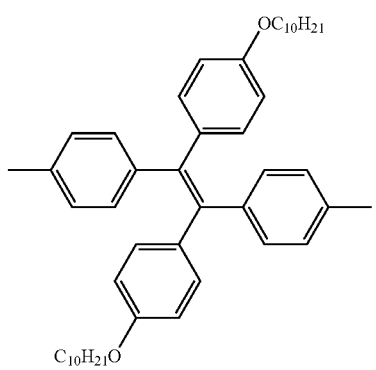
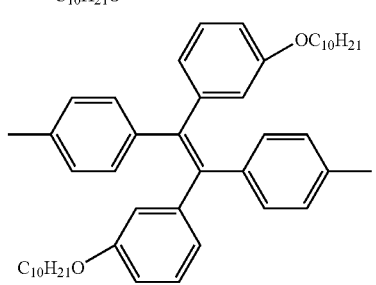

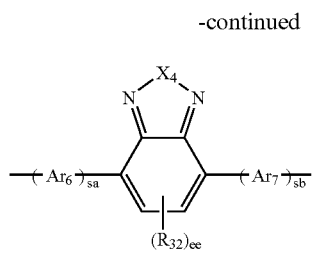
(11)

In the above formula, $R_{32}$ represents an alkyl, alkoxy, alkylthio, aryl, aryloxy, arylthio, arylalkyl, arylalkoxy, arylalkylthio, arylalkenyl, arylalkynyl, amino, substituted amino, silyl or substituted silyl group, or a halogen atom, or an acyl, acyloxy, imino, amide, imide, monovalent heterocyclic, carboxyl, substituted carboxyl or cyano group; ee represents an integer of 0 to 2; $Ar_6$ and $Ar_7$ each independently represent an arylene group, a divalent heterocyclic group or a divalent group having a metal complex structure; sa and sb each independently represent 0 or 1; and $X_4$ represents O, S, SO, $SO_2$, Se or Te. When more than one group or atom $R_{32}$ exist, they may be the same or different.

Specific examples of the repeating units represented by the formula (11) are as follows.

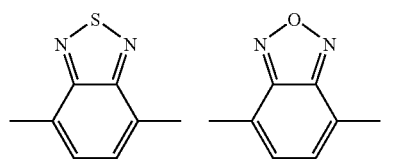
(12)

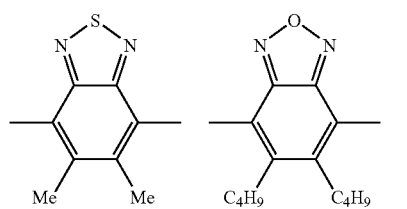

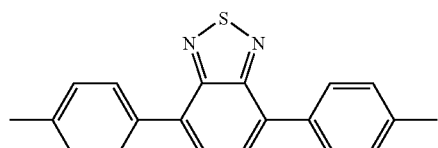

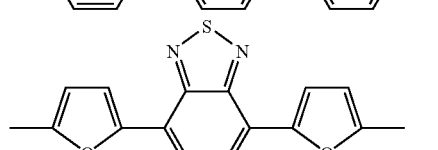

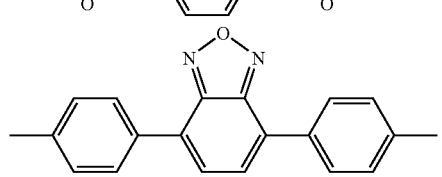

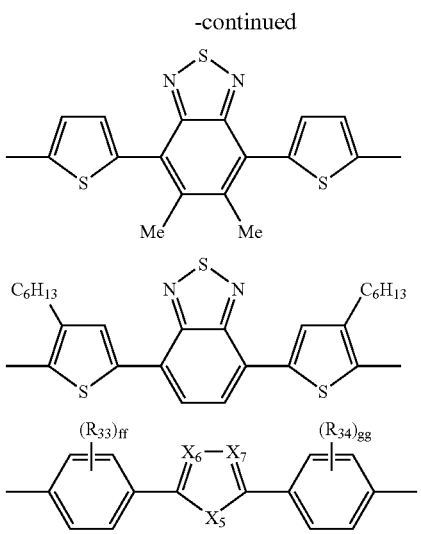

In the above formula, $R_{33}$ and $R_{34}$ each independently represent the same group as the $R_{25}$ in the formula (8); ff and gg each independently represent an integer of 0 to 4; $X_5$ represents O, S, SO, $SO_2$, Se, Te, N—$R_{35}$ or $SiR_{36}R_{37}$; $X_6$ and $X_7$ each independently represent N or C—$R_{38}$; and $R_{35}$, $R_{36}$, $R_{37}$ and $R_{38}$ each independently represent a hydrogen atom, or an alkyl, aryl, arylalkyl or monovalent heterocyclic group. When more than one atom or group $R_{33}$ and more than one atom or group $R_{34}$ exist, they may be the same or different.

Examples of the central five-membered rings in the repeating units represented by the formula (12) include thiadiazole, oxadiazole, triazole, thiophene, furan and silole.

Specific examples of the repeating units represented by the formula (12) are as follows.

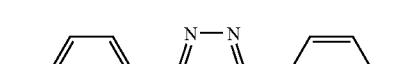
(13)

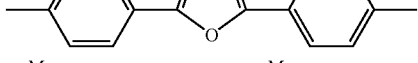

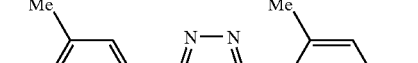

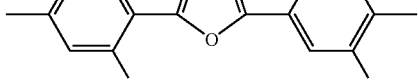

-continued

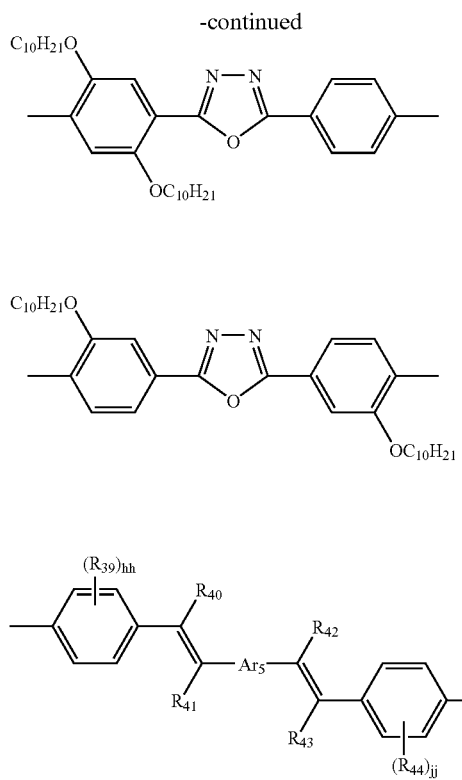

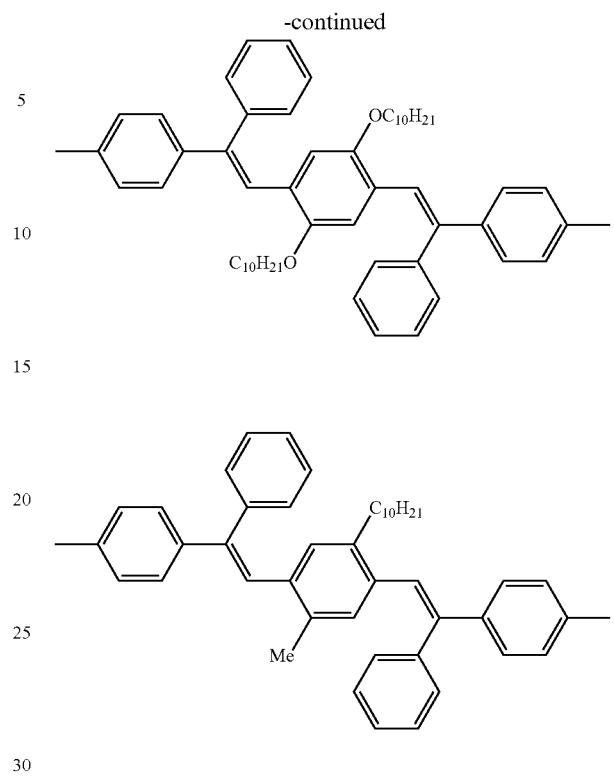

In the above formula, $R_{39}$ and $R_{44}$ each independently represent the same group as the $R_{25}$ in the formula (8); hh and jj each independently represent an integer of 0 to 4; $R_{40}$, $R_{41}$, $R_{42}$ and $R_{43}$ each independently represent the same group as the $R_{29}$ in the formula (10); and $Ar_5$ represents an arylene group, a divalent heterocyclic group or a divalent group having a metal complex structure. When more than one atom or group $R_{39}$ and more than one atom or group $R_{44}$ exist, they may be the same or different.

Specific examples of the repeating units represented by the formula (13) are as follows.

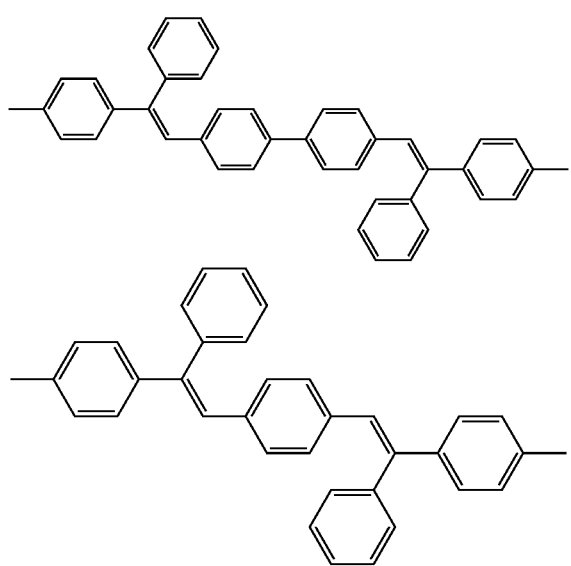

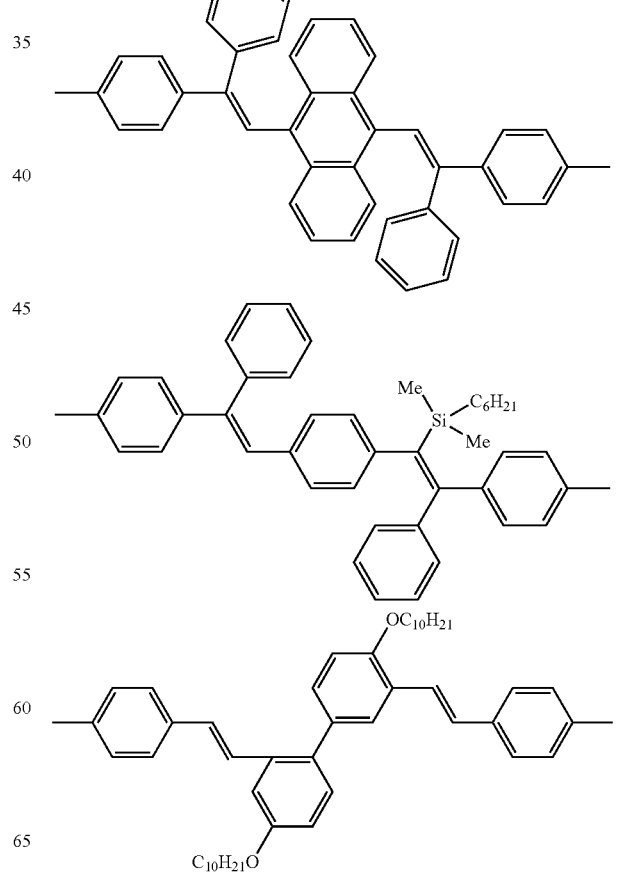

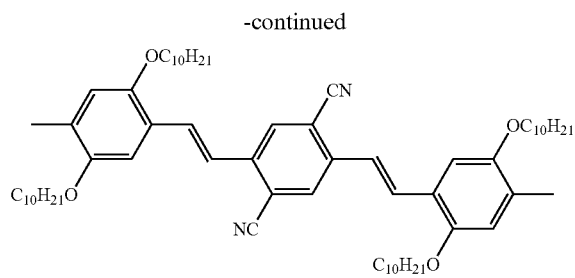

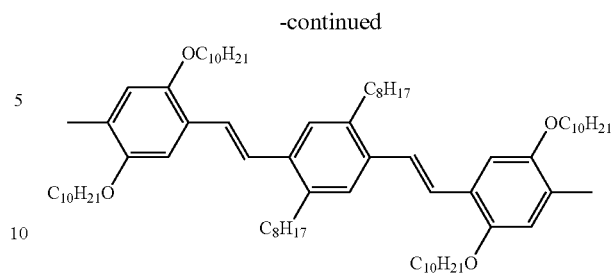

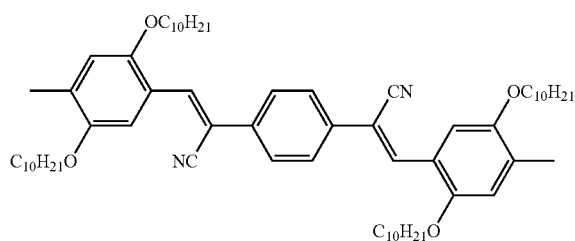

Of the repeating units represented by the above described formula (5), those represented by the following formula (14) are preferable.

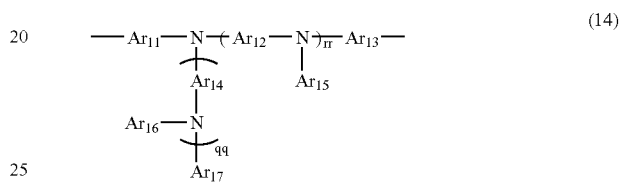

(14)

In the above formula, $Ar_{11}$, $Ar_{12}$, $Ar_{13}$ and $Ar_{14}$ each independently represent an arylene or divalent heterocyclic group; $Ar_{15}$, $Ar_{16}$ and $Ar_{17}$ each independently represent an aryl or monovalent heterocyclic group; and qq and rr each independently represent 0 or 1, wherein $0 \leq qq+rr \leq 1$.

Specific examples of the repeating units represented by the above described formula (14) are as follows (formulae 133 to 140).

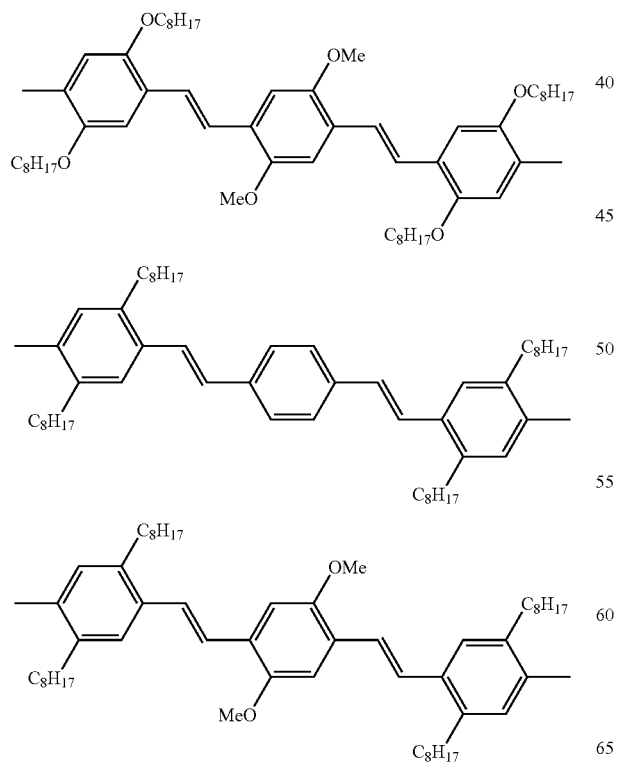

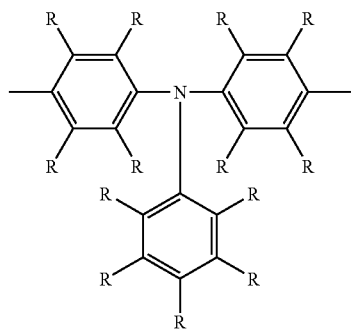

133

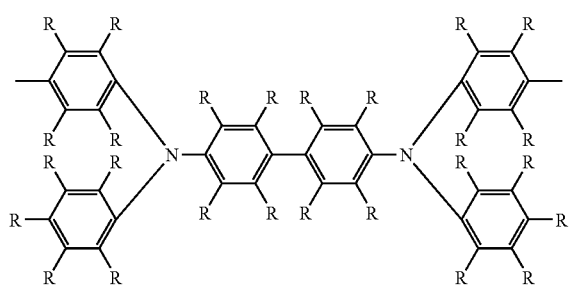

134

135

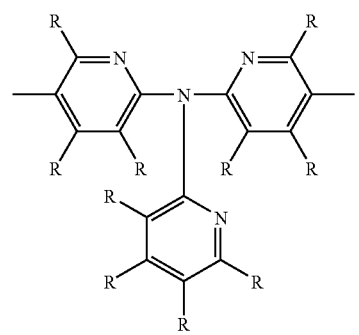

136

137

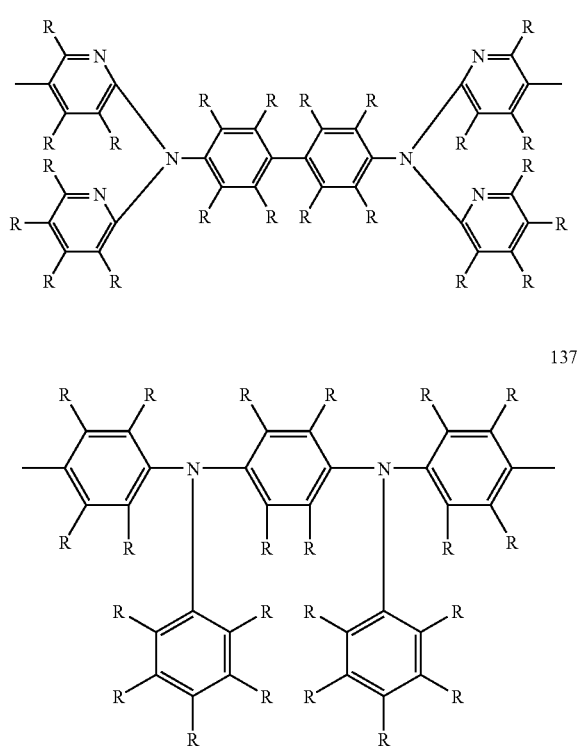

138

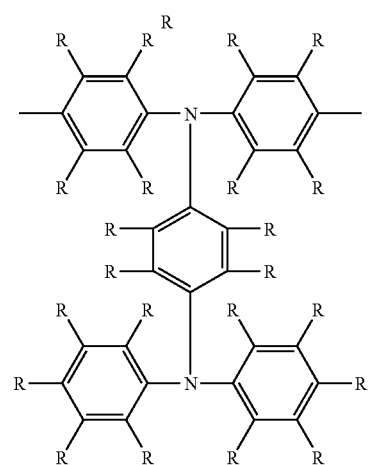

139

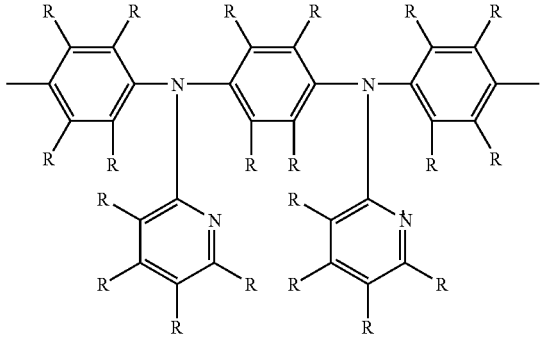

140

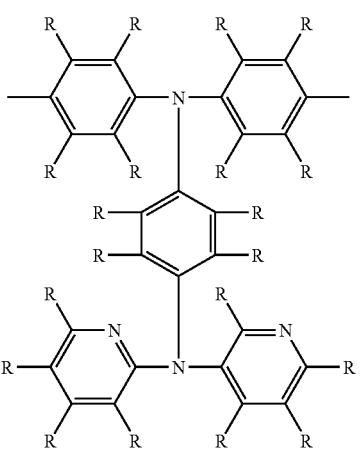

In the above formulae, R represents the same as that in the above described formulae 1 to 132 and J to O.

Of the repeating units, other than those represented by the formula (1), which are represented by the formulae (8), (9), (10), (11), (12), (13) and (14), those represented by the formula (14) is more preferable. The repeating units represented by the following formula (14-2) are particularly preferable.

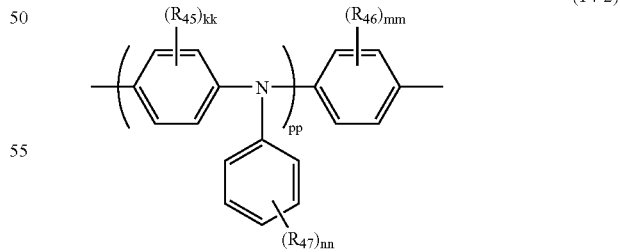

(14-2)

In the above formula, $R_{45}$, $R_{46}$ and $R_{47}$ each independently represent an alkyl, alkoxy, alkylthio, aryl, aryloxy, arylthio, arylalkyl, arylalkoxy, arylalkylthio, arylalkenyl, arylalkynyl, amino, substituted amino, silyl, substituted silyl, silyloxy or substituted silyloxy group, or a halogen atom, or an acyl, acyloxy, imino, amide, imide, monovalent heterocyclic, carboxyl, substituted carboxyl or cyano group; kk and mm each independently represent an integer of 0 to 4; pp represents an integer of 1 to 2; and nn represents an integer of 0 to 5. When more than one atom or group $R_{45}$, more than one atom or group $R_{46}$ and more than one atom or group $R_{47}$ exist, they may be the same or different.

The polymer may also include repeating units other than those represented by formulae (1) to (14) as long as they do not impair the fluorescence characteristics or charge transport characteristics of the polymer. The repeating units represented by the formulae (1) to (14) or other repeating units may be linked together by non-conjugated units. Alternatively, the repeating units may include such non-conjugated portions. Examples of the bond-structures include those shown below and combinations of two or more of the same. R in the bond-structures represents a group selected from the group consisting of the same substituents as those described above in connection with R and Ar represents a hydrocarbon group having 6 to 60 carbons.

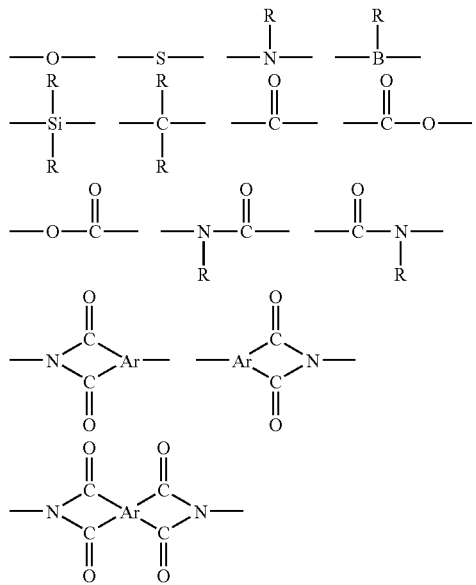

The polymer of this invention may be a random, block or graft copolymer. Alternatively, it may be a polymer having a structure somewhere between random, block and graft copolymers; for example, it may be a random copolymer which assumes characteristics of a block copolymer. From the viewpoint of obtaining a light emitting polymer (a light emitting material having a high-molecular-weight) that provides fluorescence or phosphorescence in high quantum yields, a random copolymer assuming characteristics of a block copolymer, or a block or graft copolymer is preferable compared with a perfect random copolymer. Such copolymers include: those having chain branching on their backbones and 3 or more terminals; and dendrimers.

The end groups of the polymer of this invention may be protected with a stable protective group, because if polymerization activating groups remain in the polymer, the luminescence characteristics or life of the element formed of the polymer may be reduced. Preferable protective groups are those having a conjugated bond continuous with the conjugated structure of the polymer's backbone, for example, structures combining with an aryl or heterocyclic group via a carbon-carbon bond. Specific examples of such groups include substituents described in Formula 10 in JP-A-9-45478.

The number average molecular weight, in terms of polystyrene, of the polymer of this invention is $10^3$ to $10^8$ and preferably $5 \times 10^3$ to $10^6$.

Good solvents for the polymer of this invention include, for example, chloroform, methylene chloride, dichloroethane, tetrahydrofuran, toluene, xylene, mesitylene, tetralin, decalin and n-butylbenzene. Normally, 0.1% by weight or more of the polymer of this invention can be dissolved in such solvents, though its depends on the structure or molecular weight of the polymer.

Now, methods for producing the polymer of this invention will be described.

The polymer of this invention can be produced by subjecting a compound represented by the following formula (15), as one of its raw materials, to condensation polymerization.

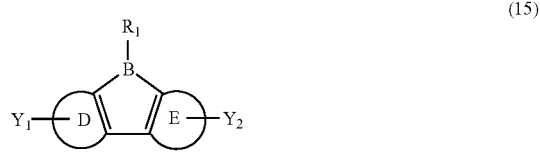

(15)

In the above formula, rings D, E and R1 each represent the same as described above. Y1 and Y2 each independently represent substituents that take part in the condensation polymerization.

Examples of substituents that take part in the condensation polymerization include halogen atoms, and alkylsulfonate, arylsulfonate, arylalkylsulfonate, borate ester, methyl sulfonium, methyl phophonium, methyl phosphonate, methyl halide, boric acid, formyl, cyanomethyl and vinyl groups.

Alkylsulfonate groups include, for example, methanesulfonate, ethanesulfonate and trifluoromethanesulfonate groups. Arylsulfonate groups include, for example, benzenesulfonate and p-toluenesulfonate groups. And arylalkylsulfonate groups include, for example, benzylsulfonate group.

Borate ester groups include, for example, groups represented by the following formulae.

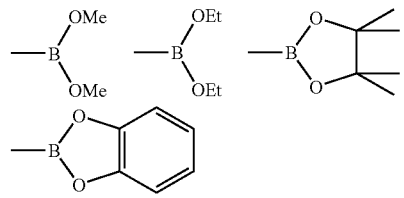

In the above formulae, Me represents a methyl group and Et an ethyl group.

Methyl sulfonium groups include, for example, groups represented by the following formulae.

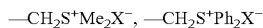

In the above formulae, X represents a halogen atom and Ph a phenyl group.

Methyl phosphonium groups include, for example, groups represented by the following formula.

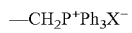
—CH$_2$P$^+$Ph$_3$X$^-$

In the above formula, X represents a halogen atom.

Methyl phosphonate groups include, for example, groups represented by the following formula.

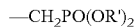
—CH$_2$PO(OR')$_2$

In the above formula, R' an alkyl, aryl or arylalkyl group.

Methyl monohalide groups include, for example, methyl fluoride, methyl chloride, methyl bromide and methyl iodide groups.

Preferred substituents that take part in the condensation polymerization reaction vary depending on the type of the polymerization reaction; however, when the reaction is the Yamamoto coupling reaction or the like which uses a zerovalent nickel complex, preferred substituents include, for example, halogen, alkylsulfonate, arylsulfonate and arylalkylsulfonate groups. When the reaction is the Suzuki coupling reaction or the like which uses a nickel or palladium catalyst, preferred substituents include, for example, halogen, borate ester and boric acid groups.

When the polymer of this invention further has repeating units other than those represented by the formula (1), the condensation polymerization can be carried out in the presence of a compound which has two substituents that take part in condensation polymerization and is to be the repeating units other than those represented by the formula (1).

Examples of compounds which have substituents that take part in condensation reaction and are to be repeating units other than those represented by the formula (1) include compounds represented by the formulae (16) to (19) below.

Subjecting not only the compound represented by the above described formula (15) but also a compound represented by any one of the following formulae (16) to (19) to condensation polymerization makes it possible to produce a polymer that has not only the repeating units represented by the formula (1) but also one or more kinds of repeating units represented by the formula (4), (5), (6) or (7).

Y$_3$—Ar$_1$—Y$_4$                                  (16)

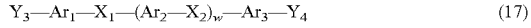
Y$_3$—Ar$_1$—X$_1$—(Ar$_2$—X$_2$)$_w$—Ar$_3$—Y$_4$            (17)

Y$_3$—Ar$_1$—X$_2$—Y$_4$                              (18)

Y$_3$—X$_2$—Y$_4$                                   (19)

In the above formulae, Ar$_1$, Ar$_2$, Ar$_3$, X$_1$ and X$_2$ each represent the same as above. Y$_3$ and Y$_4$ each independently represent a substituent that takes part in the condensation polymerization.

In a method for producing the polymer of this invention, any known condensation reaction can be used as the condensation polymerization reaction, depending on the substituents of the above compounds (15) to (19) that take part in the condensation polymerization reaction.

Methods for producing the polymer of this invention include: for example, polymerization of applicable monomers by the Suzuki coupling reaction or the like which uses a nickel or palladium catalyst; polymerization of applicable monomers by the Grignard reaction; polymerization of applicable monomers by the Yamamoto coupling reaction or the like which uses a zerovalent nickel complex; polymerization of applicable monomers using an oxidant such as FeCl$_3$; electrochemical oxidative polymerization of applicable monomers; and decomposition of an intermediate polymer having an appropriate leaving group.

Methods in which condensation polymerization produces double bonds in the polymer of this invention include, for example, those described in JP-A-5-202355. Specifically, they include: polymerization of a compound having a formyl group and a compound having a methyl phosphonium group by the Wittig reaction; polymerization of a compound having both formyl group and methyl phosphonium group by the Wittig reaction; polymerization of a compound having a vinyl group and a compound having a halogen atom by the Heck reaction; polycondensation of a compound having two or more methyl monohalide groups by dehydrohalogenation; polycondensation of a compound having two or more methyl sulfonium groups by sulfonium salt decomposition; polymerization of a compound having a formyl group and a compound having a cyanomethyl group by the Knoevenagel reaction; and polymerization of a compound having two or more formyl groups by the McMurry reaction.

Methods in which condensation polymerization produces triple bonds in the backbone of the polymer of this invention include, for example, those using the Heck reaction or the Sonogashira reaction.

Methods in which condensation polymerization produces neither double bonds nor triple bonds in the polymer of this invention include: for example, polymerization of applicable monomers by the Suzuki coupling reaction; polymerization of applicable monomers by the Grignard reaction; polymerization of applicable monomers using a Ni (0) complex; polymerization of applicable monomers using an oxidant such as FeCl$_3$; electrochemical oxidative polymerization of applicable monomers; and decomposition of an intermediate polymer having an appropriate leaving group.

Of these methods, polymerization by the Suzuki coupling reaction which uses a nickel or palladium catalyst, polymerization by the Grignard reaction, polymerization by the Yamamoto coupling reaction which uses a zerovalent nickel complex, polymerization by the Wittig reaction, polymerization by the Heck reaction, polymerization by the Sonogashira reaction and polymerization of the Knoevenagel reaction are preferable because of ease of structural control.

The reaction conditions will be described in further detail.

In the Wittig, Horner and Knoevenagel reactions, the reactions are carried out using the equivalent or more of, preferably one to three equivalents of alkali to the functional groups of the compounds used. Alkalies used include, but not limited to, the following: metal alcholates such as potassium t-butoxide, sodium t-butoxide, sodium ethylate and lithium methylate; hydride reagents such as sodium hydride; and amides such as sodium amide. Solvents used include, for example, N,N-dimethylformamide, tetrahydrofuran, dioxane and toluene. Usually the reactions are allowed to progress at room temperature to about 150° C. The reaction time is, for example, 5 minutes to 40 hours; however, it may be any time as long as the reactions fully progress. Preferably it is 10 minutes to 24 hours, because the polymerization products need not be left for a long time after the termination of the reactions. The concentration of the compounds used is properly selected from the range of about 0.01% by weight to the maximum concentration to which the compounds are dissolved. If the concentration is too low, the reaction is made less efficient, whereas it is too high, the reaction is difficult to control. Usually the concentration is in the range of 0.1% by weight to 30% by weight. The details of the Witting reaction are described in, for example,

*Organic Reactions*, Vol. 14, 270–490, John Wiley & Sons, Inc., 1965. The details of the Knoevenagel, Wittig and dehydrohalogenation reactions are described in *Makromol. Chem., Macromol. Symp.*, Vol. 12, 229, 1987.

In the Heck reaction, monomers are allowed to react in the presence of triethylamine with a palladium catalyst. A solvent with a relatively high boiling point, such as N,N-dimethylformamide or N-methylpyrrolidone, is used. The reaction temperature is about 80 to 160° C. and the reaction time is about 1 hour to 100 hours. The details of the Heck reaction are described in, for example, *Polymer*, Vol. 39, 5241–5244, 1998.

In the Sonogashira reaction, usually monomers are allowed to react in the presence of a base, such as triethylamine, with a palladium catalyst and cuprous iodide in N,N-dimethylformamide, an amine solvent or ether solvent. Usually the reaction temperature is about −50 to 120° C. and the reaction time is about 1 hour to 100 hours, though they depend on the reaction conditions or the reactivity of the polymerizable substituents of the monomers. The details of the Sonogashira reaction are described in, for example, *Tetrahedron Letters*, Vol. 40, 3347–3350, 1999 and *Tetrahedron Letters*, Vol. 16, 4467–4470, 1975.

In the Suzuki reaction, monomers are allowed to react by adding the equivalent or more of, preferably 1 to 10 equivalents of an inorganic base such as potassium carbonate, sodium carbonate or barium hydroxide, an organic base such as triethylamine, or an inorganic salt such as cesium fluoride to the monomers and using palladium(tetrakis(triphenylphosphine)) or palladium acetate as a catalyst. The reaction may be carried out in a two-phase system by using the inorganic salt in an aqueous solution form. Solvents used include, for example, N,N-dimethylformamide, toluene, dimethoxyethane and tetrahydrofuran. The suitable reaction temperature is about 50 to 160° C., though it depends on the solvent used. The temperature may be raised to near the boiling point of the solvent, followed by reflux. The reaction time is about 1 to 200 hours.

The details of the Suzuki reaction are described in, for example, *Chem. Rev.*, Vol. 95, 2457, 1995.

Methods which use a zerovalent nickel complex will be described. The methods are divided into two types: one type is to use a zerovalent nickel complex; and the other is to react a nickel salt in the presence of a reductant to produce zerovalent nickel in the system and to react the same.

Zerovalent nickel complexes used include, for example, bis(1,5-Cyclooctadiene)nickel(0), (ethylene)bis(triphenylphosphine)nickel(0) and tetrakis(triphenylphosphine)nickel. Of these zerovalent nickel complexes, bis(1,5-Cyclooctadiene)nickel(0) is preferable from the viewpoint of general-purpose properties and low cost.

From the viewpoint of better yield, it is preferable to add a neutral ligand.

The term "a neutral ligand" means a ligand that has neither anion nor cation. Examples of neutral ligands include: nitrogen-containing ligands such as 2,2'-bipyridyl, 1,10-phenanthroline, methylenebisoxazoline and N,N'-tetramethylethylenediamine; and tertiary phosphine ligands such as triphenylphosphine, tritolylphosphine, tributylphosphine and triphenoxyphosphine. From the viewpoint of general-purpose properties and low cost, nitrogen-containing ligands are preferable, and from the viewpoint of high reactivity and high yield, 2,2'-bipyridyl is particularly preferable. From the viewpoint of better yield of polymer, a system is particularly preferable which is obtained by adding 2,2'-bipyridyl, as a neutral ligand, to a system containing bis(1,5-Cyclooctadiene)nickel(0). Nickel salts used in the methods in which zerovalent nickel is reacted in a system include, for example, nickel chloride and nickel acetate. Reductants used include, for example, zinc, sodium hydride, hydrazine and the derivatives thereof, and lithium aluminum hydride. If necessary, ammonium iodide, lithium iodide or potassium iodide is used as an additive.

Of the production methods of this invention, a method is preferable in which $Y_1$, $Y_2$, $Y_3$ and $Y_4$ each independently represent a halogen atom, or an alkylsulfonate, arylsulfonate or arylalkylsulfonate group and condensation polymerization is carried out in the presence of a zerovalent nickel complex.

In this case, raw material compounds used include, for example, dihalide compounds, bis(alkylsulfonate) compounds, bis(arylsulfonate) compounds, bis(arylalkylsulfonate) compounds, halogen-alkylsulfonate compounds, halogen-arylsulfonate compounds, halogen-arylalkylsulfonate compounds, alkylsulfonate-arylsulfonate compounds, alkylsulfonate-arylalkylsulfonate compounds and arylsulfonate-arylalkylsulfonate compounds.

Of the production methods of this invention, a method is preferable in which $Y_1$, $Y_2$, $Y_3$ and $Y_4$ each independently represent a halogen atom, or an alkylsulfonate, arylsulfonate, arylalkylsulfonate, boric acid or borate ester group, the ratio of the total mole number (J) of the halogen, alkylsulfonate, arylsulfonate and arylalkylsulfonate groups to that (K) of the boric acid and borate ester groups is substantially 1 (usually K/J is in the range of 0.7 to 1.2), and the condensation polymerization is carried out using a nickel or palladium catalyst.

In this case, specific examples of combinations of the raw material compounds used include those of any one selected from the group consisting of dihalide compounds, bis(alkylsulfonate) compounds, bis(arylsulfonate) compounds and bis(arylalkylsulfonate) compounds and any one selected from the group consisting of diboric acid compounds and diborate ester compounds. Alternatively, any one of halogeno-boric acid compounds, halogeno-borate ester compounds, alkylsulfonate-boric acid compounds, alkylsulfonate-borate ester compounds, arylsulfonate-boric acid compounds, arylsulfonate-borate ester compounds, arylalkylsulfonate-boric acid compounds or arylalkylsulfonate-borate ester compounds is used alone as starting compound.

Generally, it is preferable to subject the organic solvent used in the production of the polymer of this invention to deoxygenation treatment and allow the reaction to progress in an inert atmosphere to suppress side reactions, though it depends on the compound and reaction used. It is also preferable to subject the solvent used to dehydration treatment. However, this does not necessarily apply to the reactions in a two-phase system: a solvent-water system, such as the Suzuki coupling reaction.

To allow the polymerization reaction to progress, an alkali or an appropriate catalyst may also be added. Such an alkali or catalyst can be selected depending on the type of the reaction. Preferably, an alkali or catalyst is selected which is fully dissolved in the solvent used in the reaction. Methods for mixing an alkali or catalyst with a reaction solution include: for example, a method in which a solution of the alkali or catalyst is slowly added to the reaction solution with stirring in an inert atmosphere such as argon or nitrogen, and a method in which the reaction solution is slowly added to the solution of the alkali or catalyst.

The polymerization time is usually about 0.5 to 100 hours, though it depends on the type of polymerization. Preferably it is within 10 hours in view of production cost.

The polymerization temperature is usually about 0 to 200° C., though it depends on the type of polymerization. From the viewpoint of high yield and low heating cost, preferably it is in the range of 20 to 100° C.

When using the polymer of this invention in a polymeric LED, it is preferable to purify monomers to be used by means such as distillation, sublimation, recrystallization or column chromatography before polymerization, because the purity of the polymer affects the LED's performance such as luminescent characteristics. After polymerization, preferably the polymer undergoes purifying treatment by various operations including: separation in common use such as washing with an acid, washing with an alkali, neutralization, washing with water, washing with an organic solvent, reprecipitation, centrifugation, extraction, column chromatography or dialysis; purification; and drying.

Now, methods will be described for producing the compounds represented by the above described formula (15) which are used as the raw materials for the polymer of this invention.

Methods for producing the compounds represented by the above described formula (15) vary depending on the type of the substituents that take part in the condensation polymerization of the compounds. In a first type of methods, for example, the compounds can be produced by the reaction leading to the introduction of the substituents (Y1 and Y2) that take part in the condensation polymerization reaction into compounds represented by the following formula (20).

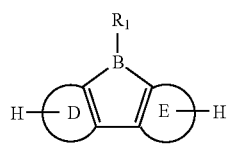

(20)

In the above formula, $R_1$ and rings D and E each represent the same as those in the above described formula (1).

Specific examples of the first type of methods include: a method in which the compounds represented by the above described formula (15) whose substituents that take part in the condensation polymerization reaction are formyl groups are synthesized by reacting the compounds represented by the above described formula (20) with a formylation reagent; a method in which the compounds represented by the above described formula (15) whose substituents that take part in the condensation polymerization reaction are monohalogenomethyl groups are synthesized by reducing the above formylated compounds and reacted the reduced compounds with a halognation reagent; and a method in which the compounds represented by the above described formula (15) whose substituents that take part in the condensation polymerization reaction are vinyl groups are synthesized by reacting the formyl groups of the above formylated compounds with the Wittig reagent or the Honer reagent.

The above first type of methods also include a method in which the compounds represented by the above described formula (15) whose substituents that take part in the condensation polymerization reaction are monohalogenomethyl groups are synthesized by reacting the compounds represented by the above described formula (20) with paraform and hydrogen halide.

Further, the above first type of methods also include a method in which the compounds represented by the above described formula (15) whose substituents that take part in the condensation polymerization reaction are halogen atoms are synthesized by reacting the compounds represented by the above described formula (20) with a halogenation reagent or by reacting the compounds represented by the above described formula (20) with a base, followed by reaction with a halogenation reagent.

Further, a method is also included in which the compounds represented by the above described formula (15) whose substituents that take part in the condensation polymerization reaction are boric acid groups or borate ester groups are synthesized by reacting the compounds represented by the above described formula (15) whose substituents that take part in the condensation polymerization reaction are halogen atoms with a base, followed by the reaction with a boric acid compound. Still further, a method is also included in which the compounds represented by the above described formula (15) whose substituents that take part in the condensation polymerization reaction are alkylsulfonate, arylsulfonate or arylalkylsulfonate groups are synthesized by decomposing with hydrogen peroxide or the like the boric acid groups of the compounds represented by the above described formula (15) whose substituents that take part in the condensation polymerization reaction are boric acid groups and subjecting the decomposed compounds to sulfonation.

In a second type of methods, the compounds represented by the above described formula (15) can be produced by reacting compounds having substituents that take part in condensation polymerization reaction and represented by the following formula (21) with a boron compound.

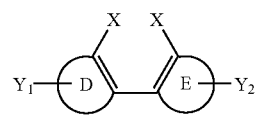

(21)

In the above formula, $Y_1$, $Y_2$, and rings D and E each represent the same as those in the above described formula (15). X is a halogen atom. When the rings D and E each have a halogen atom as a substituent or when either $Y_1$ or $Y_2$ is a halogen atom, the halogen atom represented by X is more reactive with a base or metal than the halogen atoms included in the rings D and E or represented by $Y_1$ or $Y_2$.

Specific examples of the second type of methods include a method in which the compounds represented by the above described formula (15) are produced by reacting compounds represented by the above formula (21) with a base, followed by the reaction with a boron compound represented by the following formula (22).

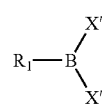

(22)

In the above formula, $R_1$ represents the same as that in the above described formula (1). X' represents a halogen atom or an alkoxy group.

Examples of halogenation reagents used in the production of the compounds represented by the above described formula (15) include: N-halogeno compounds such as N-chlorosuccinimide, N-chlorophthalimide, N-chlorodiethylamine, N-chlorodibutylamine, N-chlorocyclohexylamine, N-bromosuccinimide, N-bromophthalimide, N-bromoditrifluoromethylamine, N-iodosuccinimide and N-iodophthalimide; fluorine; fluoroxytrifuluoromethane; oxygen difluoride; perchloryl fluoride; cobalt fluoride (III); silver fluoride (II); selenium fluoride (IV); manganese fluoride (III); chlorine; iodotrichloride; aluminum trichloride; tellurium chloride (IV); molybdenum chloride; antimony chloride; iron chloride (III); titanium tetrachloride; phosphorus pentachloride; thionyl chloride; bromine; 1,2-dibromoethane; boron tribromide, copper bromide; silver bromide; t-butyl bromide, bromine oxide; iodine; and iodomonochloride.

Examples of bases used in the production of the compounds include: lithium hydride, sodium hydride, potassium hydride, methyllithium, n-butyllithium, t-butyllithium, phenyllithium, lithium diisopropylamide, lithium hexamethyldisilazide, sodium hexamethyldisilazide and potassium hexamethyldisilazide.

Examples of solvents used in the reaction include: saturated hydrocarbons such as pentane, hexane, heptane, octane and cyclohexane; unsaturated hydrocarbons such as benzene, toluene, ethylbenzene and xylene; saturated halogenated hydrocarbons such as carbon tetrachloride, chloroform, dichloromethane, chlorobutane, bromobutane, chloropentane, bromopentane, chlorohexane, bromohexane, chlorocyclohexane and bromocyclohexane; unsaturated halogenated hydrocarbons such as chlorobenzene, dichlorobenzene and trichlorobenzene; alcohols such as methanol, ethanol, propanol, isopropanol, butanol and t-butylalcohol; carboxylic acids such as formic acid, acetic acid and propionic acid; ethers such as dimethyl ether, diethyl ether, methyl-t-butylether, tetrahydrofuran, tetrahydropyran and dioxane; amines such as trimethylamine, triethylamine, N,N,N',N'-tetramethylethylenediamine and pyridine; and amides such as N,N-dimethylformamide, N,N-dimethylacetoamide, N,N-diethylacetoamide and N-methylmorpholine oxide. Any single solvent or mixed solvent of two or more selected from among these solvents can be used depending on the reaction.

The compounds represented by the above formula (15) can be obtained by conventional post-treatment, such as quenching with water, extraction with an organic solvent and evaporating of the solvent, after the reaction.

The isolation and purification of the products can be done by means of separation by chromatography or recrystallization.

The applications of the polymer of this invention will be described.

Normally the polymer of this invention fluorescences or phosphorescences in the solid state, and it can be used as a polymeric luminous body (a high-molecular-weight light-emitting material). A polymer LED using the polymeric luminous body is a high-performance polymeric LED that can be driven at low voltage and at high efficiency. Accordingly, such a polymeric LED can be suitably used for the backlight of liquid crystal displays, curved-surface or flat surface light sources, segment-type display devices, or units such as dot matrix flat panel displays.

The polymer of this invention can also be used as a laser dye, material for organic solar cells, organic semiconductor for organic transistor, material for conductive thin film such as conductive thin film and organic semiconductor thin film.

Further, the polymer of this invention can also be used as a material for light-emitting thin films that emit fluorescence or phosphorescence.

The polymeric LED of this invention will be described.

The polymeric LED of this invention is characterized in that it has an organic layer between electrodes: an anode and a cathode, which contains the polymer of this invention.

The organic layer may be a light-emitting layer, a hole transport layer or an electron transport layer; however, it is preferably a light-emitting layer.

The term "a light-emitting layer" means a layer having the function of emitting light, the term "a hole transport layer" means a layer having the function of transporting holes, and the term "an electron transport layer" means a layer having the function of transporting electrons. The electron transport layer and the hole transport layer are generically called charge transport layer. The polymeric LED may include tow or more of each of the light-emitting layer, hole transport layer and electron transport layer.

When the organic layer is a light-emitting layer, the light-emitting layer as an organic layer may further include a hole transport material, an electron transport material or a light-emitting material. The term "a light-emitting material" means a material that fluorescences and/or phosphorescences.

When mixing the polymer of this invention and a hole transport material, the hole transport material mixed constitutes 1% by weight to 80% by weight and preferably 5% by weight to 60% by weight of the entire mixture. When mixing the polymer of this invention and an electron transport material, the electron transport material mixed constitutes 1% by weight to 80% by weight and preferably 5% by weight to 60% by weight of the entire mixture. And when mixing the polymer of this invention and a light-emitting material, the light-emitting material mixed constitutes 1% by weight to 80% by weight and preferably 5% by weight to 60% by weight of the entire mixture. When mixing the polymer of this invention, a light-emitting material, and a hole transport material and/or an electron transport material, the fluorescent material mixed constitutes 1% by weight to 50% by weight and preferably 5% by weight to 40% by weight of the entire mixture, the sum of the hole transport material and the electron transport material mixed constitutes 1% by weight to 50% by weight and preferably 5% by weight to 40% by weight of the entire mixture, and the content of the polymer of this invention is 99% by weight to 20% by weight.

For the hole transport material, the electron transport material and the light-emitting material, a well-known low-molecular-weight compound or polymeric compound can be used; however, preferably a polymeric compound is used. Examples of the polymeric hole transporting, electron transporting and light-emitting materials include: polyfluorene and the derivatives and copolymers thereof; polyarylene and the derivatives and copolymers thereof; polyarylenevinylene and the derivatives and copolymers thereof; and (co)polymers of aromatic amines and their derivatives which are disclosed in, for example, WO 99/13692, WO 99/48160, GB2340304A, WO 00/53656, WO 01/19834, WO 00/55927, GB2348316, WO 00/46321, WO 00/06665, WO 99/54943, WO 99/54385, U.S. Pat. No. 5,777,070, WO 98/06773, WO 97/05184, WO 00/35987, WO 00/53655, WO 01/34722, WO 99/24526, WO 00/22027, WO 00/22026, WO 98/27136, U.S. Pat. No. 5,736,36, WO 98/21262, U.S. Pat. No. 5,741,921, WO 97/09394, WO 96/29356, WO 96/10617, EP0707020, WO 95/07955, JP-A-2001-181618, JP-A-2001-123156, JP-A-2001-3045, JP-A-2000-351967, JP-A-2000-303066, JP-A-2000-299189, JP-A-2000-252065, JP-A-2000-136379, JP-A-2000-

104057, JP-A-2000-80167, JP-A-10-324870, JP-A-10-114891, JP-A-9-111233 and JP-A-9-45478.

Examples of applicable low-molecular-weight light-emitting materials include: naphthalene derivatives; anthracene or the derivatives thereof; perylene or the derivatives thereof; dyes such as polymethine, xanthene, coumarin and cyanine; metal complexes of 8-hydroxyquinoline or the derivatives thereof; aromatic amines; tetraphenylcyclopentadiene or the derivatives thereof; or tetraphenylbutadiene or the derivatives thereof.

Specifically, well-known low-molecular-weight light-emitting materials such as those described in JP-A-57-51781 and JP-A-59-194393 can be used.

Examples of triplet luminous complexes include: Ir(ppy)$_3$ and Btp$_2$Ir(acac) with iridium as the central metal atom; PtOEP with platinum as the central metal atom; and Eu(TTA)3phen with europium as the central metal atom.

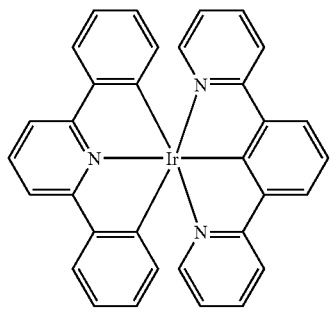

Ir(ppy)$_3$

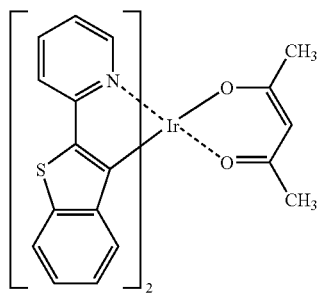

Btp2Ir(acac)

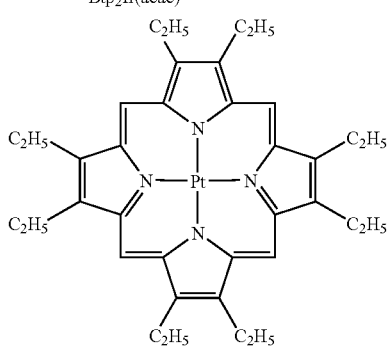

PtOEP

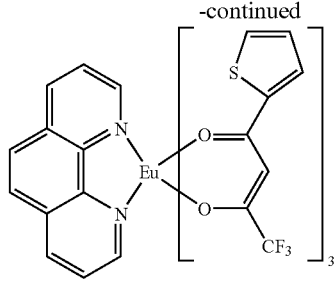

Eu(TTA)$_3$phen

Specific examples of triplet luminous complexes include those described in *Nature* (1998), 395, 151, *Appl. Phys. Lett.* (1999), 75(1), 4, *Proc. SPIE-Int. Soc. Opt. Eng.* (2001), 4105 (Organic Light-Emitting Materials and Devices IV), 119, *J. Am. Chem. Soc.* (2001), 123, 4304, *Appl. Phys. Lett.* (1997), 71(18), 2596, *Syn. Met.* (1998), 94(1), 103, *Syn. Met.* (1999), 99(2), 1361, *Adv. Mater.*, (1999), 11(10), 852, and *Jpn. J. Appl. Phys.* 34, 1883 (1995).

The composition of this invention contains: at least one kind of material selected from the group consisting of hole transport, electron transport and light-emitting materials; and the polymer of this invention. The composition can be used as a light-emitting material or an electron transport material.

The content ratio of at least one kind of material selected from the group consisting of hole transport, electron transport and light-emitting materials to the polymer of this invention can be determined depending on the application of the composition. However, when the composition is used as a light-emitting material, preferably the content ratio is the same as that of the above described light-emitting layer.

For the film thickness of the light-emitting layer the polymeric LED of this invention has, its optimum value varies depending on the material used, and therefore it can be selected so that the values of the driving voltage and luminous efficiency of the polymeric LED become proper ones. For example, the thickness is 1 nm to 1 μm, preferably 2 nm to 500 nm, and more preferably 5 nm to 200 nm.

Methods for forming the light-emitting layer include, for example, formation of the layer from a solution. Examples of such methods include coating methods such as spin coating, casting, micro gravure coating, gravure coating, bar coating, roll coating, wire bar coating, dip coating, spray coating, screen printing, flexographic printing, offset printing and ink-jet printing. Printing methods such as screen printing, flexographic printing, offset printing and ink-jet printing are preferable because they make pattern forming or multicolor coating easier.

The ink compositions used in printing methods may be any compositions as long as they contain at least one kind of polymer of this invention. They may also contain a hole transport material, an electron transport material, a light-emitting material, a solvent, or additives such as a stabilizer.

The polymer of this invention contained in the above ink composition constitutes 20% by weight to 100% by weight and preferably 40% by weight to 100% by weight of the entire ink composition excepting its solvent.

When the ink composition contains a solvent, the solvent constitutes 1% by weight to 99.9% by weight, preferably 60% by weight to 99.5% by weight and more preferably 80% by weight to 99.0% by weight of the entire composition.

Preferred viscosity of the ink composition varies depending on the printing method employed; however, when the method employed is ink-jet printing or the like in which the ink composition passes through an ink ejecting device, preferably the viscosity is in the range of 1 to 20 mPa·s at 25° C. to prevent the ink from clogging or losing straightness of droplet jetting on its ejection.

The solvents used in the ink composition may be any solvents; however, preferably they can uniformly dissolve or disperse the materials, other than the solvent, that constitute the ink composition. When the materials constituting the ink composition are soluble in non-polar solvents, such solvents include: for example, chlorine solvents such as chloroform, methylene chloride and dichloroethane; ether solvents such as tetrahydrofuran; aromatic hydrocarbon solvents such as toluene and xylene; ketone solvents such as acetone and methyl ethyl ketone; and ester solvents such as ethyl acetate, butyl acetate and ethyl cellosolve acetate.

The polymeric LEDs of this invention include: for example, a polymeric LED including an electron transport layer between the cathode and the light-emitting layer; a polymeric LED including a hole transport layer between the anode and the light-emitting layer; and a polymeric LED including an electron transport layer between the cathode and the light emitting layer and a hole transport layer between the anode and the light-emitting layer.

Specific examples of the polymeric LED structures include the following a) to d).

a) anode/light-emitting layer/cathode
b) anode/hole transport layer/light-emitting layer/cathode
c) anode/light-emitting layer/electron transport layer/cathode
d) anode/hole transport layer/light-emitting layer/electron transport layer/cathode (The slash "/" indicates the layers are laminated adjacent to each other. This applies to any "/" below.)

When the polymeric LED of this invention has a hole transport layer, the hole transport material applicable is, for example, polyvinylcarbazole or a derivative thereof; polysilane or a derivative thereof; a polysiloxane derivative having aromatic amine on its side chain or backbone; a pyrazoline derivative; an arylamine derivative; a stilbene derivative; a triphenyldiamine derivative; polyaniline or a derivative thereof; polythiophene or a derivative thereof; polypyrrole or a derivative thereof; poly(p-phenylenevinylene) or a derivative thereof; or poly(2,5-thienylenevinylene) or a derivative thereof.

Specific examples of the hole transport materials include those described in JP-A-63-70257, JP-A-63-175860, JP-A-2-135359, JP-A-2-135361, JP-A-2-209988, JP-A-3-37992 and JP-A-3-152184.

Of these hole transport materials used for the hole transport layer, preferable is a polymeric hole transport material such as polyvinylcarbazole or a derivative thereof; polysilane or a derivative thereof; a polysiloxane derivative having aromatic amine on its side chain or backbone; polyaniline or a derivative thereof; polythiophene or a derivative thereof; poly(p-phenylenevinylene) or a derivative thereof; or poly (2,5-thienylenevinylene) or a derivative thereof. And more preferable is polyvinylcarbazole or a derivative thereof; polysilane or a derivative thereof; or a polysiloxane derivative having aromatic amine on its side chain or backbone.

Specific examples of hole transport materials of low molecular weight include pyrazoline derivatives, arylamine derivatives, stilbene derivatives, and triphenyldiamine derivatives. When using a low-molecular-weight hole transport material, it is preferable to disperse it in a polymeric binder.

As the polymeric binder to be mixed, one which does not extremely inhibit the electron transportation and does not have strong absorption of visible light is preferably used. Such a polymeric binder is, for example, poly(N-vinylcarbazole), polyaniline or a derivative thereof, polythiophene or a derivative thereof, poly(p-phenylenevinylene) or a derivative thereof, or poly(2,5-thienylenevinylene) or a derivative thereof, polycarbonate, polyacrylate, polymethylacrylate, polymethylmethacrylate, polystyrene, polyvinyl chloride, or polysiloxane.

Polyvinylcarbazole or a derivative thereof can be derived from a vinyl monomer by cationic polymerization or radical polymerization.

Examples of polysilane or the derivatives thereof include the compounds described in *Chem. Rev.* Vol. 89, 1359, 1989 or GB 2300196. As methods for synthesizing such compounds, those described in the above documents can be used. Of the methods, Kipping method is particularly preferably used.

For polysiloxane or the derivatives thereof, since the siloxane backbone structure hardly show hole transporting properties, those having a structure of the above described low-molecular-weight hole transport material on their side chains or backbone are preferably used. Such polysiloxane or derivatives thereof include those having aromatic amine, which is a hole transport material, on their side chains or backbones.

Film forming methods for the hole transporting layer are not limited to any specific ones. However, when using a low-molecular-weight hole transport material, methods are used in which the film is formed from a mixed solution of the material and a polymeric binder. When using a polymeric hole transport material, methods are used in which the film is formed from a solution of the material.

Solvents used in the methods for forming the layer from a solution may be any solvents as long as they can dissolve hole transport materials. Examples of such solvents include chlorine solvents such as chloroform, methylene chloride and dichloroethane; ether solvents such as tetrahydrofuran; aromatic hydrocarbon solvents such as toluene and xylene; ketone solvents such as acetone and methyl ethyl ketone; and ester solvents such as ethyl acetate, butyl acetate and ethyl cellosolve acetate.

Examples of applicable methods for forming the layer from a solution include spin coating, casting, micro gravure coating, gravure coating, bar coating, roll coating, wire bar coating, dip coating, spray coating, screen printing, flexographic printing, offset printing and ink-jet printing.

The optimum value of the thickness of the hole transport layer varies depending on the material used, and therefore it can be selected so that the values of the driving voltage and luminous efficiency of the polymeric LED are reasonable. However, the layer needs to be so thick at least not to form pinholes therein; but on the other hand, too thick layer is not preferable because the driving voltage of the element increases. Accordingly, the thickness of the hole transport layer is, for example, 1 nm to 1 μm, preferably 2 nm to 500 nm, and more preferably 5 nm to 200 nm.

When the polymeric LED of this invention has an electron transport layer, well known compounds can be used as the electron transport materials. Such a compound is, for example, a metal complex of: an oxadiazole derivative; anthraquinodimethane or a derivative thereof; benzoquinone or a derivative thereof; naphthoquinone or a derivative thereof; anthraquinone or a derivative thereof; tetracyanoanthraquinodimethane or a derivative thereof; a fluorenone derivative; diphenyldicyanoethylene or a derivative thereof; or a diphnoxy derivative; 8-hydroxyquinoline or a derivative thereof, polyquinoline or a derivative thereof, polyquinoxaline or a derivative thereof, or polyfluorene or a derivative thereof.

Specific examples of the electron transport materials include those described in JP-A-63-70257, JP-A-63-175860, JP-A-2-135359, JP-A-2-135361, JP-A-2-209988, JP-A-3-37992 and JP-A-3-152184.

Of these electron transport materials used for the electron transport layer, preferable are metal complexes of: oxadiazole derivatives; benzoquinone or the derivatives thereof; anthraquinone or the derivatives thereof; 8-hydroxyquinoline or the derivative thereof, polyquinoline or the derivatives thereof, polyquinoxaline or the derivatives thereof, or polyfluorene or the derivatives thereof. More preferable are 2-(4-biphenylyl)-5-(4-t-butylphenyl)-1,3,4-oxadiazole, benzoquinone, anthraquinone, tris(8-quinolinol)aluminum, and polyquinoline.

Film forming methods for the electron transporting layer are not limited to any specific ones. However, when using a low-molecular-weight electron transport material, methods are used in which the film is formed from a powder of the material by vacuum deposition or from a solution of the material or the material in the molten state. When using a polymeric electron transport material, methods are used in which the film is formed from a solution of the material or the material in the molten state. When forming the film from a solution of a material or a material in the molten state, any one of the above described polymeric binders may be used together.

Solvents used in the methods for forming the layer from a solution may be any solvents as long as they can dissolve electron transport materials and/or polymeric binders. Examples of such solvents include chlorine solvents such as chloroform, methylene chloride and dichloroethane; ether solvents such as tetrahydrofuran; aromatic hydrocarbon solvents such as toluene and xylene; ketone solvents such as acetone and methyl ethyl ketone; and ester solvents such as ethyl acetate, butyl acetate and ethyl cellosolve acetate.

Examples of applicable methods for forming the layer from a solution of the material or the material in the molten state include spin coating, casting, micro gravure coating, gravure coating, bar coating, roll coating, wire bar coating, dip coating, spray coating, screen printing, flexographic printing, offset printing and ink-jet printing.

The optimum value of the thickness of the electron transport layer varies depending on the material used, and therefore it can be selected so that the values of the driving voltage and luminous efficiency of the polymeric LED are reasonable. However, the layer needs to be so thick at least not to form pinholes therein; but on the other hand, too thick layer is not preferable because the driving voltage of the element increases. Accordingly, the thickness of the electron transport layer is, for example, 1 nm to 1 μm, preferably 2 nm to 500 nm, and more preferably 5 nm to 200 nm.

Of the charge transport layers provided adjacent to electrodes, those having the function of improving the efficiency of charge injection from the electrodes and of reducing the driving voltage of the element are sometimes referred to as charge injection layer (hole injection layer, electron injection layer).

To improve the adhesion to electrodes or improve the charge injection from the electrodes, the above described charge injection layer or an insulating layer 2 nm or less thick may be provided adjacent to each electrode. Further, to improve the adhesion between interfaces or prevent the mixture of the same, a thin buffer layer may be inserted in each interface of the electron transport layer and the light-emitting layer.

The order, number and thickness of the layers laminated may be selected taking into consideration the luminous efficiency or life time of the element.

Examples of the polymeric LEDs of this invention provided with a charge injection layer(s) (an electron injection layer (s), a hole injection layer (s)) include: those provided with a charge injection layer adjacent to the cathode and those provided with a charge injection layer adjacent to the anode.

Specific examples include the following structures e) to p).

e) anode/charge injection layer/light-emitting layer/cathode
f) anode/light-emitting layer/charge injection layer/cathode
g) anode/charge injection layer/light-emitting layer/charge injection layer/cathode
h) anode/charge injection layer/hole transport layer/light-emitting layer/cathode
i) anode/hole transport layer/light-emitting layer/charge injection layer/cathode
j) anode/charge injection layer/hole transport layer/light-emitting layer/charge injection layer/cathode
k) anode/charge injection layer/light-emitting layer/electron transport layer/cathode
l) anode/light-emitting layer/electron transport layer/charge injection layer/cathode
m) anode/charge injection layer/light-emitting layer/electron transport layer/charge injection layer/cathode
n) anode/charge injection layer/hole transport layer/light-emitting layer/electron transport layer/cathode
o) anode/hole transport layer/light-emitting layer/electron transport layer/charge injection layer/cathode
p) anode/charge injection layer/hole transport layer/light-emitting layer/electron transport layer/charge injection layer/cathode Specific examples of the charge injection layers include: a layer that contains a conductive polymer; a layer that is provided between the anode and a hole transport layer and contains a material having an ionization potential between that of the anode material and that of the hole transport material contained in the hole transport layer; and a layer that is provided between the cathode and an electron transport layer and contains a material having an electron affinity between that of the cathode material and that of the electron transport material contained in the electron transport layer.

When the above described charge injection layer is a layer that contains a conductive polymer, the electric conductivity of the conductive polymer is preferably $10^{-5}$ S/cm or more and $10^3$ S/cm or less. To decrease the leak current among light-emitting pixels, the electric conductivity is preferably $10^{-5}$ S/cm or more and $10^2$ S/cm or less and more preferably $10^{-5}$ S/cm or more and $10^1$ S/cm or less.

Usually, an appropriate amount of ion is doped into the conductive polymer to keep the electric conductivity of the same $10^{-5}$ S/cm or more and $10^3$ S/cm or less.

The kind of the ion doped is anion when the charge injection layer is a hole injection layer, while it is cation when the charge injection layer is an electron injection layer. Examples of the anions include polystrenesulfonic acid ion, alkylbenzenesulfonic acid ion and camphosulfonic acid ion. Examples of the cations include lithium ion, sodium ion, potassium ion and tetrabutylammonium ion.

The thickness of the charge injection layer is, for example, 1 nm to 100 nm and preferably 2 nm to 50 nm.

The materials used for the charge injection layers can be properly selected taking into consideration the materials of the electrodes and their adjacent layers. The materials include: for example, conductive polymers such as polyaniline and the derivatives thereof; polythiophene and the derivatives thereof; polypyrrole and the derivatives thereof; polyphenylenevinylene and the derivatives thereof; polythienylenevinylene and the derivatives thereof; polyquinoline and the derivatives thereof; polyquinoxaline and the derivatives thereof; and polymers having an aromatic amine structure on their backbones or side chains, metal phthalocyanine (copper phthalocyanine), and carbon.

The insulating layer 2 nm or less thick has the function of making charge injection easy. Examples of the materials for the insulating layer include metal fluorides, metal oxides and organic insulating materials. Examples of the polymeric LEDs provided with an insulating layer(s) 2 nm or less thick include: those provided with an insulating layer 2 nm or less adjacent to the cathode and those provided with an insulating layer 2 nm or less adjacent to the anode.

Specific examples include the following structures q) to ab).

q) anode/insulating layer 2 nm or less thick/light-emitting layer/cathode
r) anode/light-emitting layer/insulating layer 2 nm or less thick/cathode
s) anode/insulating layer 2 nm or less thick/light-emitting layer/insulating layer 2 nm or less thick/cathode
t) anode/insulating layer 2 nm or less thick/hole transport layer/light-emitting layer/cathode
u) anode/hole transport layer/light-emitting layer/insulating layer 2 nm or less thick/ cathode
v) anode/insulating layer 2 nm or less thick/hole transport layer/light-emitting layer/insulating layer 2 nm or less thick/cathode
w) anode/insulating layer 2 nm or less thick/light-emitting layer/electron transport layer/cathode
x) anode/light-emitting layer/electron transport layer/insulating layer 2 nm or less thick/cathode
y) anode/insulating layer 2 nm or less thick/light-emitting layer/electron transport layer/insulating layer 2 nm or less thick/cathode
z) anode/insulating layer 2 nm or less thick/hole transport layer/light-emitting layer/electron transport layer/cathode
aa) anode/hole transport layer/light-emitting layer/electron transport layer/insulating layer 2 nm or less thick/cathode
ab) anode/insulating layer 2 nm or less thick/hole transport layer/light-emitting layer/electron transport layer/insulating layer 2 nm or less thick/cathode The substrate that constitutes the polymeric LED of this invention may be any substrate as long as it does not undergo changes when electrodes or organic layers are formed on it. Examples of such substrates include glass, plastic, polymeric film and silicon substrates. When the substrate is not transparent, preferably the electrode opposite to the substrate is transparent or semitransparent.

Usually, at least any one of the anode and cathode the polymeric LED of this invention has is transparent or semitransparent. Preferably, the anode is transparent or semitransparent.

As the material for the anode, a conductive metal oxide film, a semitransparent metal thin film or the like is used. Specifically, a film (e.g., NESA) formed of a conductive glass comprising indium-oxide, zinc oxide, tin oxide, and any of their complexes, such as indium tin oxide (ITO) and indium zinc oxide, or gold, platinum, silver or copper is used. ITO, indium zinc oxide and tin oxide are preferable materials. Examples of the methods for forming the anode include vacuum deposition, sputtering, ion plating and plating. An organic transparent conductive film such as polyaniline or a derivative thereof or polythiophene or a derivative thereof may also be used as the anode.

The film thickness of the anode can be properly selected taking into consideration the light transmittivity and the electrical conductivity. It is, for example, 10 nm to 10 µm, preferably 20 nm to 1 µm, and more preferably 50 nm to 500 nm.

To make charge injection easy, a layer composed of a phthalcyanine derivative, a conductive polymer or carbon, or a layer composed of a metal oxide, a metal fluoride or an organic insulating material whose average thickness is 2 nm or less may be provided on the anode.

As the materials for the cathode used in the polymeric LED of this invention, low work-function materials are preferable. Examples of such materials include: metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium; the alloys of two or more of the above metals or the alloys of one or more of the above metals with at least one selected from gold, silver, platinum, copper, manganese, titanium, cobalt, nickel, tungsten or tin; and graphite or graphite intercalation compounds. Examples of the alloys include magnesium-silver, magnesium-indium, magnesium-aluminum, indium-silver, lithium-aluminum, lithium-magnesium, lithium-indium and calcium-aluminum alloys. The cathode is allowed to have a laminated structure of two or more layers.

The film thickness of the cathode can be properly selected taking into consideration the electrical conductivity and the durability. It is, for example, 10 nm to 10 µm, preferably 20 nm to 1 µm, and more preferably 50 nm to 500 nm.

Examples of the methods for forming the cathode include vacuum deposition, sputtering, and laminating in which a metal thin film is hot pressing. A layer composed of a conductive polymer or a layer composed of a metal oxide, a metal fluoride or an organic insulating material whose average thickness is 2 nm or less may be provided between the cathode and the organic layer. After the formation of the cathode, a protective layer for protecting the polymeric LED may also be mounted on the cathode. To use the polymeric LED stably and for a long time, it is preferable to mount a protective layer and/or a protective cover on the cathode to protect the element from the outside.

For the protective layer, a polymer, metal oxide, metal fluoride or metal boride can be used. For the protective cover, a glass sheet or a plastic sheet whose surface has undergone low water-permeability treatment can be used. A method is preferably used in which the above described protective cover and the element substrate are tightly adhered with a thermo-set resin or photo-set resin. If a space is kept using a spacer, it is easy to prevent the element from being damaged. If an inert gas such as nitrogen or argon is included in the space, it is possible to prevent the cathode from being oxidized. If a desiccating agent such as barium oxide is placed in the space, it is easy to suppress the element from being damaged by water adsorbed on it during the production process. Preferably, any one or more of the means are employed.

The polymeric LED can be used as a surface light source, segment display unit, dot matrix display unit, or the backlight of a liquid crystal display unit.

To obtain surface light emission using the polymeric LED of this invention, a surface anode and a surface cathode should be arranged so that they are superposed. To obtain patterned light emission, a method is employed in which a mask with a patterned window is provided on the surface of the surface light-emitting element, in which the organic layer of the non-light-emitting portion is formed to be extremely thick so that the portion does not substantially emit light, or in which either anode or cathode or both of them are formed to have a pattern. If any one of the above method is employed to from a pattern and some electrodes are arranged so that they can be each independently set at ON/OFF, a segment display unit that can display numerals, letters or simple signs is obtained. To produce a dot matrix display unit, both anodes and cathodes are formed in stripes and arranged so that they lie at right angles to each other. A method in which polymeric luminous body with more than one kind of luminescent color is color-coded or a method in which a color filter or fluorescence conversion filter is used makes possible partial color display or multicolor display. Dot matrix elements can be passive-matrix ones, or if they are combined with TFT, they can be active-matrix elements. These display elements can be used as display units of computer, televisions, hand-held PCs, mobole phones, car navigation systems, or view finders of video cameras.

Further, since the above described surface light-emitting devices are spontaneous-emission-thin-type elements, they can be suitably used as the surface light source for the backlight of liquid crystal display units or the light source for surface lighting. If a flexible substrate is used, they can be used as curved light sources or curved display units.

In the following, this invention will be described in detail by means of examples. However, the examples are not intended to limit the scope of this invention.

The number average molecular weight herein shown was obtained in terms of polystyrene by gel permeation chromatography (GPC) using chloroform as a solvent.

SYNTHETIC EXAMPLE 1

Synthesis of 2,2'-dibromo-5,5'-dioctyloxy-1,1'-biphenyl

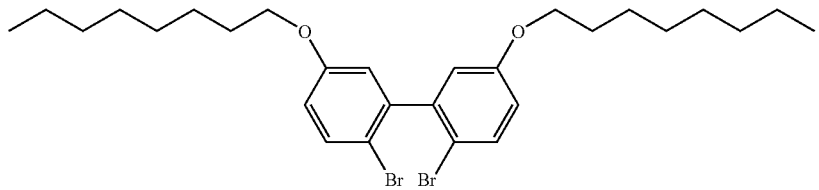

3,3'-dioctyloxy-1,1'-biphenyl as a raw material was synthesized by the octylation of 3-bromophenol in ethanol, followed by the Yamamoto coupling reaction.

133 g of 3,3'-dioctyloxy-1,1'-biphenyl synthesized as above was dissolved in 1820 ml of dried N,N-dimethylformamide. A solution of 117.5 g of N-bromosuccinimide in 910 ml of N,N-dimethylformamide was added dropwise at 0° C. (in a dry ice-methanol bath) over 60 minutes. After completion of the addition, the mixture was brought to room temperature and stirred over night.

The reaction solution was poured into water, extracted with n-hexane, followed by evaporating of the solvent to yield 179 g of crude product. Recrystallyzation of the crude product was repeated with 2-propanol to yield 122 g of 2,2'-dibromo-5,5'-dioctyloxy-1,1'-biphenyl.

$^1$H-NMR (300 MHz/CDCl$_3$): δ (ppm)=0.88 [t, 6H], 1.2–1.8 [m, 24H], 3.95 [t, 4H], 6.7–6.8 [m, 4H], 7.52 [d, 2H],

SYNTHETIC EXAMPLE 2

Synthesis of 2,2'-diiodo-5,5'-dioctyloxy-1,1'-biphenyl

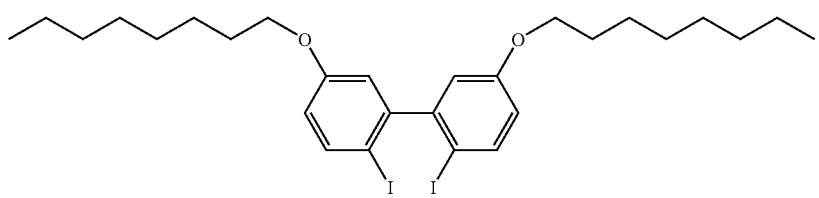

4.05 g of chipped magnesium was put in a 500 ml three-neck flask in an atmosphere of nitrogen. A solution of 45 g of 2,2'-dibromo-5,5'-dioctyloxy-1,1'-biphenyl synthesized as above in 200 ml of tetrahydrofuran was prepared in another flask, and 20 ml of the solution was added to the flask containing magnesium. Five drops of 1,2-dibromoethane as an initiator was added to the magnesium mixture and heated. Once an exothermic reaction was initiated, the rest of the solution was added dropwise to the mixture over 30 minutes. After completion of the addition of the solution, the reaction was allowed to progress under reflux for 1 hour. Then, the reaction solution was cooled to 0° C., and a solution of 44.2 g of iodine in 150 ml of tetrahydrofuran was added dropwise. After completion of the addition, the reaction solution was stirred at room temperature overnight.

The reaction solution was poured into water, extracted with chloroform, followed by washing with an aqueous solution of sodium thiosulfate and a saturated salt solution. Then, the reaction solution was dried with sodium sulfate, followed by evaporating the solvent to yield 53 g of crude product. The crude product was recrystallyzed with 2-propanol to yield 43 g of 2,2'-diiodo-5,5'-dioctyloxy-1,1'-biphenyl.

$^1$H-NMR (200 MHz/CDCl$_3$): δ (ppm)=0.90 [t, 6H], 1.2–1.8 [m, 24H], 3.93 [t, 4H], 6.6–6.8 [m, 4H], 7.74 [d, 2H],

MS (APCL (+)): M$^+$ 662.

SYNTHETIC EXAMPLE 3

Synthesis of 4,4'-dibromo-2,2'-diiodo-5,5'-dioctyloxy-1,1'-biphenyl

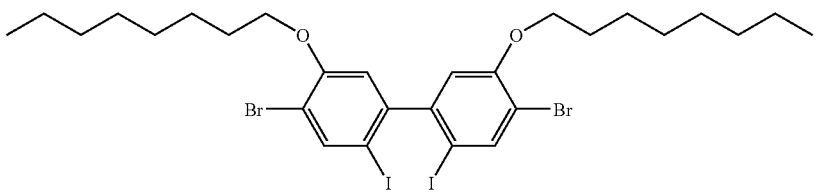

37 g of 2,2'-diiodo-5,5'-dioctyloxy-1,1'-biphenyl synthesized as above was put in a 1 L flask in an atmosphere of nitrogen and 800 ml of trimethyl phosphate was added to dissolve the same. Then, 10.6 g of iodine was added and a solution of 19 g of bromine in 70 ml of trimethyl phosphate was added dropwise. After 4-hour stirring, a solution of 9.5 g of bromine in 35 ml of trimethyl phosphate was added dropwise to the mixture. After completion of the addition of the solution, the mixture was stirred overnight. The reaction solution was poured into water, extracted with chloroform, followed by washing with an aqueous solution of sodium thiosulfate and a saturated salt solution. Then, the reaction solution was dried with sodium sulfate, followed by evaporating the solvent to yield 46 g of crude product. The crude product was purified by silica gel chromatography (cyclohexane toluene=20:1) to yield 20.5 g of 4,4'-dibromo-2,2'-diiodo-5,5'-dioctyloxy-1,1'-biphenyl.

$^1$H-NMR (200 MHz/CDCl$_3$): δ (ppm)=0.88 [t, 6H], 1.2–1.9 [m, 24H], 3.99 [m, 4H], 6.70 [s, 2H], 8.03 [s, 2H], MS (APCl (+)): M$^+$ 820.

SYNTHETIC EXAMPLE 4

Synthesis of 3,7-dibromo-5-(2,4,6-triisopropylphenyl)-2,8-dioctyloxy-5H-dibenzo(b, d)borole

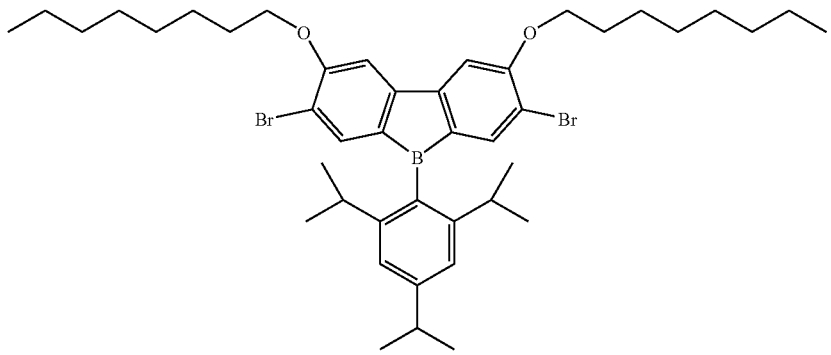

2.0 g of 4,4'-dibromo-2,2'-diiodo-5,5'-dioctyloxy-1,1'-biphenyl synthesized as above was put in a 100 ml flask in an atmosphere of nitrogen and 20 ml of tetrahydrofuran was added to dissolve the same. Then, the tetrahydrofuran solution was cooled to −90° C. and 3.4 ml of 1.6M hexane solution was added dropwise. After 1-hour stirring, a solution of 1.5 g of magnesium bromide in 20 ml of tetrahydrofuran was added, warmed to room temperature, and stirred for 1 hour. The mixture was cooled again to −90° C., and 1.01 g of (2,4,6-triisopropylphenyl)dimethoxyborane was added. After warming, the mixture was allowed to react under reflux for 12 hours.

After evaporating the solvent, the resultant product was purified twice by silica gel chromatography (cyclohexane/toluene) to yield 0.47 g of 3,7-dibromo-5(2-4-6-triisopropylphenyl)-2,8-dioctyloxy-5H-dibenzo(b,d)borole.

$^1$H-NMR (200 MHz/CDCl$_3$): δ (ppm)=0.89 [t, 6H], 1.1–1.6 [m, 38H], 1.89 [m, 4H], 2.44 [m, 2H], 2.93 [m, 1H], 4.17 [t, 4H], 6.89 [s, 2H], 7.01 [s, 2H], 7.50 [s, 2H], MS (APCl (+)) : M$^+$ 781.

EXAMPLE 1 (Condensation Polymerization)

Synthesis of Polymer 1

0.41 g of 3,7-dibromo-5-(2,4,6-trimethylphenyl)-2,8-dioctyloxy-5H-dibenzo(b, d)borole, 0.15 g of N,N'-bis(4-bromophenyl)-N,N'-bis(4-n-butylphenyl)-1,4-phenylenediamine and 0.55 g of 2,2'-bipyridyl were put in a reactor, and the reaction system was purged with argon gas. 40 ml of tetrahydrofuran (dehydration solvent) having been subjected to bubbling by argon gas to be deaerated in advance was added to the mixture. Then, 1.0 g of bis(1,5-Cyclooctadiene)nickel(0) was added to the mixed solution, stirred at room temperature for 10 minutes, and allowed to react at 60° C. for 3 hours. The reaction was carried out in an atmosphere of nitrogen.

After the reaction, the reaction solution was cooled, and poured into a mixed solution of 100 ml of methanol/200 ml of ion-exchanged water, followed by stirring for about 1 hour. Then, the precipitate was filtered, dried under reduced pressure, and dissolved in 40 ml of toluene. After that, 40 ml of 1N hydrochloric acid was added, and the mixed solution was stirred for 1 hour. After removing the water layer, 40 ml of aqueous ammonia was added to the organic layer and stirred for 1 hour, and the water layer was removed. The resultant solution was purified through an alumina column, the recovered toluene solution was added dropwise to 200 ml of methanol and stirred, and the precipitate was filtered and dried under reduced pressure for 2 hours. The polymer yield was 20 mg. The polymer was referred to as polymer 1.

The number average molecular weight and the weight average molecular weight, in terms of polystyrene, of the polymer 1 was 6.1×10$^3$ and 9.9×10$^3$, respectively.

EXAMPLE 2

A thin film of the polymer 1 was formed by spin-coating a 0.2% by weight chloroform solution of the polymer 1 onto quartz. The fluorescent spectrum of the thin film was measured using a fluorescence spectrophotometer (Hitachi Ltd.: 850). The polymer 1 has intense fluorescence and the fluorescence peak was at a wavelength of 564 nm.

INDUSTRIAL APPLICABILITY

The polymer of this invention is a novel polymer that can be used as a light-emitting material or a charge transport material and be used in ink compositions or polymeric light-emitting devices.

The invention claimed is:

1. A polymer characterized by comprising a repeating unit represented by the following formula (1) and having a number average molecular weight, in terms of polystyrene, of 10$^3$ to 10$^8$:

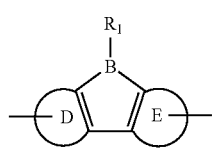

wherein R$_1$ represents a hydrogen atom, or an alkyl, alkoxy, alkylthio, aryl, aryloxy, arylthio, arylalkyl, arylalkoxy, arylalkylthio, arylalkenyl, arylalkynyl, amino, substituted amino, silyl, substituted silyl, silyloxy, substituted silyloxy or monovalent heterocyclic group, or a halogen atom; and rings D and E each independently represent an optionally substituted aromatic ring.

2. The polymer according to claim 1, wherein the aromatic ring is an aromatic hydrocarbon ring or a heteroaromatic ring.

3. The polymer according to claim 2, wherein the aromatic ring is an aromatic hydrocarbon ring.

4. The polymer according to claim 2, wherein the aromatic hydrocarbon ring is a benzene, naphthalene or anthracene ring.

5. The polymer according to claim 4, wherein the repeating unit represented by the formula (1) is represented by the following formula (2-1), (2-2), (2-3), (2-4) or (2-5):

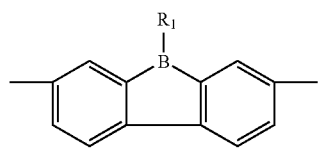
(2-1)

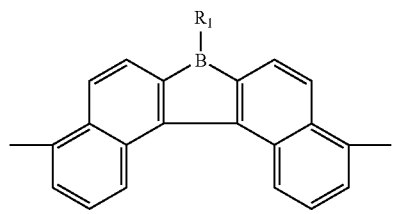
(2-2)

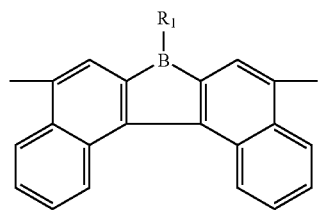
(2-3)

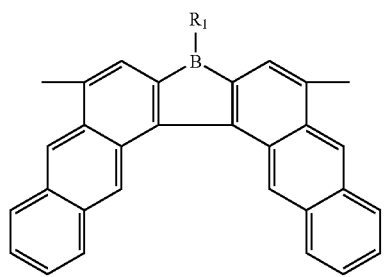
(2-4)

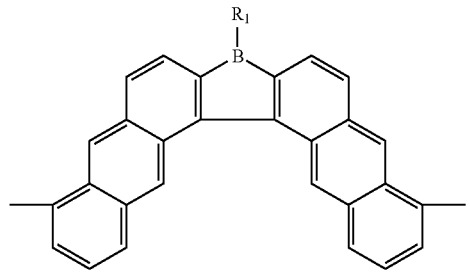
(2-5)

wherein $R_1$ represents the same group as that in the formula (1).

6. The polymer according to claim 1, wherein the repeating unit is represented by the following formula (3):

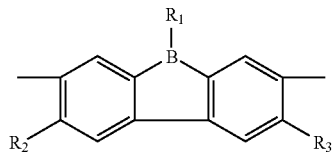
(3)

wherein $R_1$ represents the same group as that in the formula (1); $R_2$ and $R_3$ each independently represent an alkyl, alkoxy, alkylthio, aryloxy, arylthio, arylalkyl, arylalkoxy, arylalkylthio, amino or substituted amino group.

7. The polymer according to claim 1, further comprising a repeating unit represented by the following formula (4), (5), (6) or (7):

$$—Ar_1— \tag{4}$$

$$—Ar_1—X_1—(Ar_2—X_2)_w—Ar_3— \tag{5}$$

$$—Ar_1—X_2— \tag{6}$$

$$—X_2— \tag{7}$$

wherein $Ar_1$, $Ar_2$ and $Ar_3$ each independently represent an arylene group, a divalent heterocyclic group or a divalent group having a metal complex structure; $X_1$ represents —C≡C—, —N($R_{22}$)— or —(Si$R_{23}R_{24}$)$_y$—; $X_2$ represents —C$R_{20}$=C$R_{21}$—, —C≡C—, —N($R_{22}$)— or —(Si$R_{23}R_{24}$)$_y$—; $R_{20}$ and $R_{21}$ each independently represent a hydrogen atom, or an alkyl, aryl, monovalent heterocyclic, carboxyl, substituted carboxyl or cyano group; $R_{22}$, $R_{23}$ and $R_{24}$ each independently represent a hydrogen atom, or an alkyl, aryl, monovalent heterocyclic or arylalkyl group; w represents an integer of 0 to 1; and y represents an integer of 1 to 12.

8. The polymer according to claim 7, wherein the repeating unit represented by the formula (4) is represented by the following formula (8), (9), (10), (11), (12) or (13):

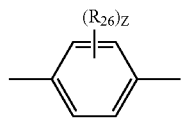
(8)

wherein $R_{25}$ represents an alkyl, alkoxy, alkylthio, aryl, aryloxy, arylthio, arylalkyl, arylalkoxy, arylalkylthio, arylalkenyl, arylalkynyl, amino, substituted amino, silyl, substituted silyl, silyloxy substituted silyloxy group, or a halogen atom, or an acyl, acyloxy, imino, amide, imide, monovalent heterocyclic, carboxyl, substituted carboxyl or cyano group; and z represents an integer of 0 to 4;

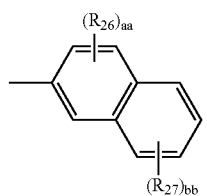
(9)

wherein $R_{26}$ and $R_{27}$ each independently represent the same group as the R25 in the formula (8); and aa and bb each independently represent an integer of 0 to 3;

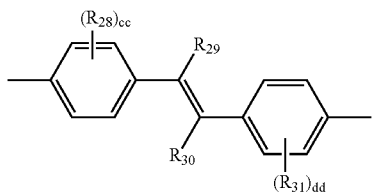
(10)

wherein $R_{28}$ and $R_{31}$ each independently represent the same group as the $R_{25}$ in the formula (8); cc and dd each independently represent an integer of 0 to 4; and $R_{29}$ and $R_{30}$ each independently represent a hydrogen atom, or an alkyl, aryl, monovalent heterocyclic, carboxyl, substituted carboxyl or cyano group;

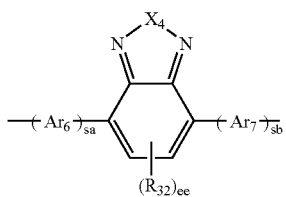
(11)

wherein $R_{32}$ represents an alkyl, alkoxy, alkylthio, aryl, aryloxy, arylthio, arylalkyl, arylalkoxy, arylalkylthio, arylalkenyl, arylalkynyl, amino, substituted amino, silyl or substituted silyl group, a halogen atom, or an acyl, acyloxy, imino, amide, imide, monovalent heterocyclic, carboxyl, substituted carboxyl or cyano group; ee represents an integer of 0 to 2; $Ar_6$ and $Ar_7$ each independently represent an arylene group, a divalent heterocyclic group or a divalent group having a metal complex structure; sa and sb each independently represent 0 or 1; and $X_4$ represents O, S, SO, $SO_2$, Se or Te;

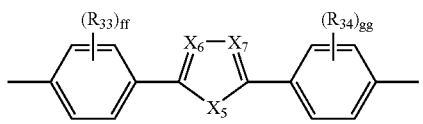
(12)

wherein $R_{33}$ and $R_{34}$ each independently represent the same group as the $R_{25}$ in the formula (8); ff and gg each independently represent an integer of 0 to 4; $X_5$ represents O, S, SO, $SO_2$, Se, Te, N—$R_{35}$ or $SiR_{36}R_{37}$; $X_6$ and $X_7$ each independently represent N or C—$R_{38}$; and $R_{35}$, $R_{36}$, $R_{37}$ and $R_{38}$ each independently represent a hydrogen atom, or an alkyl, aryl, arylalkyl or monovalent heterocyclic group; and

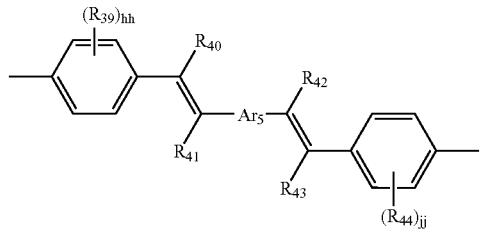
(13)

wherein $R_{39}$ and $R_{44}$ each independently represent the same group as the $R_{25}$ in the formula (8); hh and jj each independently represent an integer of 0 to 4; $R_{40}$, $R_{41}$, $R_{42}$ and $R_{43}$ each independently represent the same group as the $R_{29}$ in the formula (10); and $Ar_5$ represents an arylene group, a divalent heterocyclic group or a divalent group having a metal complex structure.

9. The polymer according to claim 7, wherein the repeating unit represented by the formula (5) is represented by the following formula (14):

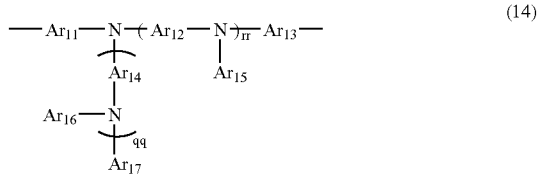
(14)

wherein $Ar_{11}$, $Ar_{12}$, $Ar_{13}$ and $Ar_{14}$ each independently represent an arylene or divalent heterocyclic group; $Ar_{15}$, $Ar_{16}$ and $Ar_{17}$ each independently represent an aryl or monovalent heterocyclic group; and qq and rr each independently represent 0 or 1, wherein $0 \leq qq+rr \leq 1$.

10. A method for producing the polymer according to claim 1, comprising subjecting a compound represented by the following formula (15), as one of its raw materials, to condensation polymerization:

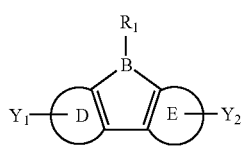
(15)

wherein rings D, E and $R_1$ each independently represent the same as described in claim 1; $Y_1$ and $Y_2$ each independently represent a substituent that takes part in the condensation polymerization.

11. A method for producing the polymer according to claim 7, comprising subjecting not only the compound represented by the following formula (15) but also a compound represented by any one of the following formula (16) to (19) to condensation polymerization:

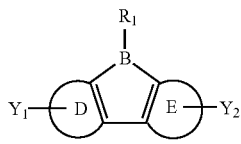
(15)

wherein $R_1$ represents a hydrogen atom, or an alkyl, alkoxy, alkylthio, aryl, aryloxy, arylthio, arylalkyl, arylalkoxy, arylalkylthio, arylalkenyl, arylalkynyl, amino, substituted amino, silyl, substituted silyl, silyloxy, substituted silyloxy or monovalent heterocyclic group, or a halogen atom; rings D and E each independently represent an optionally substituted aromatic ring; and $Y_1$ and $Y_2$ each independently represent a substituent that takes part in the condensation polymerization;

$$Y_3-Ar_1-Y_4 \quad (16)$$

$$Y_3-Ar_1-X_1-(Ar_2-X_2)_w-Ar_3-Y_4 \quad (17)$$

$$Y_3-Ar_1-X_2-Y_4 \quad (18)$$

$$Y_3-X_2-Y_4 \quad (19)$$

wherein $Ar_1$, $Ar_2$, $Ar_3$, w, $X_1$ and $X_2$ each represent the same as described above; and $Y_3$ and $Y_4$ each independently represent a substituent that takes part in the condensation polymerization.

12. The method according to claim 11, wherein $Y_1$, $Y_2$, $Y_3$ and $Y_4$ each independently represent a halogen atom, or an alkylsulfonate, arylsulfonate or arylalkylsulfonate group and the condensation polymerization is carried out using a zerovalent nickel complex.

13. The method according to claim 11, wherein $Y_1$, $Y_2$, $Y_3$ and $Y_4$ each independently represent a halogen atom, or an alkylsulfonate, arylsulfonate, arylalkylsulfonate, boric acid or borate ester group, the ratio of the total mole number of the halogen atom and the alkylsulfonate, arylsulfonate and arylalkylsulfonate groups to that of the boric acid and borate ester groups is substantially 1, and the condensation polymerization is carried out using a nickel or palladium catalyst.

14. A composition, comprising: at least one material compound selected from the group consisting of a hole transport material, an electron transport material and a light-emitting material; and at least one polymer according to claim 1.

15. An ink composition, comprising the polymer according to claim 1.

16. The ink composition according to claim 15, having a viscosity of 1 to 20 mpa·s at 25° C.

17. A light-emitting thin film, comprising the polymer according to claim 1.

18. A conductive thin film, comprising the polymer according to claim 1.

19. An organic semiconductor thin film, comprising the polymer according to claim 1.

20. A polymeric light-emitting device, comprising a layer that comprises the polymer according to claim 1 between an anode and a cathode.

21. The polymeric light-emitting device according to claim 20, wherein the layer that comprises the polymer is a light-emitting layer.

22. The polymeric light-emitting device according to claim 21, wherein the light-emitting layer further comprises a hole transport material, an electron transport material or a light-emitting material.

23. A surface light source, comprising the polymeric light-emitting device according to claim 20.

24. A segment display unit, comprising the polymeric light-emitting device according to claim 20.

25. A dot matrix display unit, comprising the polymeric light-emitting device according to claim 20.

26. A liquid crystal display unit, comprising the polymeric light-emitting device according to claim 20 as its back light.

* * * * *